US012716831B2

(12) United States Patent
Kagawa et al.

(10) Patent No.: US 12,716,831 B2
(45) Date of Patent: Aug. 25, 2026

(54) PHOTODETECTION DEVICE AND ELECTRONIC DEVICE

(71) Applicant: SONY SEMICONDUCTOR SOLUTIONS CORPORATION, Kanagawa (JP)

(72) Inventors: Yoshihisa Kagawa, Kanagawa (JP); Takatoshi Kameshima, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 372 days.

(21) Appl. No.: 18/551,671

(22) PCT Filed: Mar. 4, 2022

(86) PCT No.: PCT/JP2022/009275
§ 371 (c)(1),
(2) Date: Sep. 21, 2023

(87) PCT Pub. No.: WO2022/209571
PCT Pub. Date: Oct. 6, 2022

(65) Prior Publication Data

US 2024/0175802 A1 May 30, 2024

(30) Foreign Application Priority Data

Mar. 30, 2021 (JP) ................................ 2021-058329

(51) Int. Cl.
*H01L 27/12* (2006.01)
*G01N 21/17* (2006.01)
*H10D 86/00* (2025.01)

(52) U.S. Cl.
CPC ............ *G01N 21/17* (2013.01); *H10D 86/00* (2025.01); *G01N 2021/1765* (2013.01)

(58) Field of Classification Search
CPC .......... G01N 21/17; G01N 2021/1765; H10D 86/00; H10F 39/811; H10F 39/807; H10F 39/8023; H10F 39/809
See application file for complete search history.

(56) References Cited

U.S. PATENT DOCUMENTS

2006/0001174 A1* 1/2006 Matsui .................... H01L 25/50
257/E23.079
2009/0085143 A1 4/2009 Park
(Continued)

FOREIGN PATENT DOCUMENTS

JP 2002-043502 2/2002
JP 2006-019455 1/2006
(Continued)

OTHER PUBLICATIONS

International Search Report and Written Opinion prepared by the Japan Patent Office on Mar. 29, 2022, for International Application No. PCT/JP2022/009275, 3 pgs.

*Primary Examiner* — Ermias T Woldegeorgis
(74) *Attorney, Agent, or Firm* — SHERIDAN ROSS P.C.

(57) ABSTRACT

Provided is a photodetection device capable of suppressing an increase in a parasitic capacitance of an electrode pad. A photodetection device includes: a first semiconductor layer that includes a photoelectric conversion unit and has one surface being a light incident surface and another surface being an element formation surface; an insulating layer laminated on a side of the light incident surface of the first semiconductor layer; an electrode pad exposed from a surface of the insulating layer on a side opposite to a surface on a side of the first semiconductor layer in a state where the insulating layer is interposed between the electrode pad and the first semiconductor layer; and an insulating ring that is a ring having an insulating property, penetrating the first
(Continued)

semiconductor layer in a thickness direction, and surrounding the electrode pad in a plan view.

11 Claims, 45 Drawing Sheets

(56) References Cited

U.S. PATENT DOCUMENTS

| | | | | |
|---|---|---|---|---|
| 2012/0062777 | A1 | 3/2012 | Kobayashi et al. | |
| 2012/0086092 | A1 | 4/2012 | Yanagita et al. | |
| 2013/0105667 | A1 | 5/2013 | Kobayashi | |
| 2013/0235243 | A1 * | 9/2013 | Sano | H10F 39/199 348/308 |
| 2013/0323875 | A1 | 12/2013 | Park et al. | |
| 2015/0263060 | A1 | 9/2015 | Park | |
| 2016/0172405 | A1 * | 6/2016 | Hori | H10F 39/8063 257/432 |
| 2020/0194481 | A1 | 6/2020 | Kwak | |
| 2021/0036040 | A1 | 2/2021 | Kobayashi | |

FOREIGN PATENT DOCUMENTS

| | | | |
|---|---|---|---|
| JP | 2012-033894 | | 2/2012 |
| JP | 2012-064709 | | 3/2012 |
| JP | 2012-084609 | | 4/2012 |
| JP | 2013-251539 | | 12/2013 |
| JP | 2016139818 | A | 8/2016 |
| JP | 2018182346 | A | 11/2018 |
| JP | 2019-068049 | | 4/2019 |
| TW | 201633520 | A | 9/2016 |
| TW | 202021149 | A | 6/2020 |

* cited by examiner 1
2A
20a
2B
20b
82
81
60
22
21
20
30
40
50
70
75
14
32a (32)
33
43
42
44
34
S6
S2
S1
S4
S3
S5
31
41

20b
(20)
70b
(70)
70a
(70)
61
61
24b
(24)
24a
(24)
14
71
72
71
72
$d_1$
$d_1$
75
63
25
75
63
25
26a
(26)
26b
(26)
26c
(26)
C
C 1
2A
20a
2B
20b
84
85
20
30
40
50
82
81
60
22
21
70
70
83
14
141
143
141a
42
42
44
S6
S2
S1
S4
S3
S5
31
41

1
2A
2B
20a
20b
20
30
40
50
60
22
21
70
75
14a
14
32a (32)
33
43
42
44
34
S6
S2
S1
S4
S3
S5
31
41

1
2A
20a
2B
20b
20
30
40
50
60
22
21
70
75
14a
14
32a (32)
33
43
42
44
34
S6
S2
S1
S4
S3
S5
31
41

PHOTODETECTION DEVICE AND ELECTRONIC DEVICE

CROSS REFERENCE TO RELATED APPLICATIONS

This application is a national stage application under 35 U.S.C. 371 and claims the benefit of PCT Application No. PCT/JP2022/009275, having an international filing date of 4 Mar. 2022, which designated the United States, which PCT application claimed the benefit of Japanese Patent Application No. 2021-058329, filed 30 Mar. 2021, the entire disclosures of each of which are incorporated herein by reference.

TECHNICAL FIELD

The present technology (technology according to the present disclosure) relates to a photodetection device and an electronic device, and particularly relates to a photodetection device and an electronic device each including an electrode pad.

BACKGROUND ART

Regarding a wire bonding pad of a stacked image sensor, a structure in which an electrode pad is arranged on a surface of an upper substrate is proposed from a viewpoint of ease of installation of a ball (for example, Patent Document 1). Since a size of the ball can be reduced by arranging the electrode pad on the outermost surface, a dimension of the electrode pad can be reduced, and thus, a chip size can be reduced.

CITATION LIST

Patent Document

Patent Document 1: Japanese Patent Application Laid-Open No. 2019-68049

SUMMARY OF THE INVENTION

Problems to be Solved by the Invention

In systems operating at a high speed, it is necessary to suppress an increase in a parasitic capacitance, for example, parasitic capacitance of an electrode pad.

An object of the present technology is to provide a photodetection device and an electronic device capable of suppressing an increase in a parasitic capacitance of an electrode pad.

Solutions to Problems

A photodetection device according to one aspect of the present technology includes: a first semiconductor layer that includes a photoelectric conversion unit and has one surface being a light incident surface and another surface being an element formation surface; an insulating layer laminated on a side of the light incident surface of the first semiconductor layer; an electrode pad exposed from a surface of the insulating layer on a side opposite to a surface on a side of the first semiconductor layer in a state where the insulating layer is interposed between the electrode pad and the first semiconductor layer; and an insulating ring that is a ring having an insulating property, penetrating the first semiconductor layer in a thickness direction, and surrounding the electrode pad in a plan view.

An electronic device according to one aspect of the present technology includes the photodetection device described above and an optical system that causes the photodetection device to form an image of image light from a subject.

MODE FOR CARRYING OUT THE INVENTION

Hereinafter, preferred modes for carrying out the present technology will be described with reference to the drawings. Note that, embodiments hereinafter described each illustrate an example of a representative embodiment of the present technology, and the scope of the present technology is not narrowed by them.

In the following drawings, the same or similar parts are denoted by the same or similar reference signs. It should be noted that the drawings are schematic, and a relationship between a thickness and a planar dimension, a ratio of the thicknesses between layers, and the like are different from actual ones. Therefore, specific thicknesses and dimensions should be determined in consideration of the following description. Furthermore, it is needless to say that the drawings include portions having different dimensional relationships and ratios.

Furthermore, first to third embodiments described below each illustrate an example of a device and a method for embodying a technical idea of the present technology, and in the technical idea of the present technology, materials, shapes, structures, arrangements, and the like of components are not limited to those described below. Various alterations can be made to the technical idea of the present technology within the technical scope defined by the claims described in the claims.

The description is given in the following order.

1. First Embodiment
2. Second Embodiment
3. Third Embodiment

First Embodiment

The first embodiment will describe an example in which the present technology is applied to a photodetection device that is a back-illuminated complementary metal oxide semiconductor (CMOS) image sensor.

<<Overall Configuration of Photodetection Device>>

Figure 1:
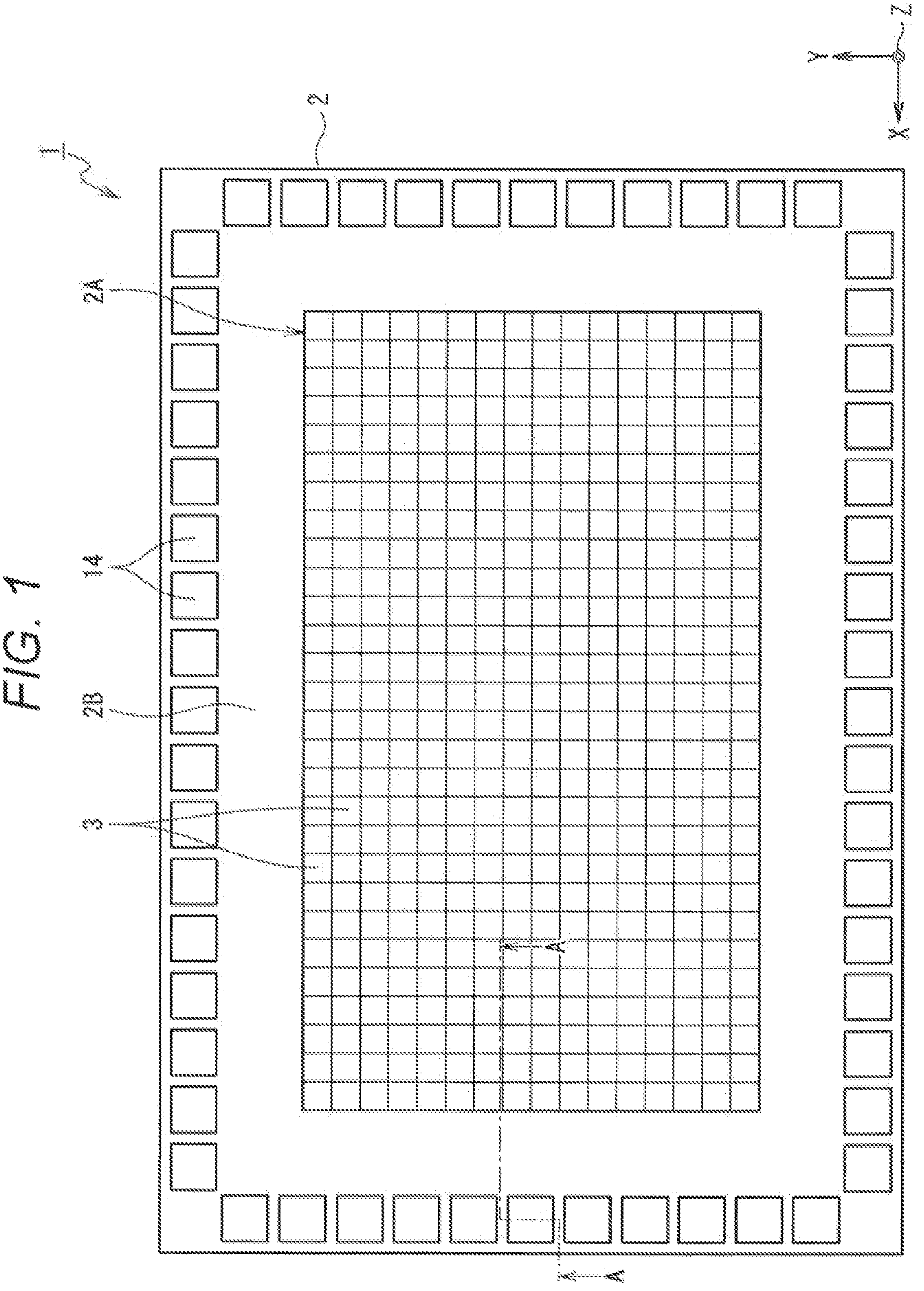
FIG. 1 is a chip layout diagram illustrating a configuration example of a photodetection device according to a first embodiment of the present technology.
Figure 30:
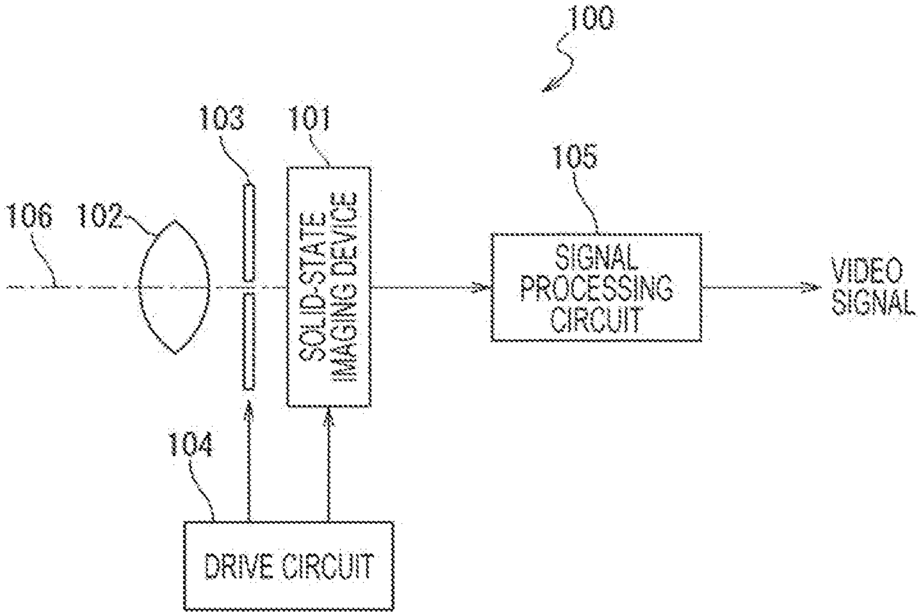
FIG. 30 is a diagram illustrating a schematic configuration of an electronic device according to a third embodiment of the present technology.

First, an overall configuration of a photodetection device 1 will be described. As illustrated in FIG. 1, the photodetection device 1 according to the first embodiment of the present technology mainly includes a semiconductor chip 2 having a rectangular two-dimensional planar shape in a plan view. That is, the photodetection device 1 is mounted on the semiconductor chip 2. As illustrated in FIG. 30, the photodetection device 1 captures image light (incident light 106) from a subject via an optical system (optical lens) 102, converts a light amount of the incident light 106 formed on an imaging surface into an electric signal in units of pixels, and outputs the electric signal as a pixel signal.

As illustrated in FIG. 1, the semiconductor chip 2 on which the photodetection device 1 is mounted includes, in a two-dimensional plane including an X direction and a Y direction intersecting each other, a rectangular pixel region 2A provided in a central portion, and a peripheral region 2B provided outside the pixel region 2A to surround the pixel region 2A.

The pixel region 2A is, for example, a light receiving surface that receives light condensed by the optical system 102 illustrated in FIG. 30. Then, in the pixel region 2A, a plurality of pixels 3 is arranged in a matrix in the two-dimensional plane including the X direction and the Y direction. In other words, the pixels 3 are repeatedly arranged in each of the X direction and the Y direction intersecting each other in the two-dimensional plane. Note that, in the present embodiment, as an example, the X direction and the Y direction are orthogonal to each other. Furthermore, a direction orthogonal to both the X direction and the Y direction is a Z direction (thickness direction).

As illustrated in FIG. 1, a plurality of electrode pads (bonding pads) 14 is arranged in the peripheral region 2B.

<Logic Circuit>

Figure 2:
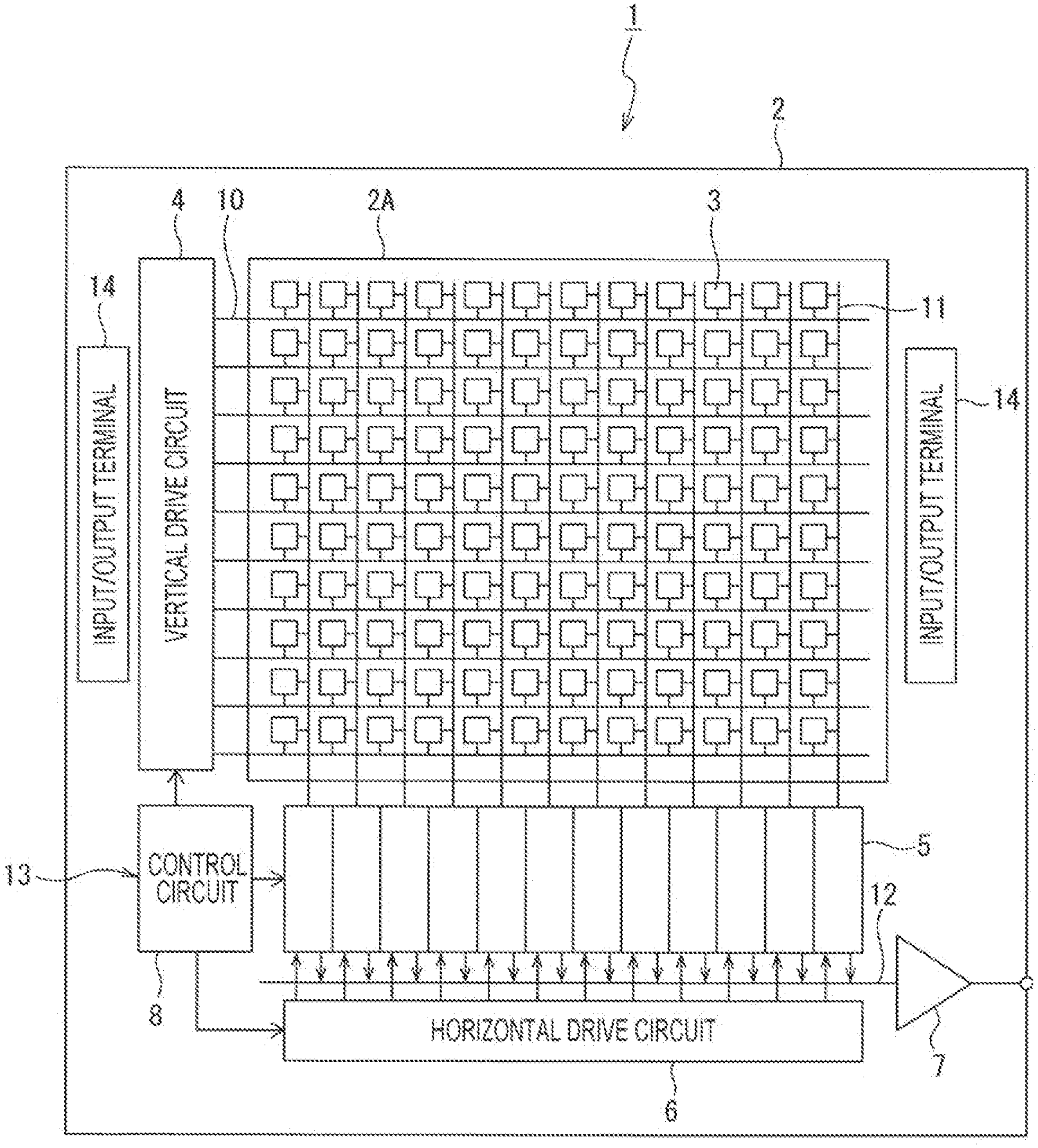
FIG. 2 is a block diagram illustrating a configuration example of the photodetection device according to the first embodiment of the present technology.

As illustrated in FIG. 2, the semiconductor chip 2 includes a logic circuit 13 including a vertical drive circuit 4, a column signal processing circuit 5, a horizontal drive circuit 6, an output circuit 7, a control circuit 8, and the like. The logic circuit 13 includes, for example, a complementary MOS (CMOS) circuit including an n-channel conductive metal oxide semiconductor field effect transistor (MOSFET) and a p-channel conductive MOSFET as field effect transistors.

The vertical drive circuit 4 includes, for example, a shift register. The vertical drive circuit 4 sequentially selects a desired pixel drive line 10, supplies a pulse for driving the pixel 3 to the selected pixel drive line 10, and drives each of the pixels 3 row by row. That is, the vertical drive circuit 4 selectively scans each of the pixels 3 in the pixel region 2A sequentially in a vertical direction on a row-by-row basis, and supplies a pixel signal from the pixel 3 based on a signal charge generated according to the amount of received light by a photoelectric conversion element of each of the pixels 3 to the column signal processing circuit 5 through a vertical signal line 11.

The column signal processing circuit 5 is arranged, for example, on every column of the pixels 3 and performs signal processing, such as noise removal on signals output from the pixels 3 of one row, for every pixel column. For example, the column signal processing circuit 5 performs signal processing such as correlated double sampling (CDS) for removing pixel-specific fixed pattern noise and analog digital (AD) conversion. A horizontal selection switch (not illustrated) is provided at an output stage of the column signal processing circuit 5 to be connected with a horizontal signal line 12.

The horizontal drive circuit 6 includes, for example, a shift register. The horizontal drive circuit 6 sequentially outputs horizontal scanning pulses to the column signal processing circuits 5 to sequentially select each of the column signal processing circuits 5, and causes each of the column signal processing circuits 5 to output the pixel signal subjected to the signal processing to a horizontal signal line 12.

The output circuit 7 performs signal processing on pixel signals sequentially supplied from each of the column signal processing circuits 5 through the horizontal signal line 12 and outputs processed signals. As the signal processing, for example, buffering, black level adjustment, column variation correction, various digital signal processing, and the like can be used.

The control circuit 8 generates a clock signal and a control signal, which are references for operations of the vertical drive circuit 4, the column signal processing circuit 5, the horizontal drive circuit 6, and the like on the basis of a vertical synchronization signal, a horizontal synchronization signal, and a master clock signal. Then, the control circuit 8 outputs the generated clock signal and control signal to the vertical drive circuit 4, the column signal processing circuit 5, the horizontal drive circuit 6, and the like.

<Pixel>

Figure 3:
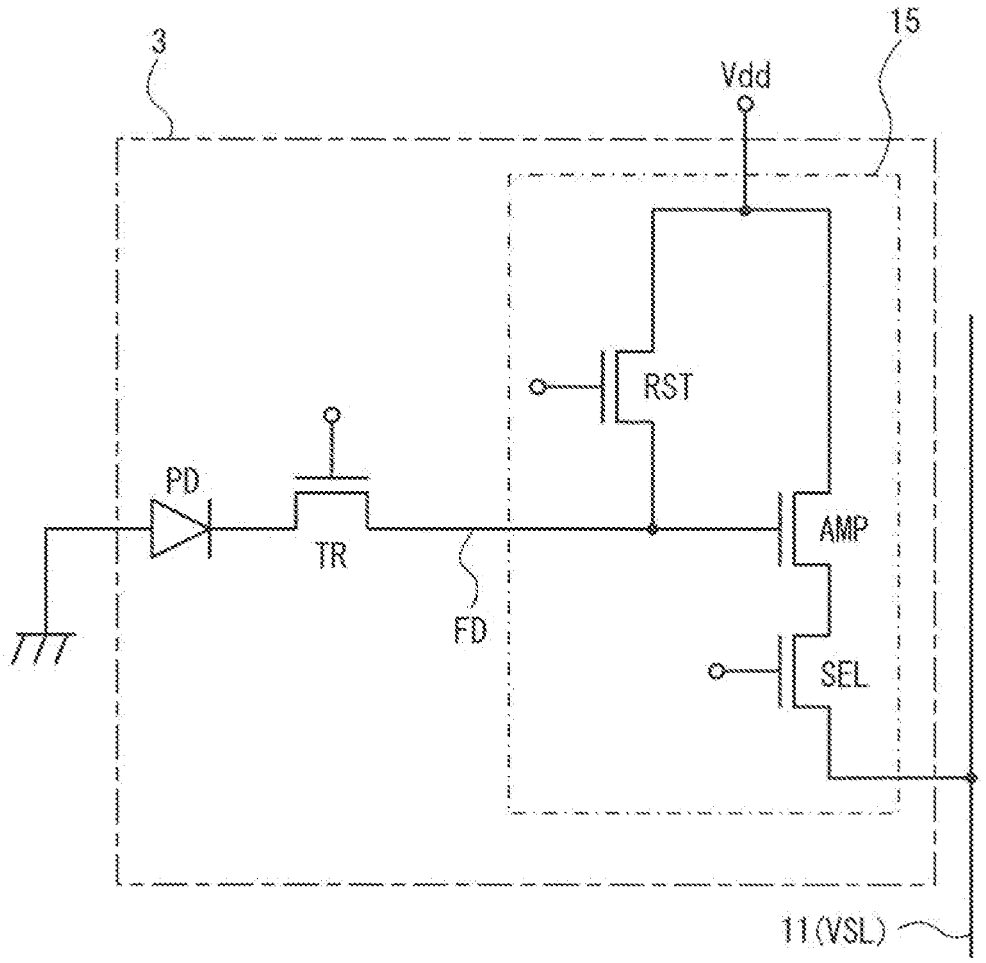
FIG. 3 is an equivalent circuit diagram of a pixel of the photodetection device according to the first embodiment of the present technology.

FIG. 3 is an equivalent circuit diagram illustrating a configuration example of the pixel 3. The pixel 3 includes a photoelectric conversion element PD, a charge accumulation region (floating diffusion) FD that accumulates (holds) a signal charge photoelectrically converted by the photoelectric conversion element PD, and a transfer transistor TR that transfers the signal charge photoelectrically converted by the photoelectric conversion element PD to the charge accumulation region FD. Furthermore, the pixel 3 includes a readout circuit 15 electrically connected to the charge accumulation region FD.

The photoelectric conversion element PD generates a signal charge corresponding to the amount of received light. Furthermore, the photoelectric conversion element PD temporarily accumulates (holds) the generated signal charge. The photoelectric conversion element PD has a cathode side electrically connected to a source region of the transfer transistor TR, and an anode side electrically connected to a reference potential line (for example, ground). As the photoelectric conversion element PD, for example, a photodiode is used.

A drain region of the transfer transistor TR is electrically connected to the charge accumulation region FD. A gate electrode of the transfer transistor TR is electrically connected to a transfer transistor drive line among the pixel drive lines 10 (see FIG. 2).

The charge accumulation region FD temporarily accumulates and holds the signal charge transferred from the photoelectric conversion element PD via the transfer transistor TR.

The readout circuit 15 reads the signal charge accumulated in the charge accumulation region FD, and outputs a pixel signal based on the signal charge. Although not limited thereto, the readout circuit 15 includes, for example, an amplification transistor AMP, a selection transistor SEL, and a reset transistor RST as pixel transistors. These transistors (AMP, SEL, and RST) include, for example, a MOSFET having a gate insulating film formed by a silicon oxide film ($SiO_2$ film), a gate electrode, and a pair of main electrode regions functioning as a source region and a drain region. Furthermore, these transistors may be a metal insulator semiconductor FET (MISFET) whose gate insulating film is a silicon nitride film ($Si_3N_4$ film) or a laminated film of a silicon nitride film and a silicon oxide film.

The amplification transistor AMP has a source region electrically connected to a drain region of the selection transistor SEL, and a drain region electrically connected to a power supply line Vdd and a drain region of the reset transistor. Then, a gate electrode of the amplification transistor AMP is electrically connected to the charge accumulation region FD and a source region of the reset transistor RST.

The selection transistor SEL has a source region electrically connected to the vertical signal line 11 (VSL), and a drain electrically connected to the source region of the amplification transistor AMP. Then, a gate electrode of the selection transistor SEL is electrically connected to a selection transistor drive line among the pixel drive lines 10 (see FIG. 2).

The reset transistor RST has a source region electrically connected to the charge accumulation region FD and the gate electrode of the amplification transistor AMP, and a drain region electrically connected to the power supply line Vdd and the drain region of the amplification transistor AMP. A gate electrode of the reset transistor RST is electrically connected to a reset transistor drive line among the pixel drive lines 10 (see FIG. 2).

<<Specific Configuration of Photodetection Device>>

Next, a specific configuration of the photodetection device 1 will be described with reference to FIGS. 4A, 4B, 5, and the like.

<Laminated Structure of Photodetection Device>

Figure 5:
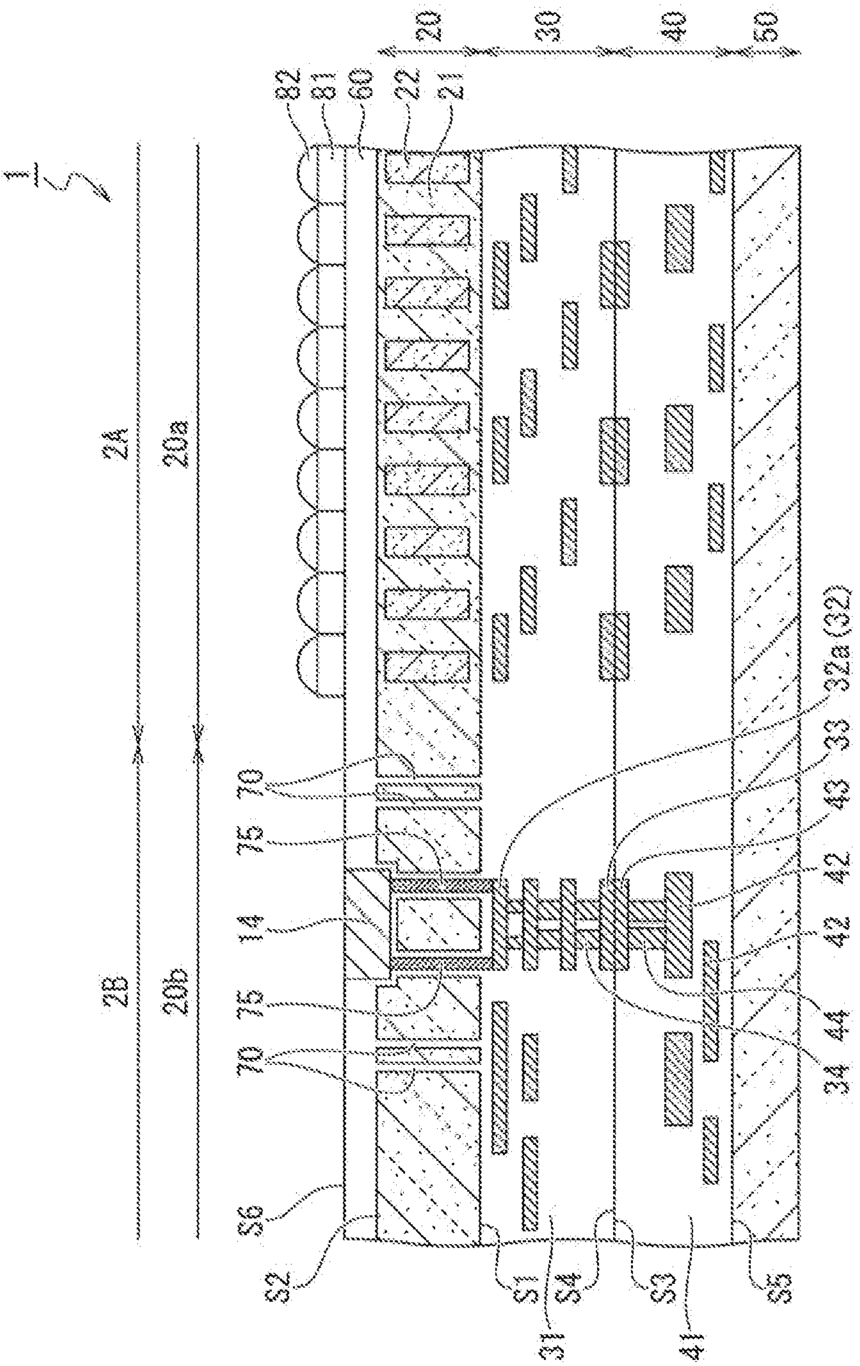
FIG. 5 is a longitudinal cross-sectional view illustrating a relative relationship between the electrode pad and a pixel region of the photodetection device according to the first embodiment of the present technology when viewed in a cross section taken along line A-A of FIG. 1.

As illustrated in FIG. 5, the photodetection device 1 (semiconductor chip 2) includes a first semiconductor layer 20 having a first surface S1 and a second surface S2 located on sides opposite to each other, a first wiring layer 30 superimposed on the first surface S1 of the first semiconductor layer 20, a second wiring layer 40 superimposed on a third surface S3 that is a surface of the first wiring layer 30 on a side opposite to a surface on the first semiconductor layer 20 side, and a second semiconductor layer 50 superimposed on a fifth surface S5 that is a surface of the second wiring layer 40 on a side opposite to a surface (fourth surface S4) on the first wiring layer side. Such a laminated structure can be achieved, for example, by laminating the first wiring layer 30 on the first surface S1 of the first semiconductor layer 20, laminating the second wiring layer 40 on the second semiconductor layer 50, and then, superimposing and bonding the third surface S3 of the first wiring layer 30 and the fourth surface S4 of the second wiring layer 40 on each other. Furthermore, the second surface S2 side, which is one surface of the first semiconductor layer 20, may be referred to as a light incident surface or a back surface, and the first surface S1, which is the other surface of the first semiconductor layer 20, may be referred to as an element formation surface or a main surface.

Furthermore, the photodetection device 1 (semiconductor chip 2) includes an insulating layer 60, a color filter 81, and an on-chip lens 82. The insulating layer 60, the color filter 81, and the on-chip lens 82 are laminated on the second surface S2 of the first semiconductor layer 20 in this order. The insulating layer 60 is provided in both the pixel region 2A and the peripheral region 2B, and the color filter 81 and the on-chip lens 82 are provided in the pixel region 2A out of the pixel region 2A and the peripheral region 2B.

Moreover, the photodetection device 1 (semiconductor chip 2) further includes the electrode pad 14 and an insulating ring 70 surrounding the electrode pad 14 in the plan view.

<First Semiconductor Layer>

The first semiconductor layer 20 is formed with, for example, a single-crystalline silicon substrate of a first conductivity type, for example, a p type. As illustrated in FIG. 5, the first semiconductor layer 20 includes a well region 21 of the first conductivity type, for example, the p type, and a semiconductor region (photoelectric conversion unit) 22 of a second conductivity type, for example, an n type, embedded in the well region 21. The photoelectric conversion element PD illustrated in FIG. 3 is formed in a region including the well region 21 and the photoelectric conversion unit 22.

Furthermore, as illustrated in FIG. 5, the first semiconductor layer 20 includes a pixel region 20*a* overlapping the pixel region 2A in the plan view and a peripheral region 20*b* overlapping the peripheral region 2B in the plan view. The peripheral region 20*b* is provided outside the pixel region 20*a* in the plan view so as to surround the pixel region 20*a*. The above-described photoelectric conversion unit 22 is provided in the pixel region 20*a*. That is, the first semiconductor layer 20 includes the photoelectric conversion unit 22. The photoelectric conversion unit 22 photoelectrically converts incident light to generate a signal charge. Furthermore, the charge accumulation region FD, the transfer transistor TR, and the like illustrated in FIG. 3 are provided in the pixel region 20*a* although not illustrated in FIG. 5. Note that, in a case where it is unnecessary to distinguish between the pixel region 20*a* and the peripheral region 20*b*, the pixel region 20a and the peripheral region 20b are not distinguished and are simply referred to as the first semiconductor layer 20.

Figure 6A:
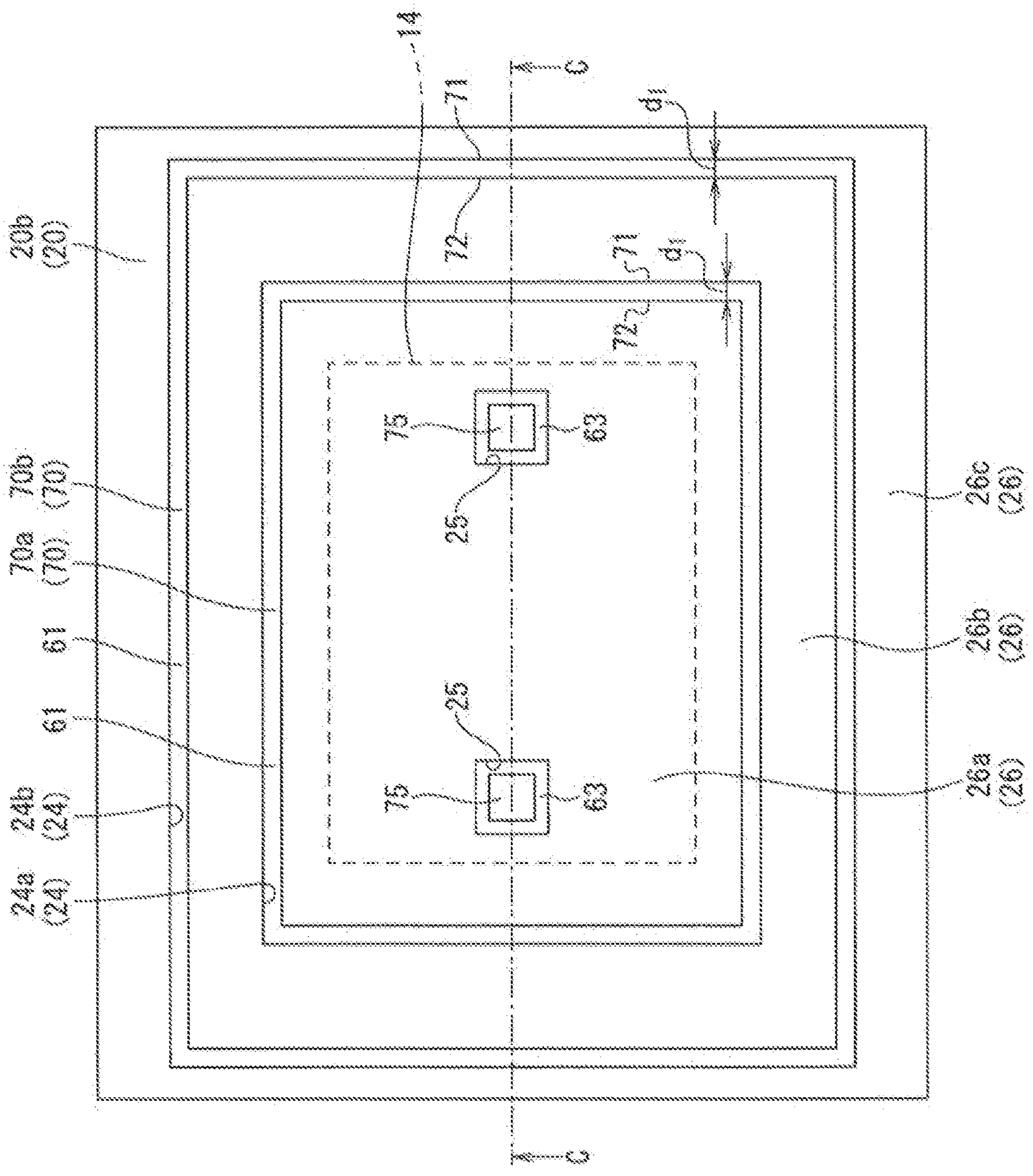
FIG. 6A is a plan view illustrating a positional relationship among an insulating ring, a plug, and the electrode pad according to the first embodiment of the present technology.
Figure 6B:
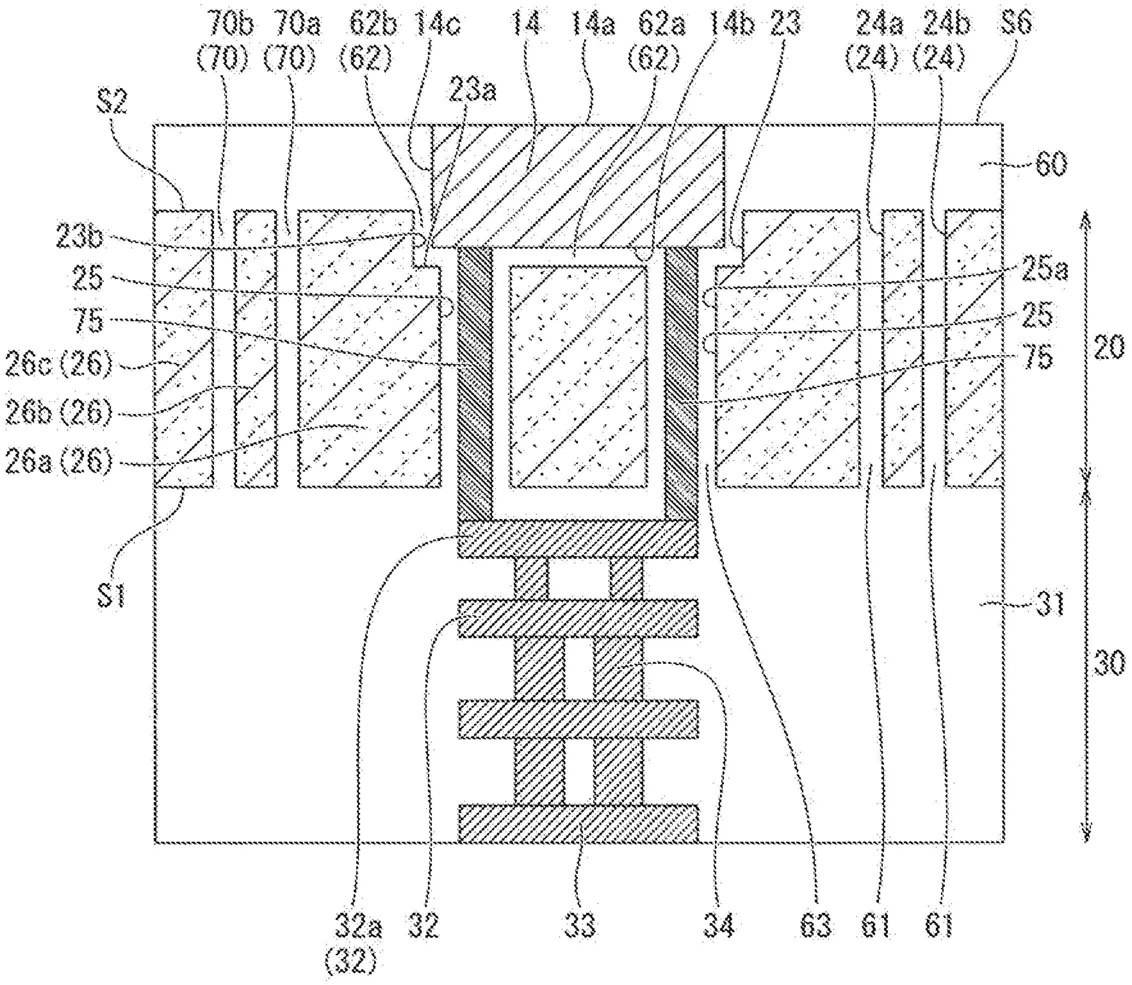
FIG. 6B is a longitudinal cross-sectional view illustrating a positional relationship among the insulating ring, the plug, and the electrode pad according to the first embodiment of the present technology when viewed in a cross section taken along line C-C of FIG. 6A.

On the other hand, as illustrated in FIG. 5, the peripheral region 20b is provided with the insulating ring 70 and a plug 75 to be described later. In order to provide the insulating ring 70 and the plug 75 in the peripheral region 20b, an annular groove 24 and a hole 25 are provided in the peripheral region 20b in the plan view as illustrated in FIGS. 6A and 6B. Furthermore, the peripheral region 20b is provided with a recess 23 in which a part of the electrode pad 14 is embedded.

The groove 24 penetrates the first semiconductor layer 20 in the thickness direction and surrounds the electrode pad 14 in the plan view. FIGS. 6A and 6B illustrate an example in which two grooves 24 are provided for one electrode pad 14. Although one or more grooves 24 can be provided for one electrode pad 14, the description is given here assuming that two grooves 24 are provided for each of the electrode pads 14. In order to distinguish between these two grooves 24, an inner groove is referred to as a first groove 24a, and an outer groove, that is, a groove surrounding the first groove 24a in the plan view is referred to as a second groove 24b. In a case where there is no need to distinguish between the first groove 24a and the second groove 24b, the first groove 24a and the second groove 24b are not distinguished and are simply referred to as the grooves 24. Moreover, there is also a case where the first groove 24a and the second groove 24b are collectively referred to as the groove 24.

The hole 25 penetrates the first semiconductor layer 20 in the thickness direction of the first semiconductor layer 20. More specifically, the hole 25 penetrates between a bottom surface 23a of the recess 23 and the first surface S1. A plurality of the holes 25 is provided. More specifically, two holes 25 are provided.

<Insulating Layer>

The insulating layer 60 is an insulating film laminated on the second surface S2 side of the first semiconductor layer 20 by, for example, a CVD method or the like. As the insulating layer 60, for example, a material such as silicon oxide ($SiO_2$), silicon nitride ($Si_3N_4$), silicon oxynitride (SiON), or silicon carbide (SiC) can be adopted.

Furthermore, the insulating layer 60 fills the inside of the groove 24. A portion of the insulating layer 60 embedded in the groove 24 is referred to as an insulating layer 61 to be distinguished from the other portion of the insulating layer 60. Moreover, the insulating layer 60 is deposited on the bottom surface 23a and a side surface 23b of the recess 23 and an inner surface 25a of the hole 25. A portion of the insulating layer 60 deposited on the bottom surface 23a and the side surface 23b of the recess 23 is referred to as an insulating layer 62 (a first insulating layer) in order to be distinguished from the other portion of the insulating layer 60. Furthermore, a portion deposited on the bottom surface 23a is referred to as an insulating layer 62a (an eleventh insulating layer), and a portion deposited on the side surface 23b is referred to as an insulating layer 62b (a twelfth insulating layer) in order to distinguish between the portion deposited on the bottom surface 23a and the portion deposited on the side surface 23b of the insulating layer 62. In a case where there is no need to distinguish between the insulating layer 62a and the insulating layer 62b, the insulating layer 62a and the insulating layer 62b are not distinguished and are simply referred to as the insulating layer 62. Then, a portion of the insulating layer 60 deposited on the inner surface 25a of the hole 25 is referred to as an insulating layer 63 (a second insulating layer) to be distinguished from the other portion of the insulating layer 60.

<Plug>

A plurality of the plugs 75 is provided. More specifically, two plugs 75 are provided. The plug 75 is embedded in the hole 25 with the insulating layer 63 interposed therebetween, and electrically connects the electrode pad 14 and metal layers 32 to be described later. More specifically, the plug 75 is embedded in the hole 25 in a state where the insulating layer 63 interposed between the plug and the first semiconductor layer 20. One end of the plug 75 is connected to the electrode pad 14. More specifically, one end of the plug 75 penetrates the insulating layer 62a and is connected to a lower surface 14b of the electrode pad 14 as described later. The other end of the plug 75 is connected to the metal layer 32. More specifically, the other end of the plug 75 penetrates the first semiconductor layer 20 in the thickness direction of the first semiconductor layer 20 and extends to the inside of the first wiring layer 30. Then, the other end of the plug 75 is connected to the metal layer 32 in the first wiring layer 30. Here, the metal layer 32 to which the other end of the plug 75 is connected is referred to as a metal layer 32a in order to be distinguished from the other metal layers 32. Furthermore, for example, tungsten may be used as a material constituting the plug 75.

<Electrode Pad>

Figure 4A:
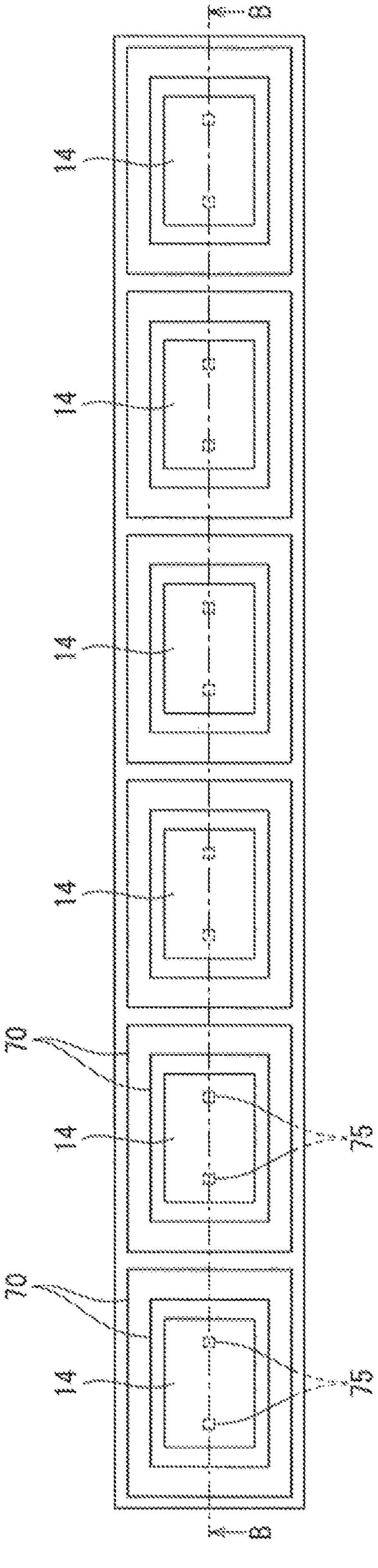
FIG. 4A is a plan view illustrating an array of electrode pads according to the first embodiment of the present technology.
Figure 4B:
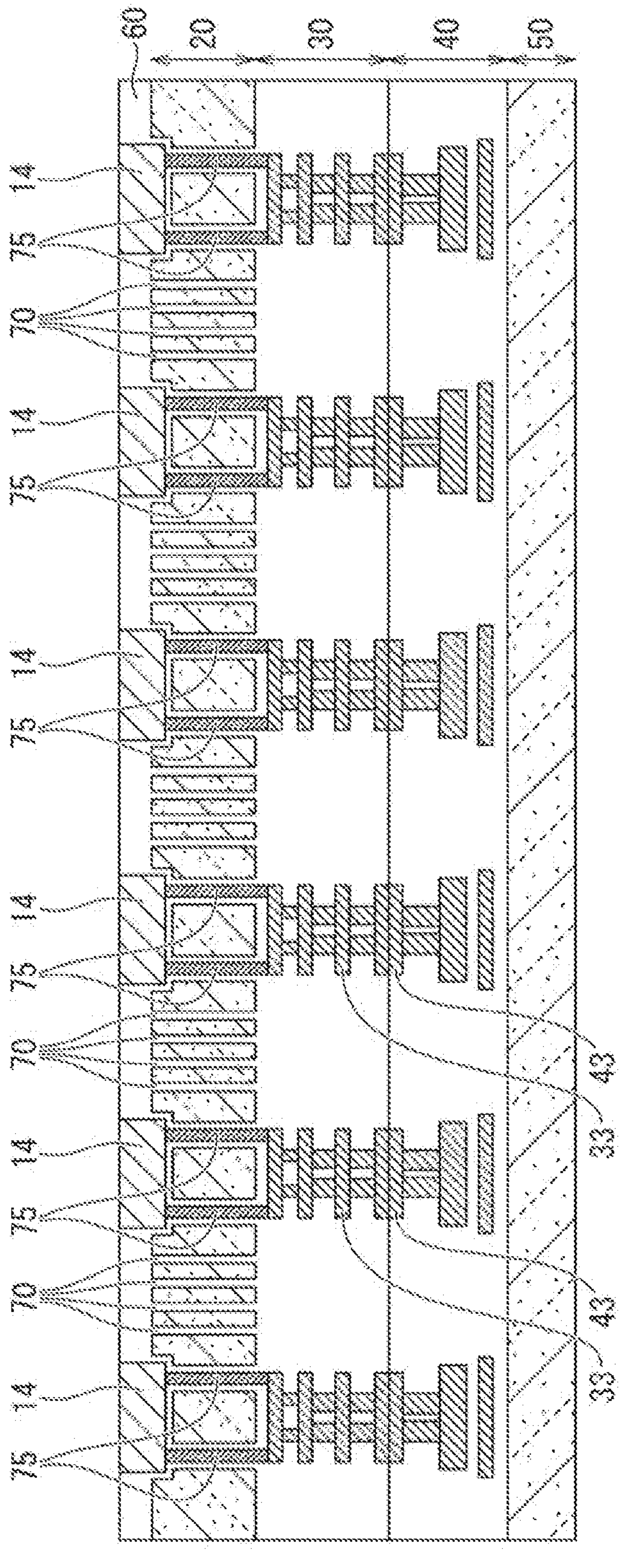
FIG. 4B is a longitudinal cross-sectional view illustrating a cross section of the electrode pad when viewed in a cross section taken along line B-B of FIG. 4A.

As illustrated in FIGS. 1, 4A, and 4B, a plurality of the electrode pads (bonding pads) 14 is arranged in the peripheral region 2B of the photodetection device 1 (semiconductor chip 2). The electrode pads 14 are arrayed, for example, along each of four sides in the two-dimensional plane of the semiconductor chip 2. More specifically, the electrode pads 14 are arrayed in a line along each of the four sides along the X direction and the Y direction, for example, as illustrated in FIGS. 4A and 4B. Note that the number of the electrode pads 14 is not limited to the illustrated number.

As illustrated in FIG. 6B, the electrode pad 14 has an upper surface 14a, the lower surface 14b which is a surface on a side opposite to the upper surface 14a, and a side surface 14c which is a side surface extending between the upper surface 14a and the lower surface 14b of 2. The upper surface 14a is an exposed surface exposed to the outside. The electrode pad 14 is an input/output terminal used when the photodetection device 1 is electrically connected to an external device. Therefore, the electrode pad 14 is exposed to the outside. More specifically, the upper surface 14a of the electrode pad 14 is exposed to the outside. Furthermore, the upper surface 14a of the electrode pad 14 is located on the same plane with a surface S6 that is a surface of the insulating layer 60 on a side opposite to the surface on the first semiconductor layer 20 side. Then, the lower surface 14b of the electrode pad 14 is connected to the plug 75.

The electrode pad 14 is provided on the first semiconductor layer 20 side out of the first semiconductor layer 20 and the second semiconductor layer 50. The electrode pad 14 is exposed from the surface S6 in a state where the insulating layer 60 (insulating layer 62) is interposed between the electrode pad and the first semiconductor layer 20. Furthermore, a part of the electrode pad 14 is buried in the first semiconductor layer 20. More specifically, a part of the electrode pad 14 is buried in the recess 23 with the insulating layer 62 interposed therebetween.

Furthermore, the insulating layer 62 is interposed between the electrode pad 14 and the first semiconductor layer 20, and the electrode pad 14, the insulating layer 62, and the first semiconductor layer 20 form a parasitic capacitance. More specifically, the electrode pad 14, the insulating layer 62, and a region 26*a* to be described later form a parasitic capacitance C1 illustrated in FIG. 6C.

<Insulating Ring>

As illustrated in FIGS. 5, 6A, and 6B, the insulating ring 70 is a ring having an insulating property, penetrating the first semiconductor layer 20 in the thickness direction, and surrounding the electrode pad 14 in the plan view. The insulating ring 70 includes an insulating material. More specifically, the insulating ring 70 is the insulating layer 61.

FIGS. 5, 6A, and 6B illustrate an example in which two insulating rings 70 are provided for each of the electrode pads 14. Although one or more insulating rings 70 can be provided for one electrode pad 14, the description is given here assuming that two insulating rings are provided for each of the electrode pads 14. In order to distinguish between the two insulating rings 70, an insulating ring on the inner side is referred to as a first insulating ring 70*a*, and an insulating ring on the outer side, that is, insulating ring surrounding the first insulating ring 70*a* in the plan view is referred to as a second insulating ring 70*b*. The first insulating ring 70*a* is the insulating layer 61 embedded in the first groove 24*a*, and the second insulating ring 70*b* is the insulating layer 61 embedded in the second groove 24*b*. Note that in a case where the first insulating ring 70*a* and the second insulating ring 70*b* do not need to be distinguished from each other, the first insulating ring 70*a* and the second insulating ring 70*b* are not distinguished and are simply referred to as the insulating rings 70. Moreover, there is also a case where the first insulating ring 70*a* and the second insulating ring 70*b* are collectively referred to as the insulating ring 70.

Furthermore, a width d1 between an outer contour 71 and an inner contour 72 of the insulating ring 70 in the plan view is 10 nm or more and 300 nm or less as illustrated in FIG. 6A.

Since the insulating ring 70 penetrates the first semiconductor layer 20 in the thickness direction of the first semiconductor layer 20, the first semiconductor layer 20 is divided into a plurality of regions 26 by the insulating ring 70. Here, there are two insulating rings 70, and thus, the first semiconductor layer 20 is divided into three regions 26 as illustrated in FIGS. 6A and 6B. Here, in order to distinguish these three regions 26 from each other, a region located on the inner side of the first insulating ring 70*a* is referred to as the region 26*a*, a region located between the first insulating ring 70*a* and the second insulating ring 70*b* is referred to as a region 26*b*, and a region located on the outer side of the second insulating ring 70*b* is referred to as a region 26*c*. Note that, in a case where the region 26*a*, the region 26*b*, and the region 26*c* do not need to be distinguished from each other, the region 26*a*, the region 26*b*, and the region 26*c* are not distinguished and are simply referred to as the regions 26. Furthermore, the region 26 located on the inner side of the insulating ring 70, more specifically, the region 26*a* and the region 26*b* are in an electrically floating state.

Figure 6C:
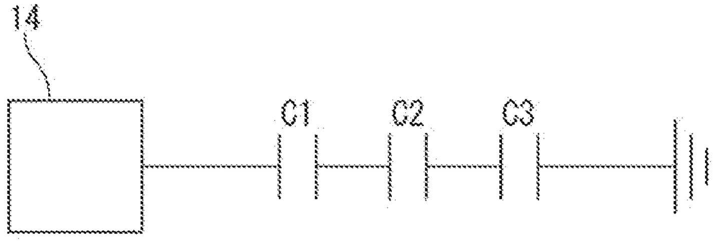
FIG. 6C is a schematic diagram illustrating a configuration of a capacitor in a case where two insulating rings are provided in the photodetection device according to the first embodiment of the present technology.

Then, the insulating ring 70 and the two regions 26 adjacent to the insulating ring 70 form a capacitor. More specifically, the region 26*a*, the first insulating ring 70*a*, and the region 26*b* form a capacitor C2 illustrated in FIG. 6C, and the region 26*b*, the second insulating ring 70*b*, and the region 26*c* form a capacitor C3 illustrated in FIG. 6C. Then, a state where the three capacitors C1, C2, and C3 illustrated in FIG. 6C are connected in series together with the above-described parasitic capacitance C1 is formed.

<First Wiring Layer>

As illustrated in FIG. 5, the first wiring layer 30 includes an interlayer insulating film 31, the metal layer 32, a first connection pad 33, and a via 34. The metal layer 32 and the first connection pad 33 are laminated with the interlayer insulating film 31 interposed therebetween as illustrated in the drawing. The via 34 connects the metal layers 32 to each other and connects the metal layer 32 and the first connection pad 33. The first connection pad 33 faces the third surface S3 of the first wiring layer 30. The first connection pad 33 is electrically connected to the metal layer 32*a*. For example, the first connection pad 33 is electrically connected to the metal layer 32*a* via a plurality of layers of the metal layers 32 and the vias 34. Moreover, the first connection pad 33 is electrically connected to the electrode pad 14 via the metal layer 32*a* and the plug 75.

<Second Wiring Layer>

As illustrated in FIG. 5, the second wiring layer 40 includes an interlayer insulating film 41, a metal layer 42, a second connection pad 43, and a via 44. The metal layer 42 and the second connection pad 43 are laminated with the interlayer insulating film 41 interposed therebetween as illustrated in the drawing. The via 44 connects the metal layers 42 to each other and connects the metal layer 42 and the second connection pad 43. The second connection pad 43 faces the fourth surface S4 of the second wiring layer 40 and is bonded to the first connection pad 33. Therefore, the electrode pad 14 of the first wiring layer 30 is electrically connected to the metal layer 42 of the second wiring layer 40. Then, the electrode pad 14, the first connection pad 33, and the second connection pad 43 overlap each other in the thickness direction as illustrated in FIG. 5.

<Second Semiconductor Layer>

As illustrated in FIG. 5, the second semiconductor layer 50 is formed with a single-crystalline silicon substrate of the first conductivity type, for example, the p type. The second semiconductor layer 50 is provided with, for example, transistors forming the logic circuit 13 and the readout circuit 15.

<<Method for Manufacturing Photodetection Device>>

Figure 7A:
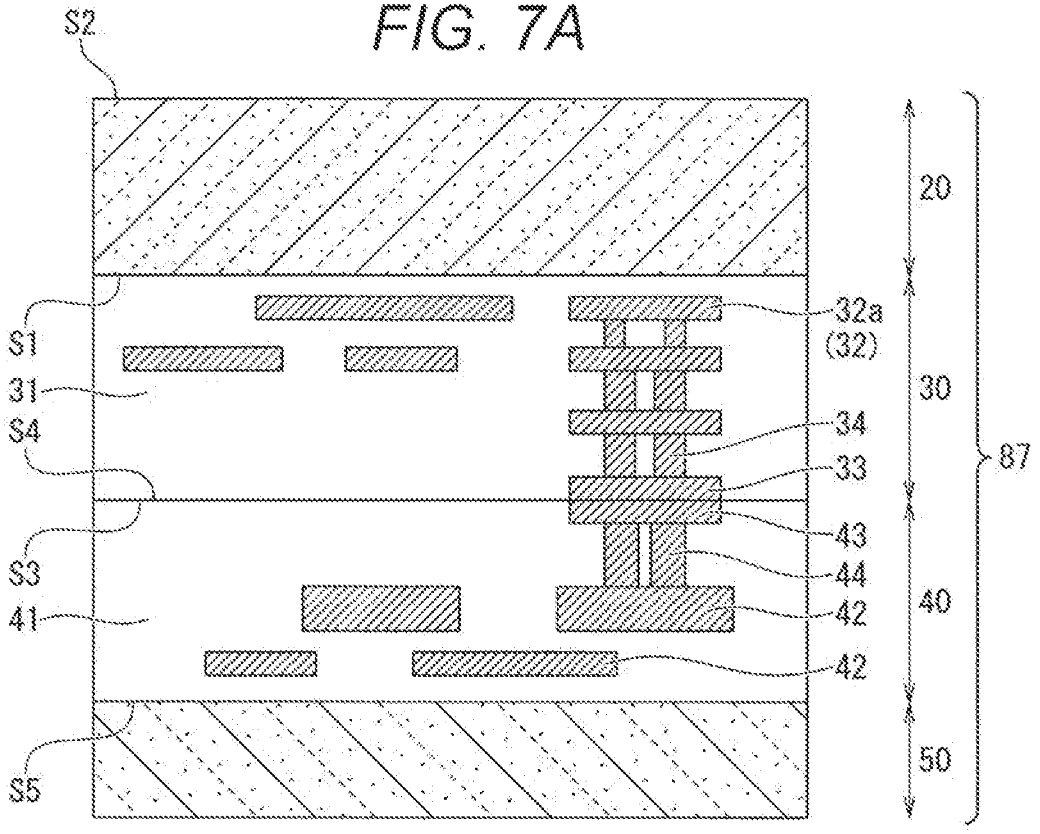
FIG. 7A is a process cross-sectional view illustrating a method for manufacturing the photodetection device according to the first embodiment of the present technology.

Hereinafter, a method for manufacturing the photodetection device 1 will be described with reference to FIGS. 7A to 7M. First, as illustrated in FIG. 7A, a substrate 87 in which the first semiconductor layer 20, the first wiring layer 30, the second wiring layer 40, and the second semiconductor layer 50 are sequentially superimposed in this order is prepared. Although not illustrated, a diffusion region such as the n-type semiconductor region 22, various transistors, and the like are already formed in the first semiconductor layer 20. Although not illustrated, various transistors are formed in the second semiconductor layer 50. Then, the second connection pad 43 and first connection pad 33 are bonded to each other.

Figure 7B:
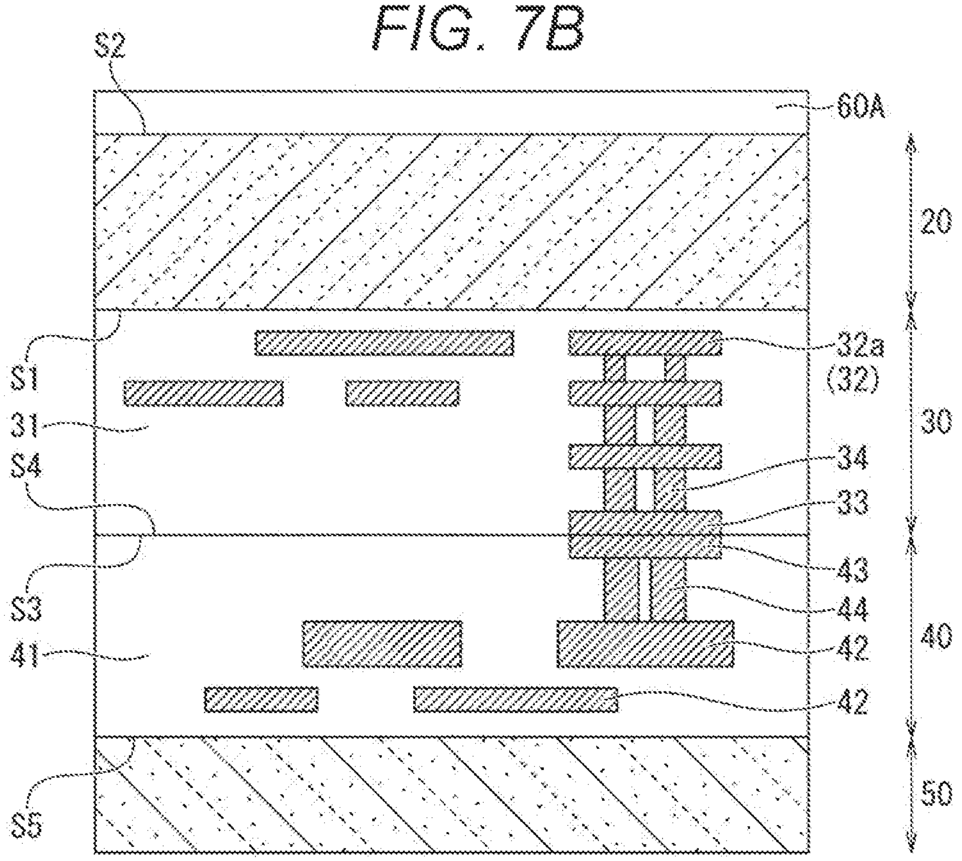
FIG. 7B is a process cross-sectional view subsequent to FIG. 7A.
Figure 7C:
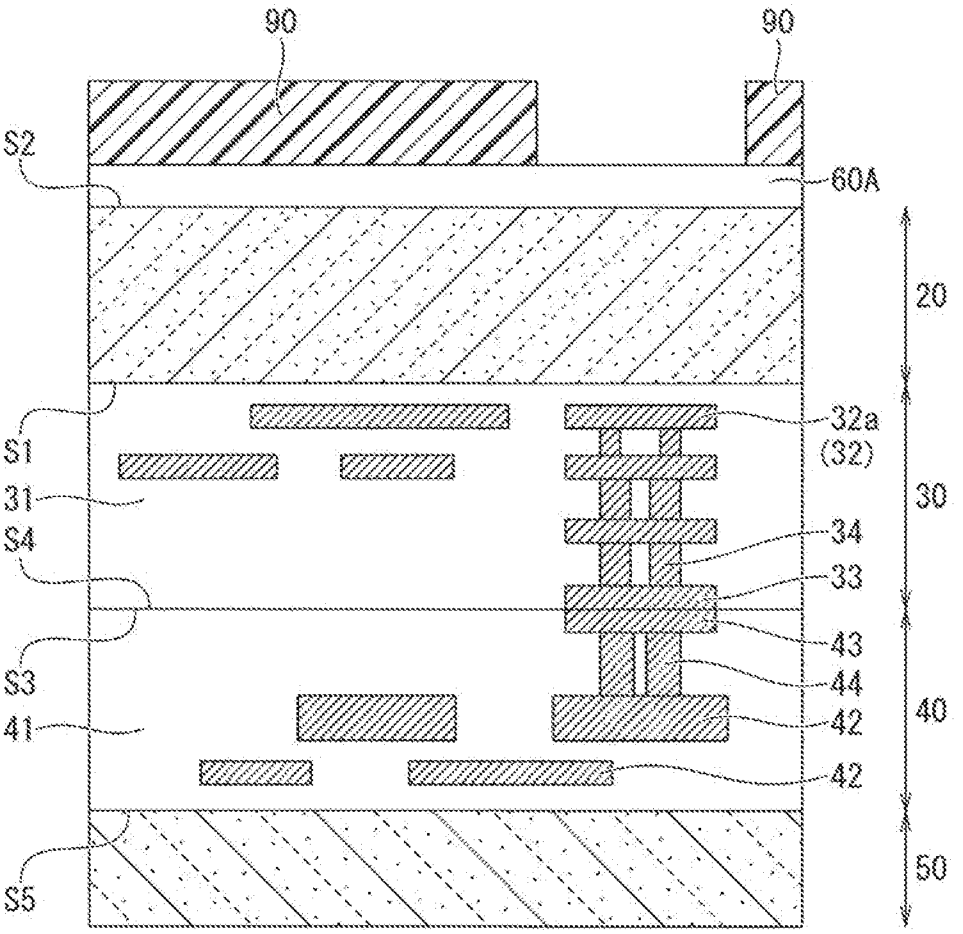
FIG. 7C is a process cross-sectional view subsequent to FIG. 7B.
Figure 7D:
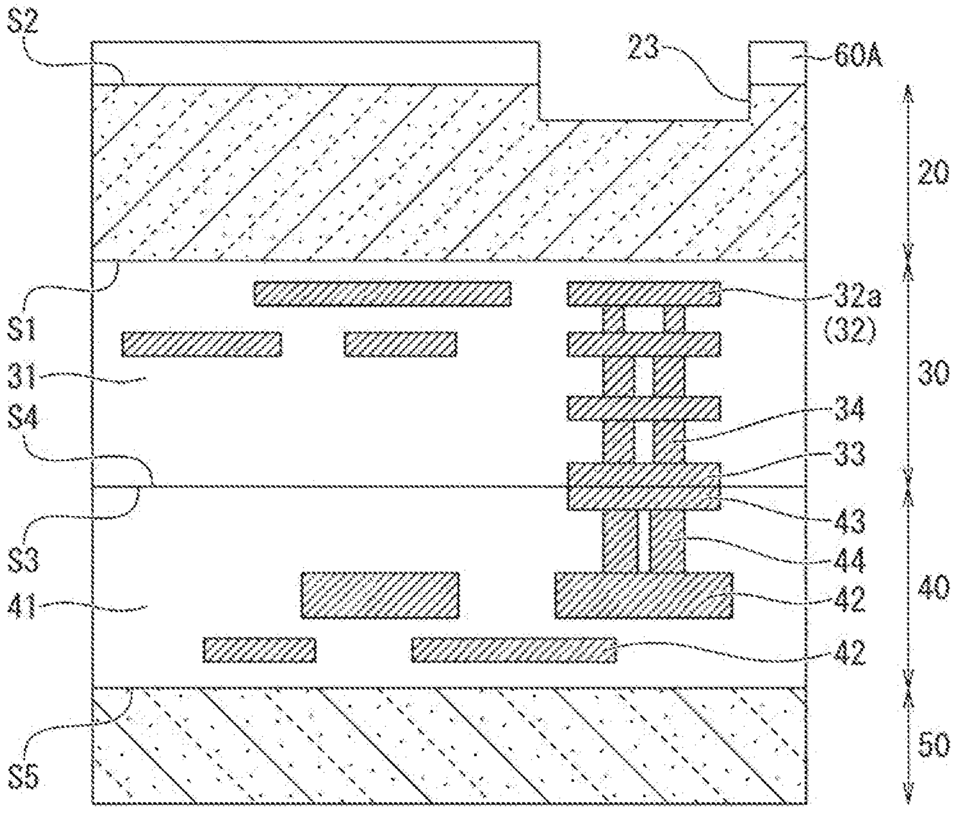
FIG. 7D is a process cross-sectional view subsequent to FIG. 7C.

Next, an insulating layer 60A is laminated on the second surface S2 of the first semiconductor layer 20 as illustrated in FIG. 7B. Then, a resist pattern 90 is laminated on a surface of the insulating layer 60A on a side opposite to the surface on the first semiconductor layer 20 side as illustrated in FIG. 7C. Then, the insulating layer 60A and the first semiconductor layer 20 are etched using the resist pattern 90 as a mask to form the recess 23 illustrated in FIG. 7D.

Figure 7E:
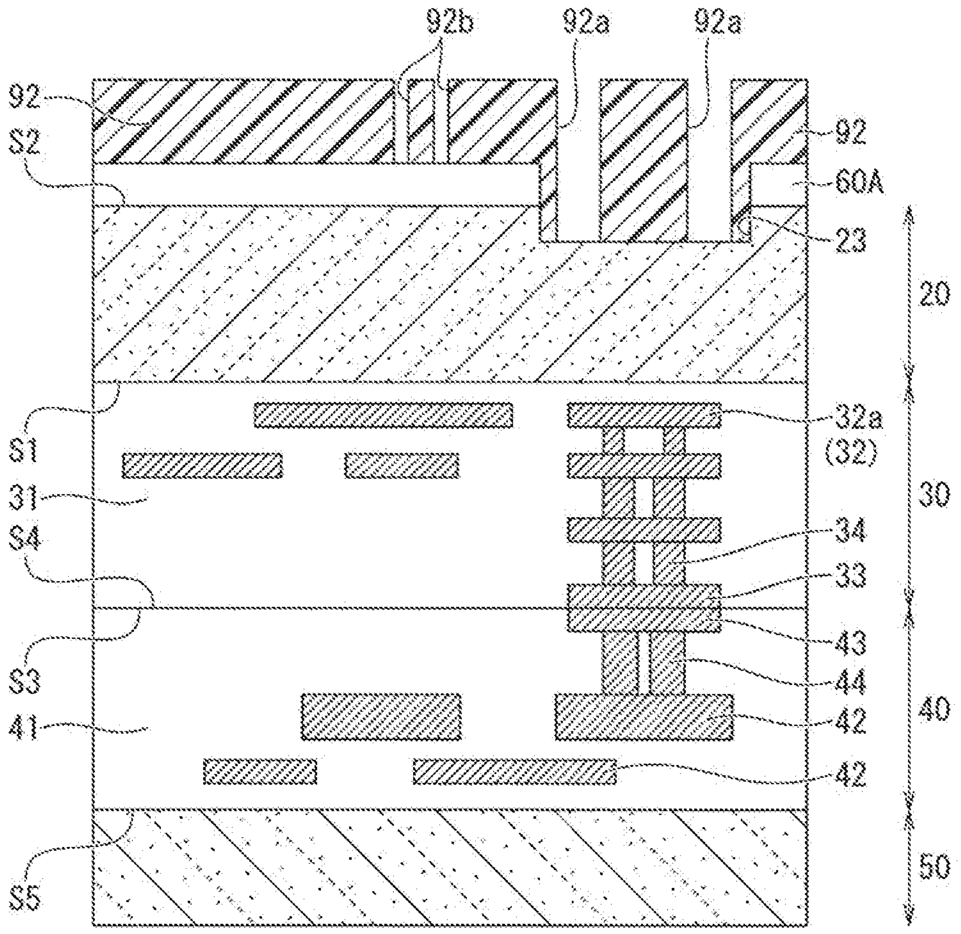
FIG. 7E is a process cross-sectional view subsequent to FIG. 7D.
Figure 7F:
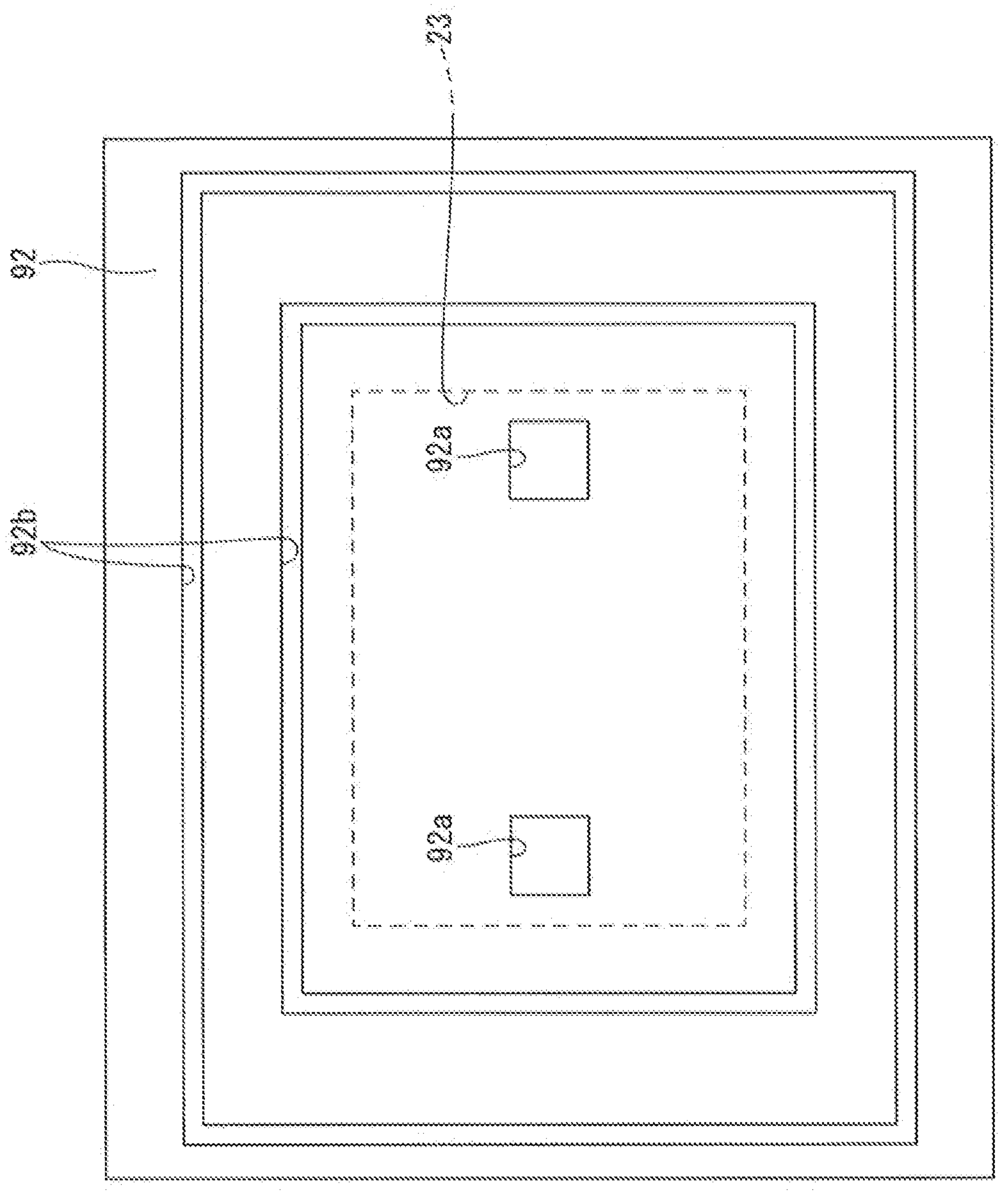
FIG. 7F is a plan view illustrating a resist pattern formed in the process of FIG. 7E.
Figure 7G:
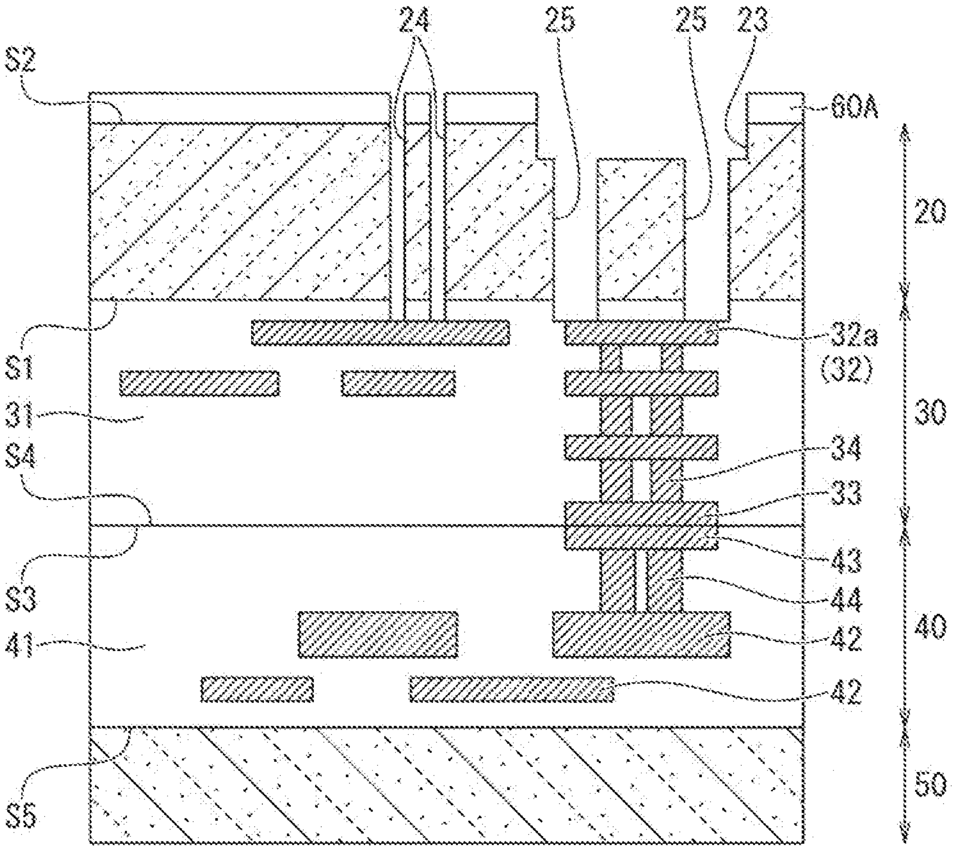
FIG. 7G is a process cross-sectional view subsequent to FIG. 7E.

Then, a resist pattern 92 is laminated on the insulating layer 60A and the recess 23 as illustrated in FIGS. 7E and 7F. FIG. 7F is a plan view illustrating the resist pattern 92 formed in the process of FIG. 7E. Then, etching is performed using the resist pattern 92 as a mask as illustrated in FIG. 7G. More specifically, the first semiconductor layer 20 exposed from an opening 92*a* of the resist pattern 92 is etched to form the hole 25 penetrating the first semiconductor layer 20. Moreover, the insulating layer 60A and the first semiconductor layer 20 exposed from an opening 92*b* of the resist pattern 92 are etched to form the groove 24 penetrating the first semiconductor layer 20.

Figure 7H:
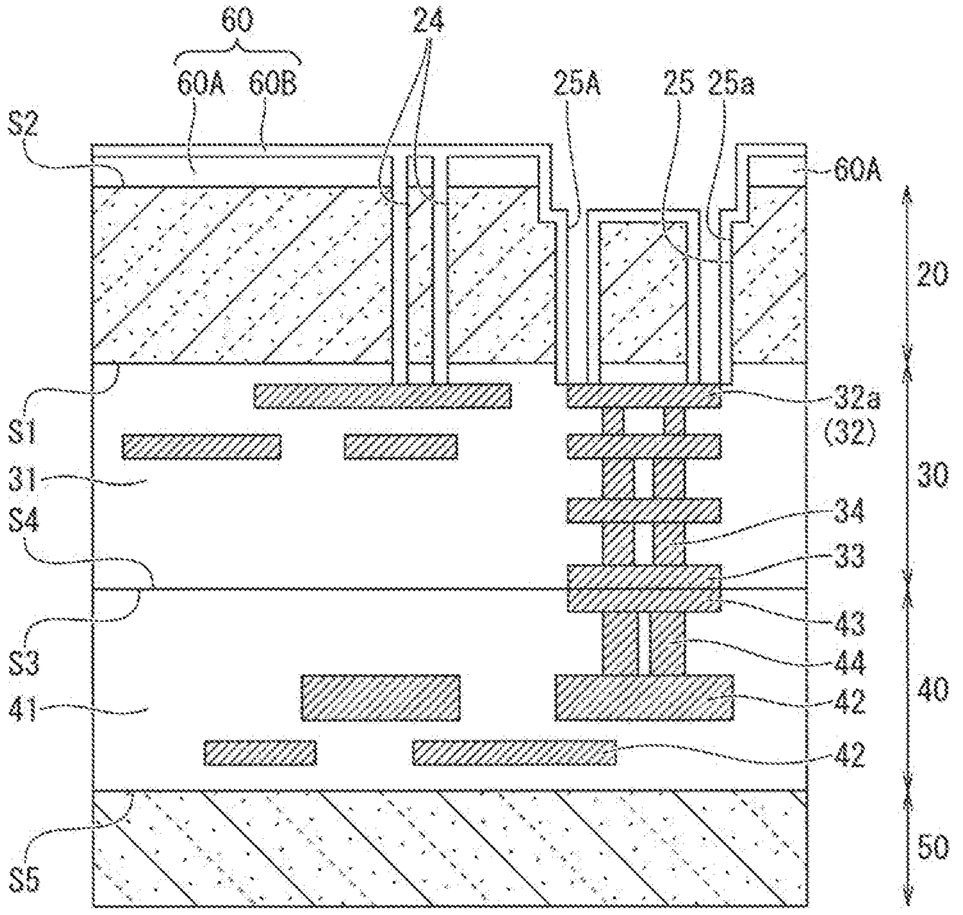
FIG. 7H is a process cross-sectional view subsequent to FIG. 7G.

Next, an insulating layer 60B is laminated on the insulating layer 60A and the first semiconductor layer 20 as illustrated in FIG. 7H. Note that the above-described insulating layer 60 includes the insulating layer 60A and the insulating layer 60B. The laminated insulating layer 60B is embedded in the groove 24. The insulating layer 60B embedded in the groove 24 corresponds to the insulating layer 61 illustrated in FIG. 6B. Then, the insulating ring 70 illustrated in FIG. 6B is formed as a result.

Moreover, the insulating layer 60B is laminated so as to cover the inner surface 25*a* of the hole 25 as illustrated in FIG. 7H. Since a diameter of the hole 25 is larger than a width of the groove 24 (the width d1 of the insulating ring 70), the hole 25 is not completely filled with the insulating layer 60B, and the inner surface 25*a* is covered with the insulating layer 60B. The diameter of the hole 25 is, for example, about two or three times the width of the groove 24. Furthermore, a hollow portion of the hole 25 after being covered with the insulating layer 60B is referred to as a hole 25A.

Figure 7I:
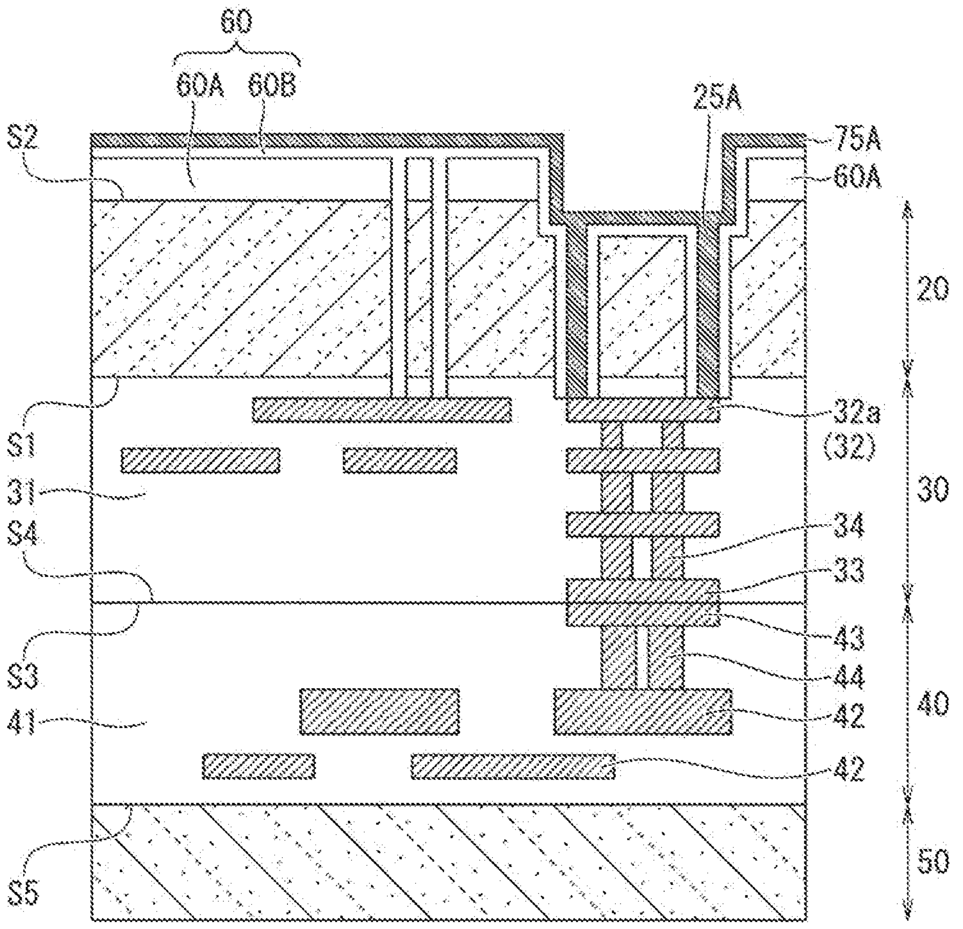
FIG. 7I is a process cross-sectional view subsequent to FIG. 7H.
Figure 7J:
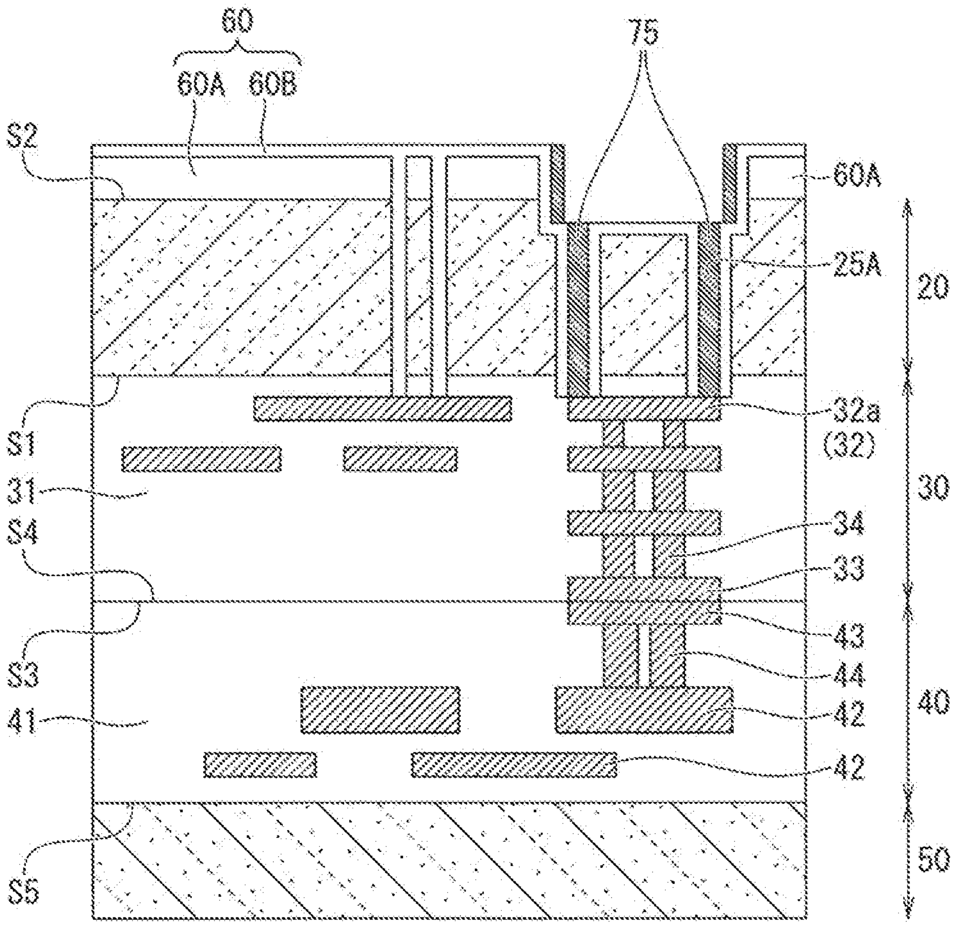
FIG. 7J is a process cross-sectional view subsequent to FIG. 7I.

Then, after the insulating layer 60B laminated on the metal layer 32*a* through the hole 25 is removed, a tungsten film 75A is laminated so as to cover the insulating layer 60B and fill the inside of the hole 25A as illustrated in FIG. 7I. Thereafter, the entire surface etching is performed to remove an unnecessary portion of the tungsten film 75A as illustrated in FIG. 7J. Therefore, the plug 75 is formed.

Figure 7K:
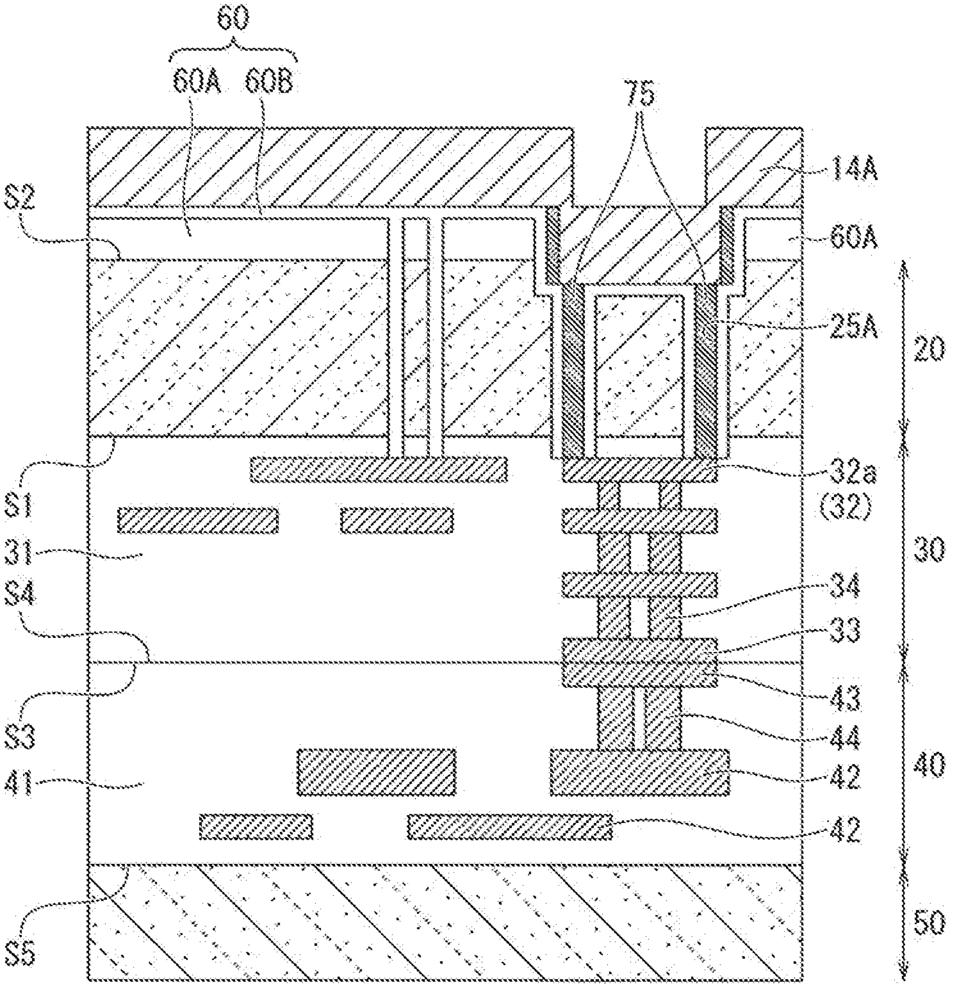
FIG. 7K is a process cross-sectional view subsequent to FIG. 7J.
Figure 7L:
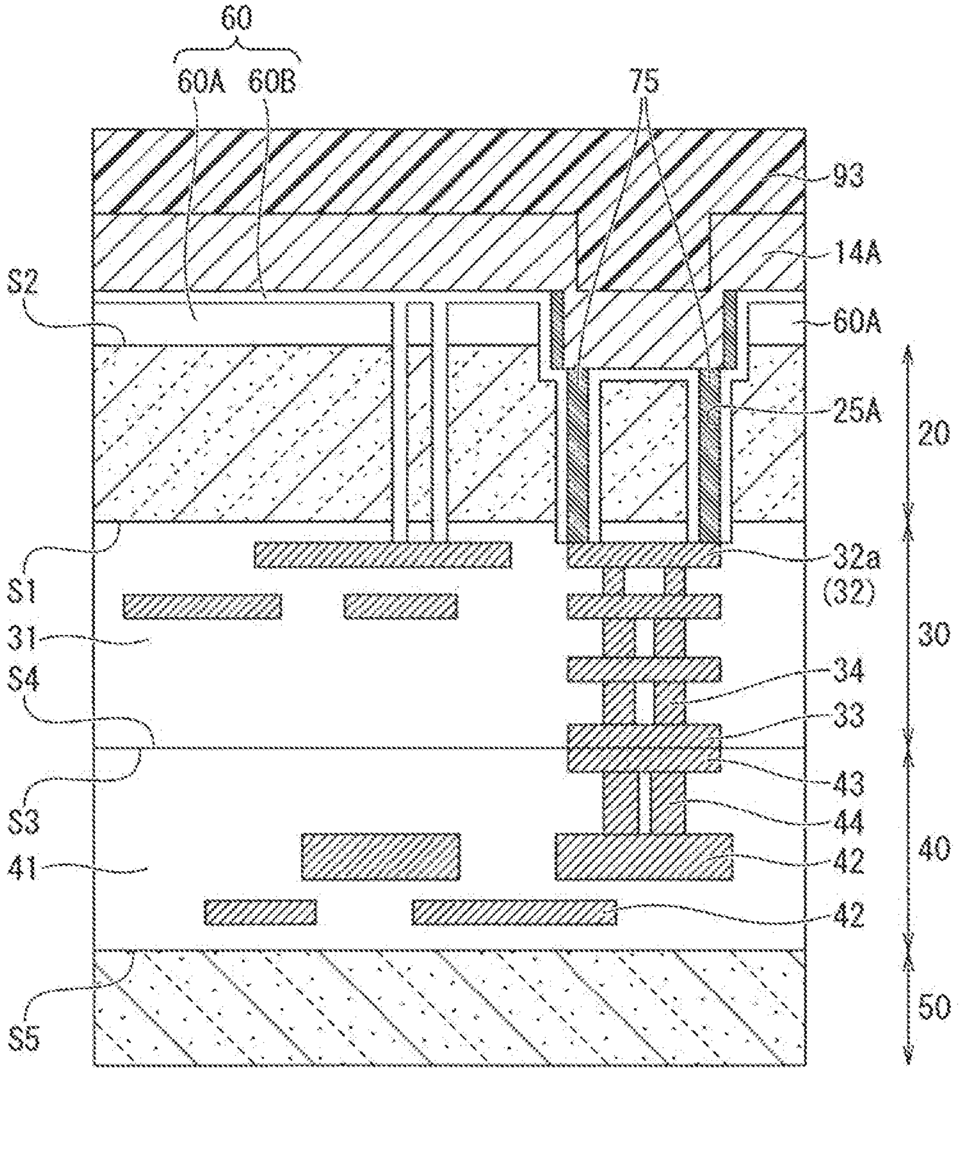
FIG. 7L is a process cross-sectional view subsequent to FIG. 7K.
Figure 7M:
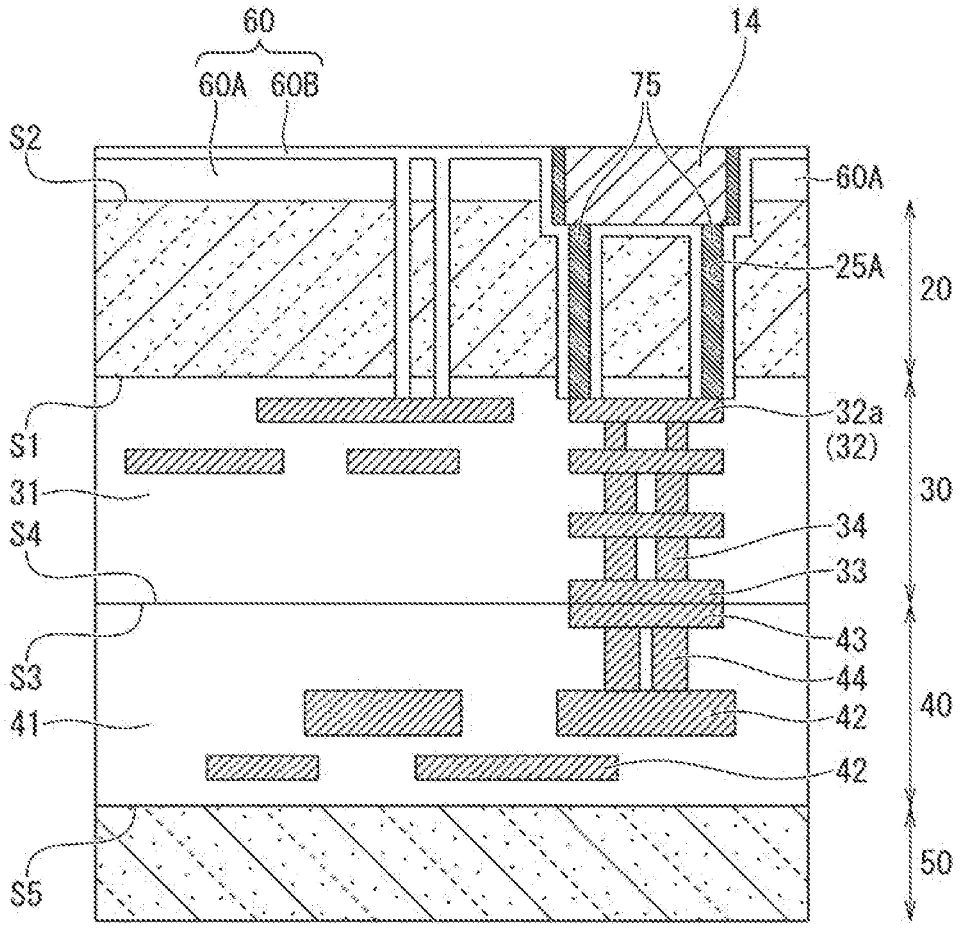
FIG. 7M is a process cross-sectional view subsequent to FIG. 7L.

Thereafter, an aluminum film 14A is deposited as illustrated in FIG. 7K. Then, a resist pattern 93 is deposited on the aluminum film 14A as illustrated in FIG. 7L, and the entire surface etching is performed to remove an unnecessary portion of the aluminum film 14A as illustrated in FIG. 7M. Therefore, the electrode pad 14 is formed.

Then, after the electrode pad 14 is formed, the color filter 81 and the on-chip lens 82 are laminated in this order on the surface of the insulating layer 60 on the side opposite to the surface on the first semiconductor layer 20 side although not illustrated, whereby the photodetection device 1 illustrated in FIG. 5 is almost completed. The photodetection device 1 is formed in each of a plurality of chip formation regions defined by scribe lines (dicing lines) on a semiconductor substrate. Then, the plurality of chip formation regions is divided into single chips along the scribe lines, thereby forming the semiconductor chip 2 on which the photodetection device 1 is mounted.

Main Effects of First Embodiment

Figure 8A:
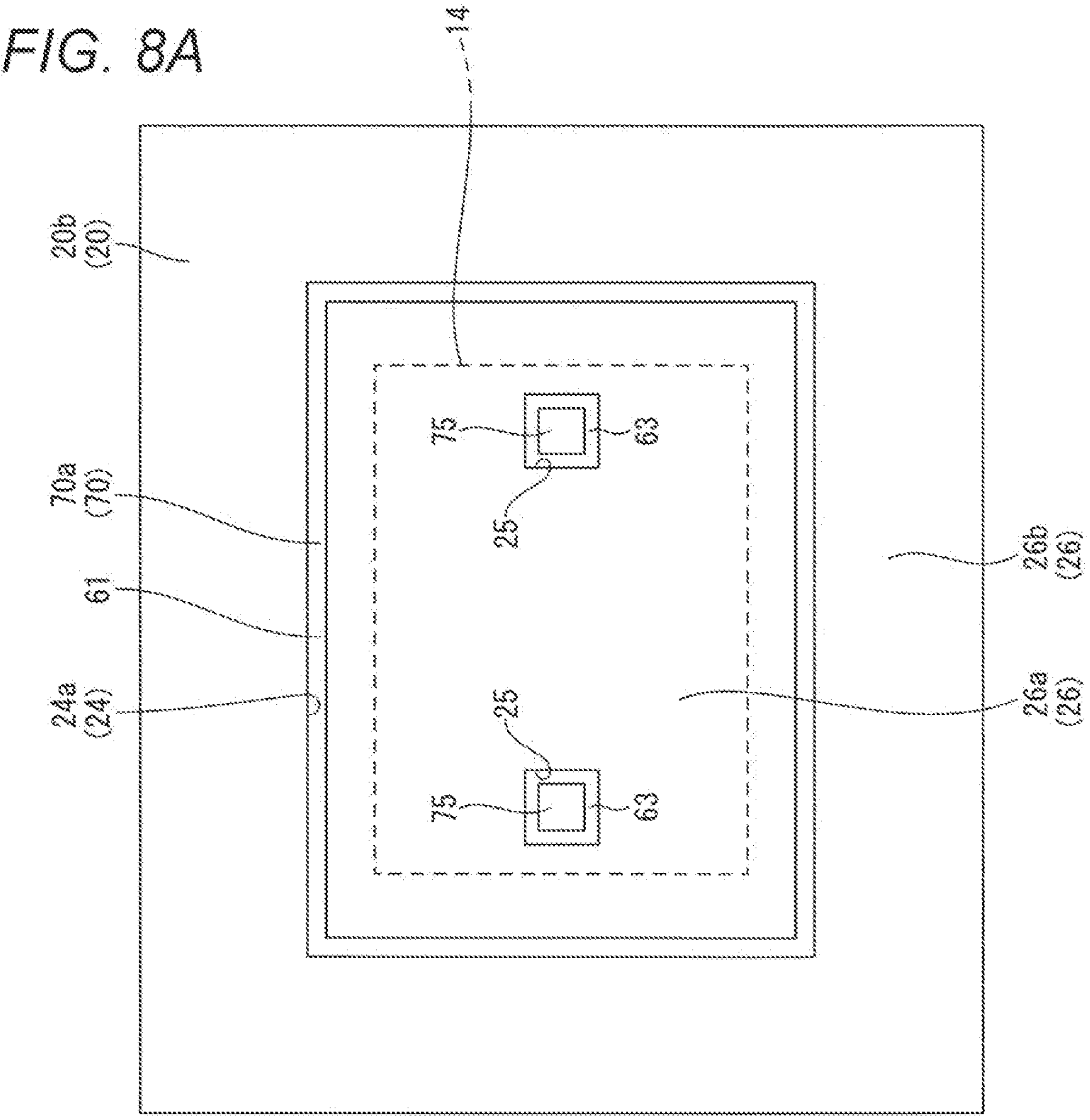
FIG. 8A is a plan view illustrating a positional relationship among one insulating ring, the plug, and the electrode pad according to the first embodiment of the present technology.

Hereinafter, main effects of the first embodiment will be described. Here, the main effects will be described by exemplifying a case where one insulating ring 70 is provided as illustrated in FIGS. 8A and 8B and a case where three insulating rings 70 are provided as illustrated in FIGS. 9A and 9B, in addition to the case where two insulating rings 70 are provided as illustrated in FIGS. 6A and 6C described above.

Figure 8B:
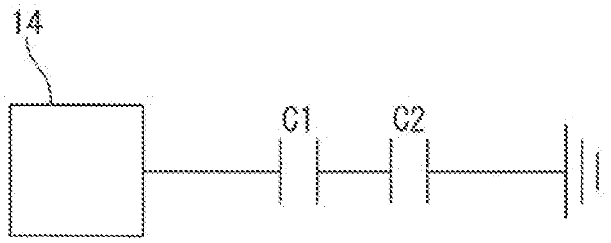
FIG. 8B is a schematic diagram illustrating a configuration of a capacitor in a case where one insulating ring is provided in the photodetection device according to the first embodiment of the present technology.
Figure 9A:
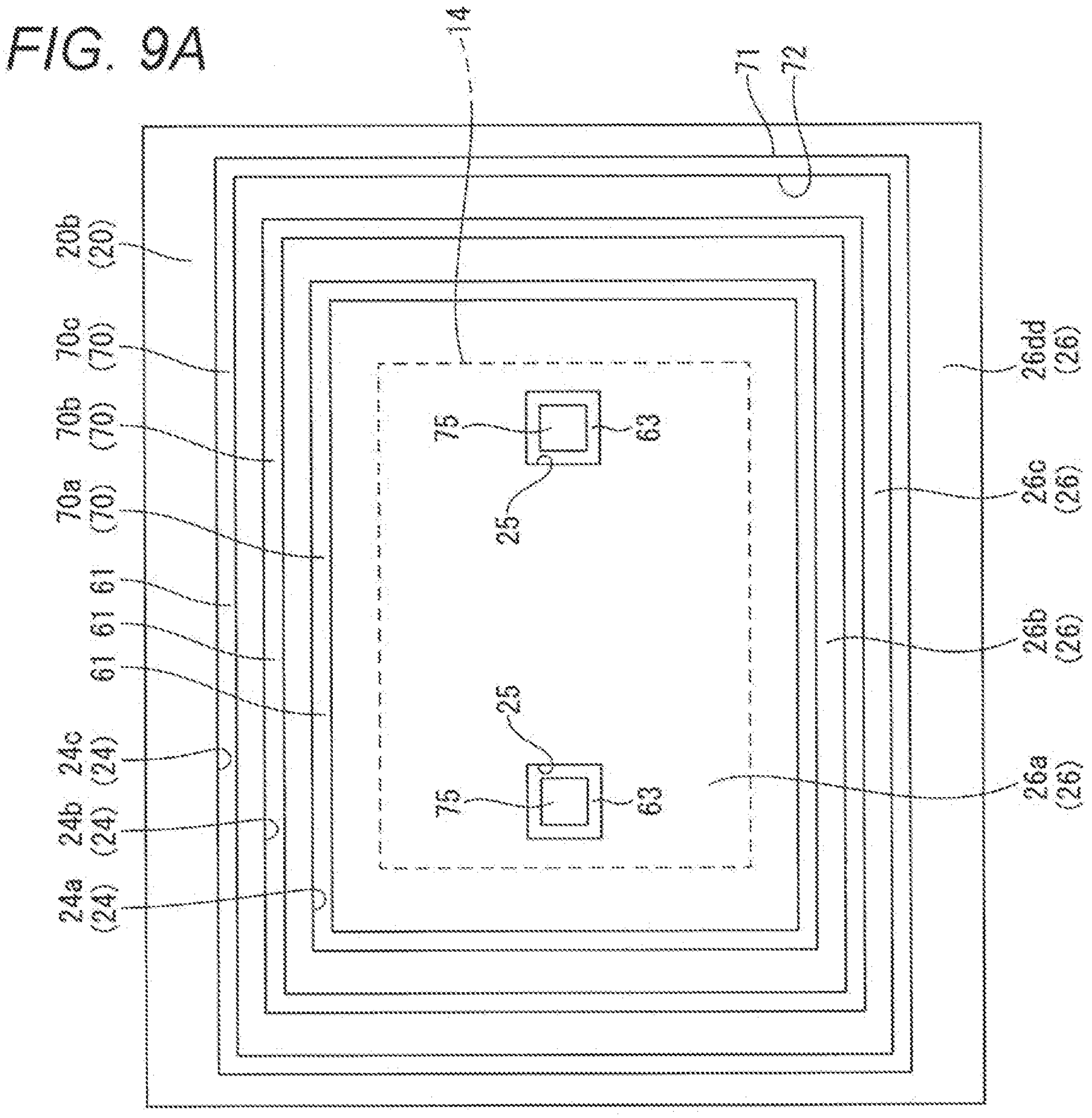
FIG. 9A is a plan view illustrating a positional relationship among three insulating rings, the plug, and the electrode pad according to the first embodiment of the present technology.
Figure 9B:
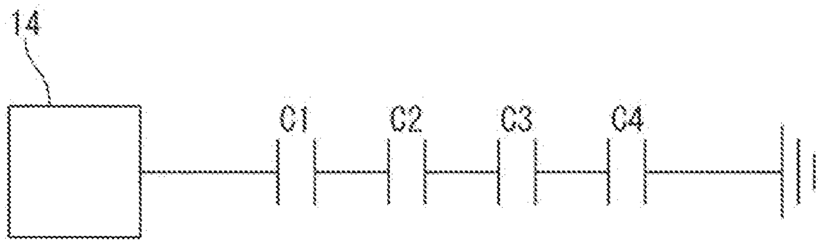
FIG. 9B is a schematic diagram illustrating a configuration of a capacitor in a case where three insulating rings are provided in the photodetection device according to the first embodiment of the present technology.

In the case where the one insulating ring 70 is provided, a state where two capacitors C1 and C2 illustrated in FIG. 8B are connected in series is formed. In the case where the two insulating rings 70 are provided, the state where the three capacitors C1, C2, and C3 illustrated in FIG. 6C are connected in series is formed as already described above. Then, in the case where the three insulating rings 70 are provided, a state where four capacitors C1, C2, C3, and C4 illustrated in FIG. 9B are connected in series is formed. A parasitic capacitance accumulated in the electrode pad 14 is a combined capacitance C of the plurality of capacitors. Here, the capacitor C4 includes the region 26*c*, a second insulating ring 70*c*, and a region 26*dd*.

Figure 10:
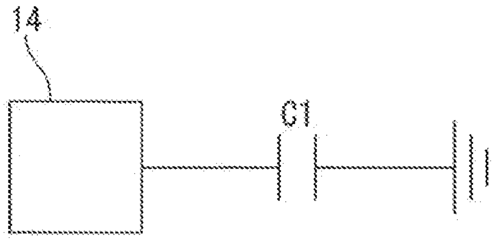
FIG. 10 is a schematic diagram illustrating a configuration of a capacitor in a case where no insulating ring is provided.
Figure 11:
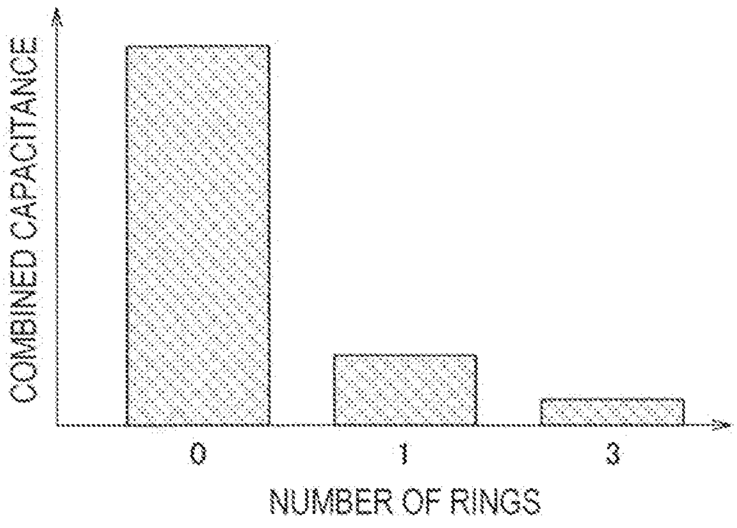
FIG. 11 is a graph illustrating a relationship between the number of insulating rings and a calculation result of a combined capacitance.

In a conventional photodetection device, the insulating ring 70 is not provided, that is, the number of insulating rings is zero. As illustrated in FIG. 10, in a case where the insulating ring 70 is not provided, the combined capacitance C of a capacitor is C1. On the other hand, the combined capacitance C of the capacitors in the case where the one insulating ring 70 is provided is $C1 \times C2/(C1+C2)$, the combined capacitance C of the capacitors in the case where the two insulating rings are provided is $C1 \times C2 \times C3/(C1+C2+C3)$, and the combined capacitance C of the capacitors in the case where the three insulating rings are provided is $C1 \times C2 \times C3 \times C4/(C1+C2+C3+C4)$. When the capacitors are connected in series, the combined capacitance decreases as the number of series connections increases. FIG. 11 is a view illustrating a calculation result of the combined capacitance. As illustrated in FIG. 11, in the case where the number of the insulating rings 70 is one, the combined capacitance is about $1/7$ of that in the case where the number is zero. Furthermore, in the case where the number of the insulating rings 70 is three, the combined capacitance is $1/2$ of that in the case where the number is one. Then, FIG. 11 does not illustrate the combined capacitance in the case where the number of the insulating rings 70 is two, but it is considered that a value thereof is a value between the combined capacitance in the case where the number is one and the combined capacitance in the case where the number is three.

The insulating ring 70 penetrates the first semiconductor layer 20 in the thickness direction. Therefore, the region 26 located on the inner side of the insulating ring 70 is in an electrically floating state, and accumulation of charges can be suppressed.

In this manner, when the insulating ring 70 is provided utilizing the space around the electrode pad 14, it is possible to suppress an increase in the parasitic capacitance accumulated in the electrode pad 14. Moreover, the increase in the parasitic capacitance accumulated in the electrode pad 14 can be further suppressed by increasing the number of the insulating rings 70. Therefore, a wiring delay and an RC delay can be suppressed, and lowering of a signal speed can be suppressed.

Furthermore, since the increase in the parasitic capacitance accumulated in the electrode pad 14 can be suppressed in the photodetection device 1 according to the first embodiment of the present technology, a disadvantage in moving and providing the electrode pad 14 to the first semiconductor layer 20 side in the thickness direction is minor. Therefore, for example, it is possible to determine without hesitation to move and provide the electrode pad 14, which has been conventionally provided in the second wiring layer 40, to the first semiconductor layer 20 side. Furthermore, the degree of freedom in layout of the electrode pad 14 increases.

Figure 12:
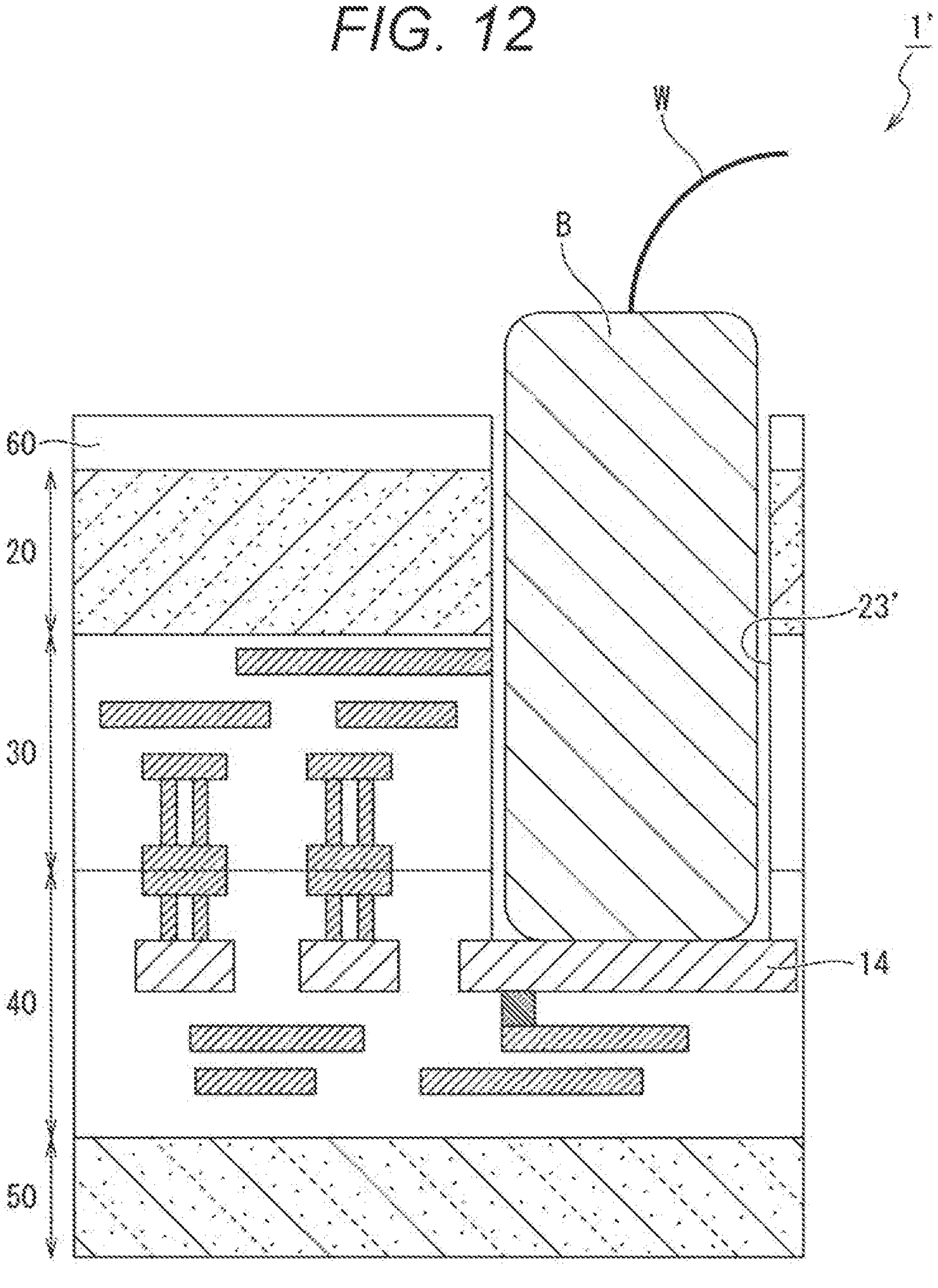
FIG. 12 is a view illustrating a conventional photodetection device.

In an example of a conventional photodetection device 1', an electrode pad 14 is provided on a second wiring layer 40 as illustrated in FIG. 12. Therefore, a recess 23' is provided deep in the thickness direction, and the electrode pad 14 is provided at a bottom of the recess 23'. Therefore, it is necessary to increase the volumes of a ball B and the electrode pad 14 in order to place the ball B at a deep position and provide a wire W at an end of the ball B.

On the other hand, the electrode pad 14 can be moved and provided to the first semiconductor layer 20 side since the increase in the combined capacitance C between the first semiconductor layer 20 and the electrode pad 14 can be suppressed by the insulating ring 70 in the photodetection device 1 according to the first embodiment of the present technology. Then, wire bonding can be easily performed since the electrode pad 14 is moved and provided to the first semiconductor layer 20 side. Moreover, a ball size of the wire bonding can be reduced, and dimensions of the electrode pad 14 and the semiconductor chip 2 on which the photodetection device 1 is mounted can be further reduced. Moreover, the reliability of the wire bonding is also improved, and the semiconductor chip 2 is made small, so that a yield of chips taken from a wafer increases, which can also contribute to cost reduction.

Furthermore, the electrode pad 14, the first connection pad 33, and the second connection pad 43 overlap each other in the thickness direction. Therefore, a conductive path from the electrode pad 14 to the metal layer 42 of the second wiring layer 40 can be made shorter than that in a case where the conductive path is formed with a trench portion 83 which will be described in FIGS. 14 and 15. Therefore, even such a configuration can suppress the increase in the parasitic capacitance accumulated in the electrode pad 14.

Note that the number of second insulating rings surrounding the first insulating ring 70*a* in the plan view is one or two in the first embodiment, but is not limited thereto, and may be three or more. That is, the insulating ring 70 may include the first insulating ring 70*a* and at least one second insulating ring surrounding the first insulating ring 70*a* in the plan view.

Furthermore, the number of the plugs 75 provided for each of the electrode pads 14 is two, but is not limited thereto, and may be one. Moreover, three or more plugs 75 may be provided for one electrode pad 14. The number of the holes 25 provided for each of the electrode pads 14 is two, but is not limited thereto, and one or three or more holes 25 may be provided in accordance with the number of plugs 75.

Modification 1 of First Embodiment

Figure 13:
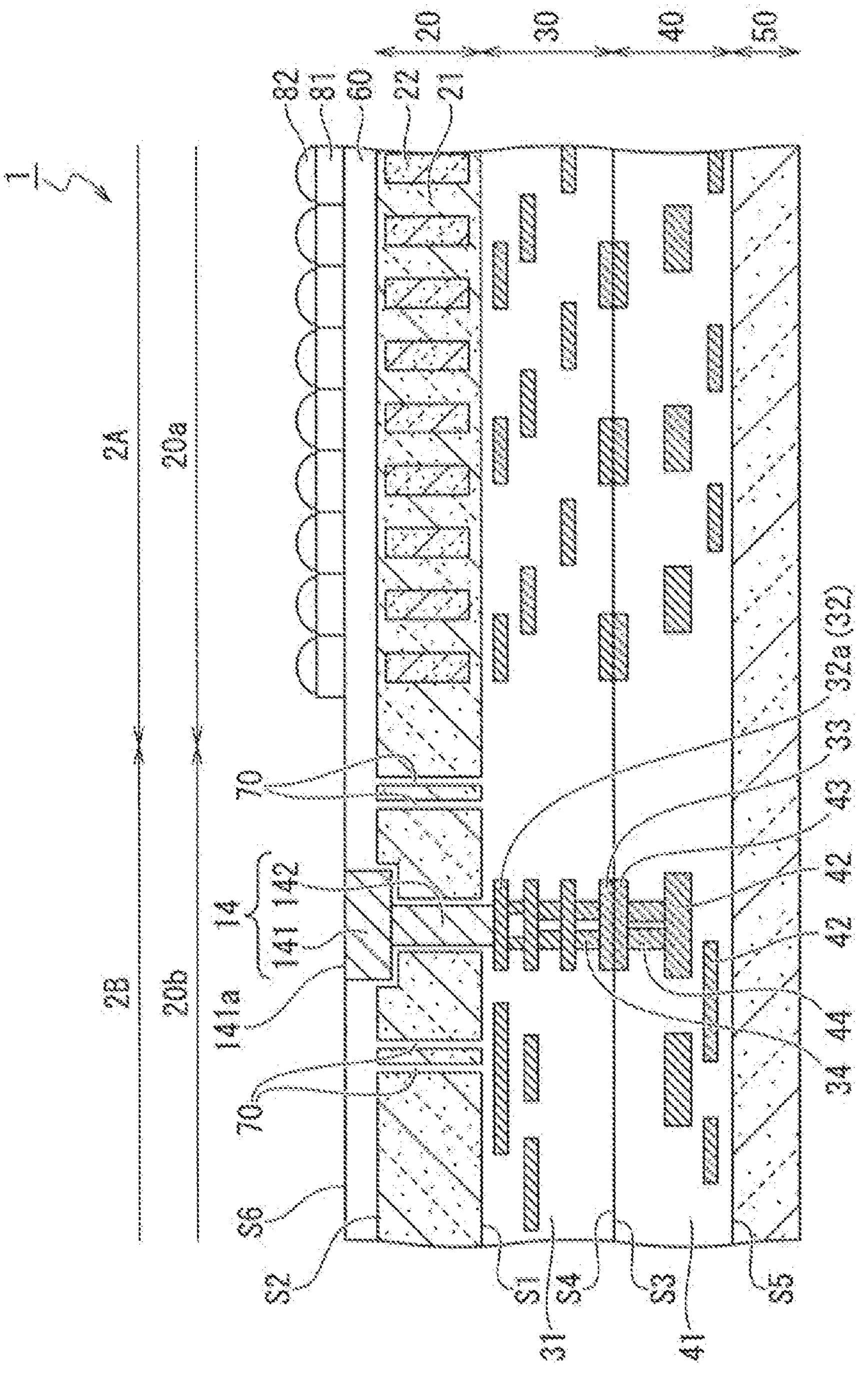
FIG. 13 is a longitudinal cross-sectional view illustrating a relative relationship between an electrode pad and a pixel region of a photodetection device according to Modification 1 of the first embodiment of the present technology when viewed in a cross section taken along line A-A of FIG. 1.

Modification 1 of the first embodiment of the present technology illustrated in FIG. 13 will be described below. The photodetection device 1 according to Modification 1 of the first embodiment is different from the photodetection device 1 according to the first embodiment described above in a shape of the electrode pad 14, and the other configurations of the photodetection device 1 are basically similar to those of the photodetection device 1 according to the first embodiment described above. Note that the components already described will be denoted by the same reference signs, and the description thereof will be omitted.

The electrode pad 14 has a head portion 141 and a body portion 142 integrally formed with the head portion 141. An upper surface 141*a* of the head portion 141 is an exposed surface exposed to the outside. The body portion 142 is connected to the metal layer 32*a*.

Main Effects of Modification 1 of First Embodiment

Effects similar to those of the photodetection device 1 according to the first embodiment described above can be obtained with the photodetection device 1 according to Modification 1 of the first embodiment as well.

Modification 2 of First Embodiment

Figure 14:
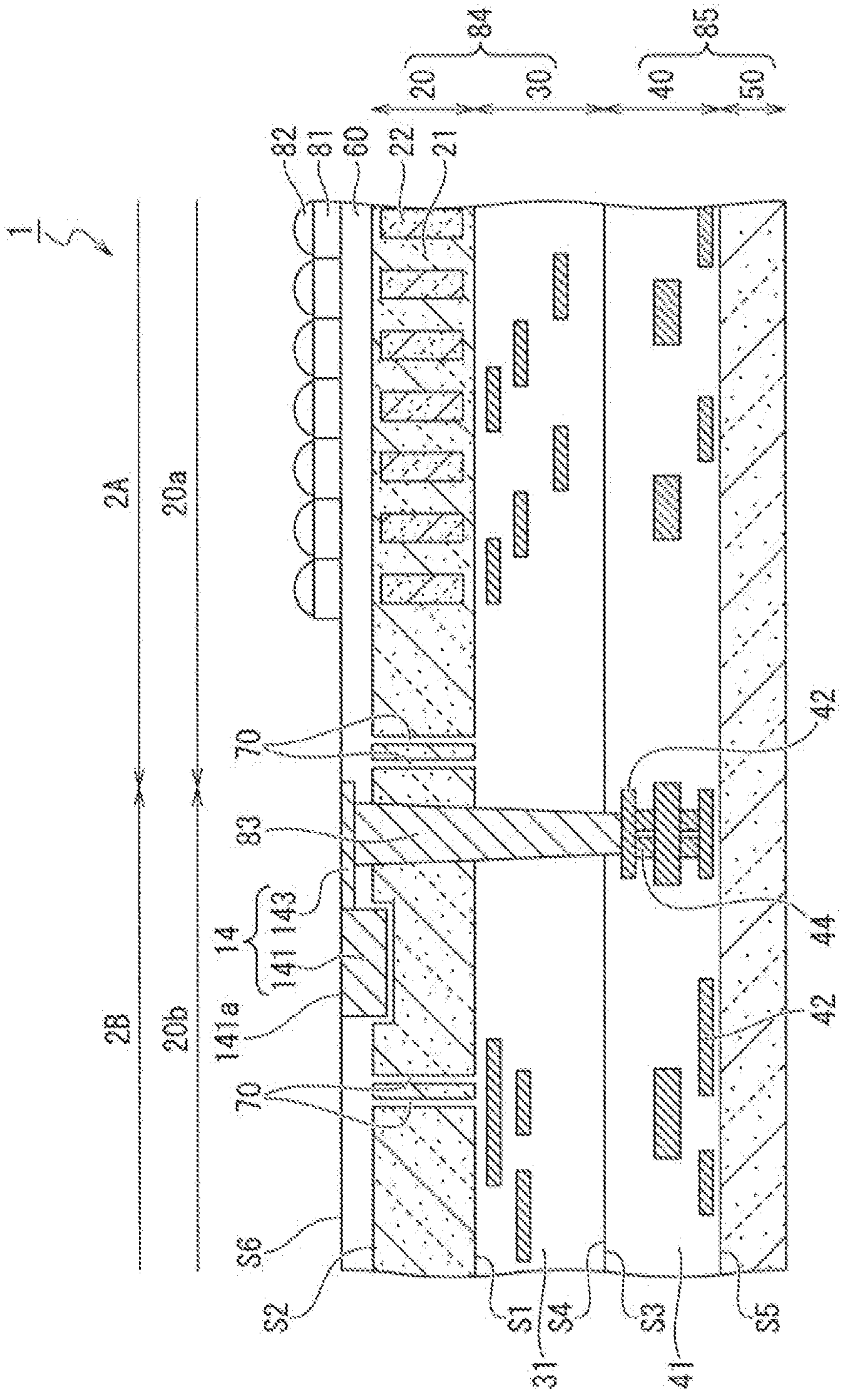
FIG. 14 is a longitudinal cross-sectional view illustrating a relative relationship between an electrode pad and a pixel region of a photodetection device according to Modification 2 of the first embodiment of the present technology when viewed in a cross section taken along line A-A of FIG. 1.

Modification 2 of the first embodiment of the present technology illustrated in FIG. 14 will be described below. The photodetection device 1 according to Modification 2 of the first embodiment is different from the photodetection device 1 according to the first embodiment described above in that a first substrate (the first semiconductor layer 20 and the first wiring layer 30) 84 and a second substrate (the second semiconductor layer 50 and the second wiring layer 40) 85 are electrically connected via the trench portion 83, and the other configurations of the photodetection device 1 are basically similar to those of the photodetection device 1 according to the first embodiment described above. Note that the components already described will be denoted by the same reference signs, and the description thereof will be omitted.

The photodetection device 1 includes the trench portion 83 instead of the plug 75. The trench portion 83 extends from the insulating layer 60 laminated on the first semiconductor layer 20 to the metal layer 42 of the second wiring layer 40, and has one end being located at a deep position in an extending direction and connected to the metal layer 42. The electrode pad 14 has the head portion 141 and a connection portion 143. An upper surface 141*a* of the head portion 141 is an exposed surface exposed to the outside. The connection portion 143 electrically connects the head portion 141 and the trench portion 83.

Main Effects of Modification 2 of First Embodiment

Effects similar to those of the photodetection device 1 according to the first embodiment described above can be obtained with the photodetection device 1 according to Modification 2 of the first embodiment as well.

Note that the electrode pad 14 does not necessarily have the connection portion 143. In this case, a configuration in which the head portion 141 and the trench portion 83 are directly connected is adopted.

Modification 3 of First Embodiment

Figure 15:
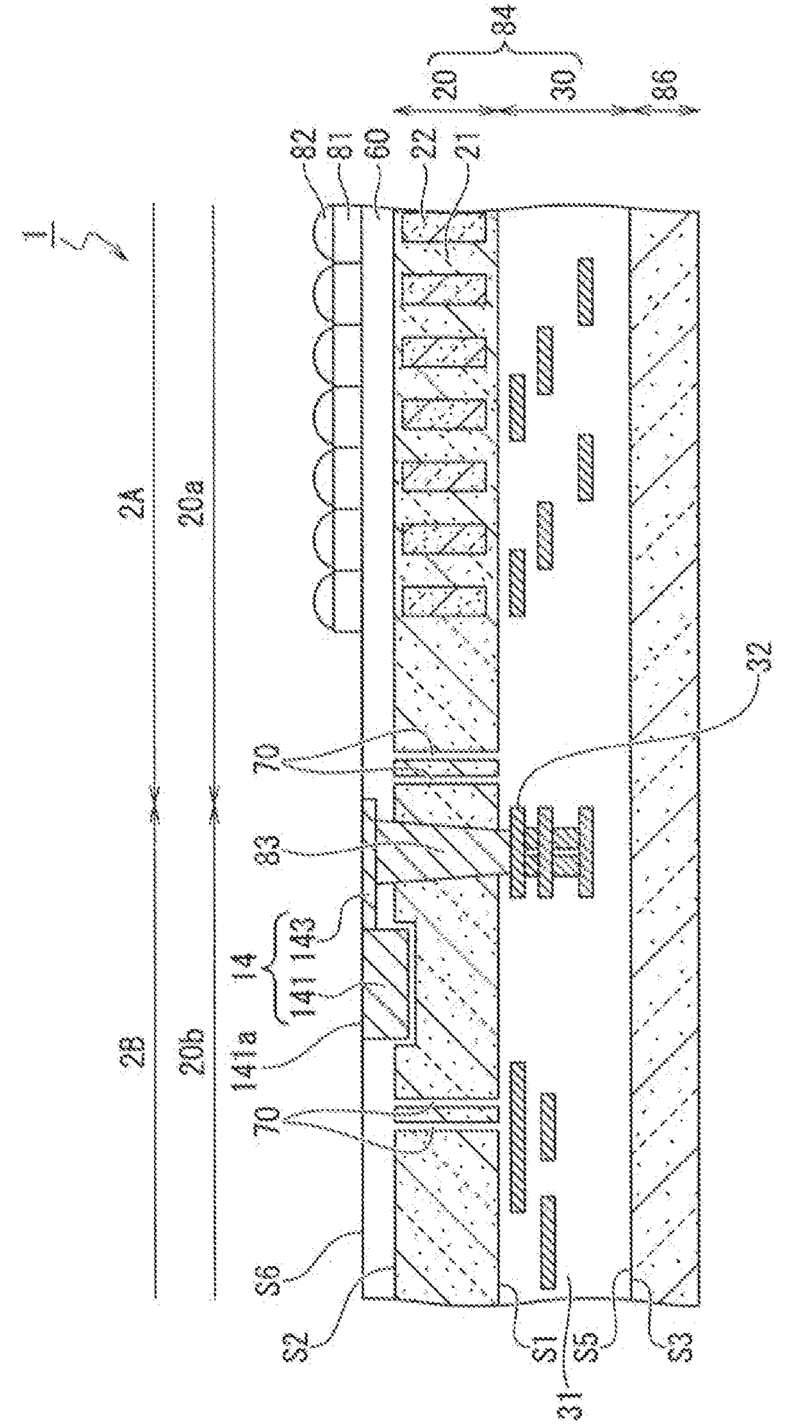
FIG. 15 is a longitudinal cross-sectional view illustrating a relative relationship between an electrode pad and a pixel region of a photodetection device according to Modification 3 of the first embodiment of the present technology when viewed in a cross section taken along line A-A of FIG. 1.

Modification 3 of the first embodiment of the present technology illustrated in FIG. 15 will be described below. The photodetection device 1 according to Modification 3 of the first embodiment is different from the photodetection devices 1 according to the first embodiment and Modification 2 of the first embodiment described above in that only the first substrate 84 out of the first substrate 84 and the second substrate 85 described above is provided and the first semiconductor layer 20 and the metal layer 32 are electrically connected via the trench portion 83, and the other configurations of the photodetection device 1 are basically similar to those of the photodetection devices 1 according to the first embodiment and Modification 2 of the first embodiment described above. Note that the components already described will be denoted by the same reference signs, and the description thereof will be omitted.

The photodetection device 1 includes the trench portion 83 instead of the plug 75. Furthermore, the photodetection device 1 includes the first substrate 84 and a support substrate 86. The trench portion 83 extends from the insulating layer 60 laminated on the first semiconductor layer 20 to the metal layer 32 of the first wiring layer 30, and has one end being located at a deep position in an extending direction and connected to the metal layer 32. The connection portion 143 electrically connects the head portion 141 and the trench portion 83.

Main Effects of Modification 3 of First Embodiment

Effects similar to those of the photodetection devices 1 according to the first embodiment and Modification 2 of the first embodiment described above can be obtained with the photodetection device 1 according to Modification 3 of the first embodiment as well.

Note that the electrode pad 14 does not necessarily have the connection portion 143. In this case, a configuration in which the head portion 141 and the trench portion 83 are directly connected is adopted.

Modification 4 of First Embodiment

Figure 16:
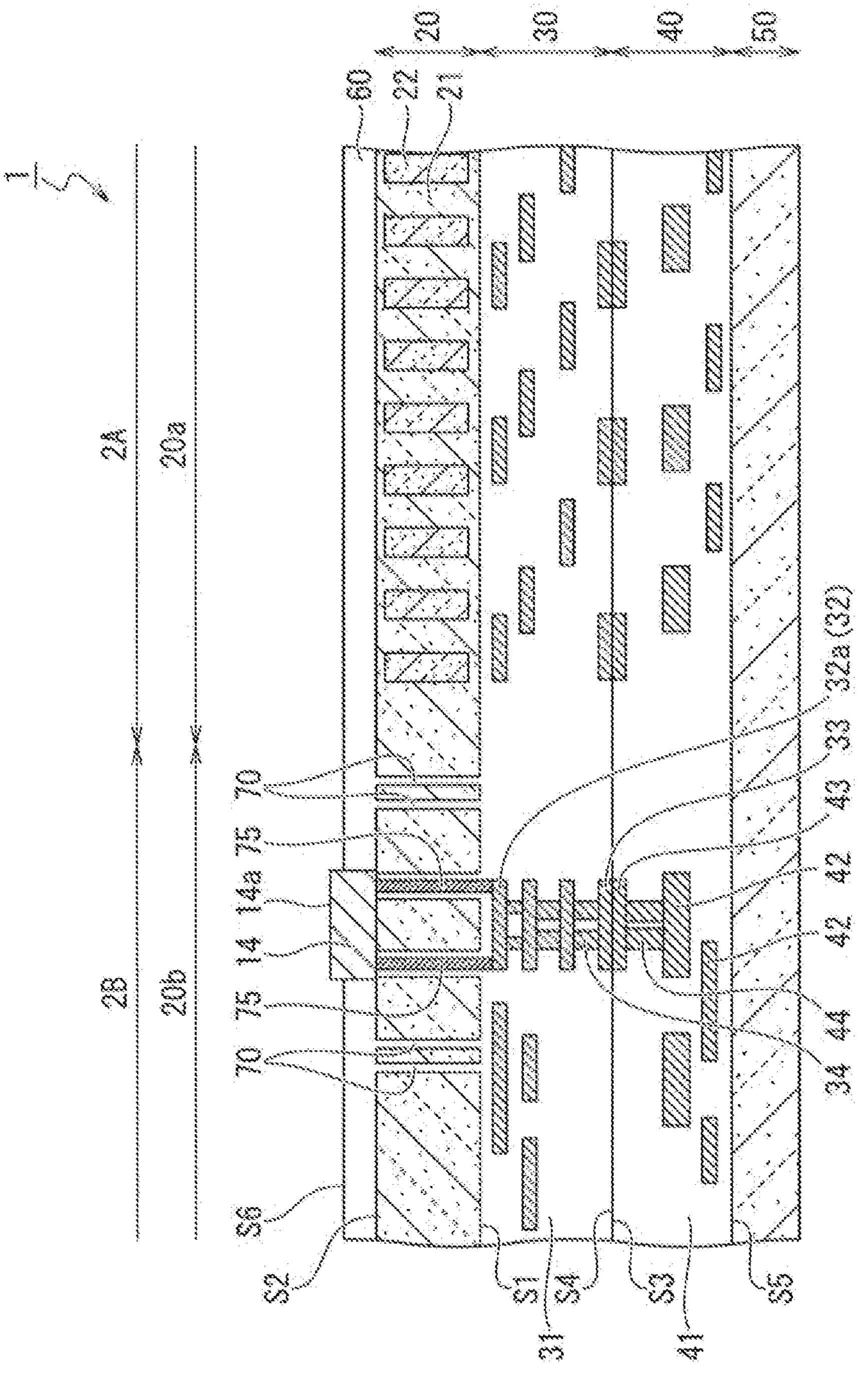
FIG. 16 is a longitudinal cross-sectional view illustrating a relative relationship between an electrode pad and a pixel region of a photodetection device according to Modification 4 of the first embodiment of the present technology when viewed in a cross section taken along line A-A of FIG. 1.

Modification 4 of the first embodiment of the present technology illustrated in FIG. 16 will be described below. The photodetection device 1 according to 4 of the first embodiment is different from the photodetection device 1 according to the first embodiment described above in that the electrode pad 14 protrudes from the surface S6, and the other configurations of the photodetection device 1 are basically similar to those of the first embodiment described above. Note that the components already described will be denoted by the same reference signs, and the description thereof will be omitted.

The electrode pad 14 is laminated on the second surface S2 of the first semiconductor layer 20. Then, the electrode pad 14 protrudes from the surface S6. For example, the color filter 81 and the on-chip lens 82 are provided by coating the surface S6 with resin or the like, and thus, such a coating surface is preferably flat. Therefore, the electrode pad 14 is provided such that the upper surface 14*a* of the electrode pad 14 is located on the same plane with the surface S6 in the first embodiment.

On the other hand, for example, in a photodetection device that does not require the color filter 81 and the on-chip lens 82, such as a black-and-white sensor, the coating performance of resin is not affected even if the electrode pad 14 protrudes from the surface S6.

Main Effects of Modification 4 of First Embodiment

Effects similar to those of the photodetection device 1 according to the first embodiment described above can be obtained with the photodetection device 1 according to Modification 4 of the first embodiment as well.

Modification 5 of First Embodiment

Figure 17:
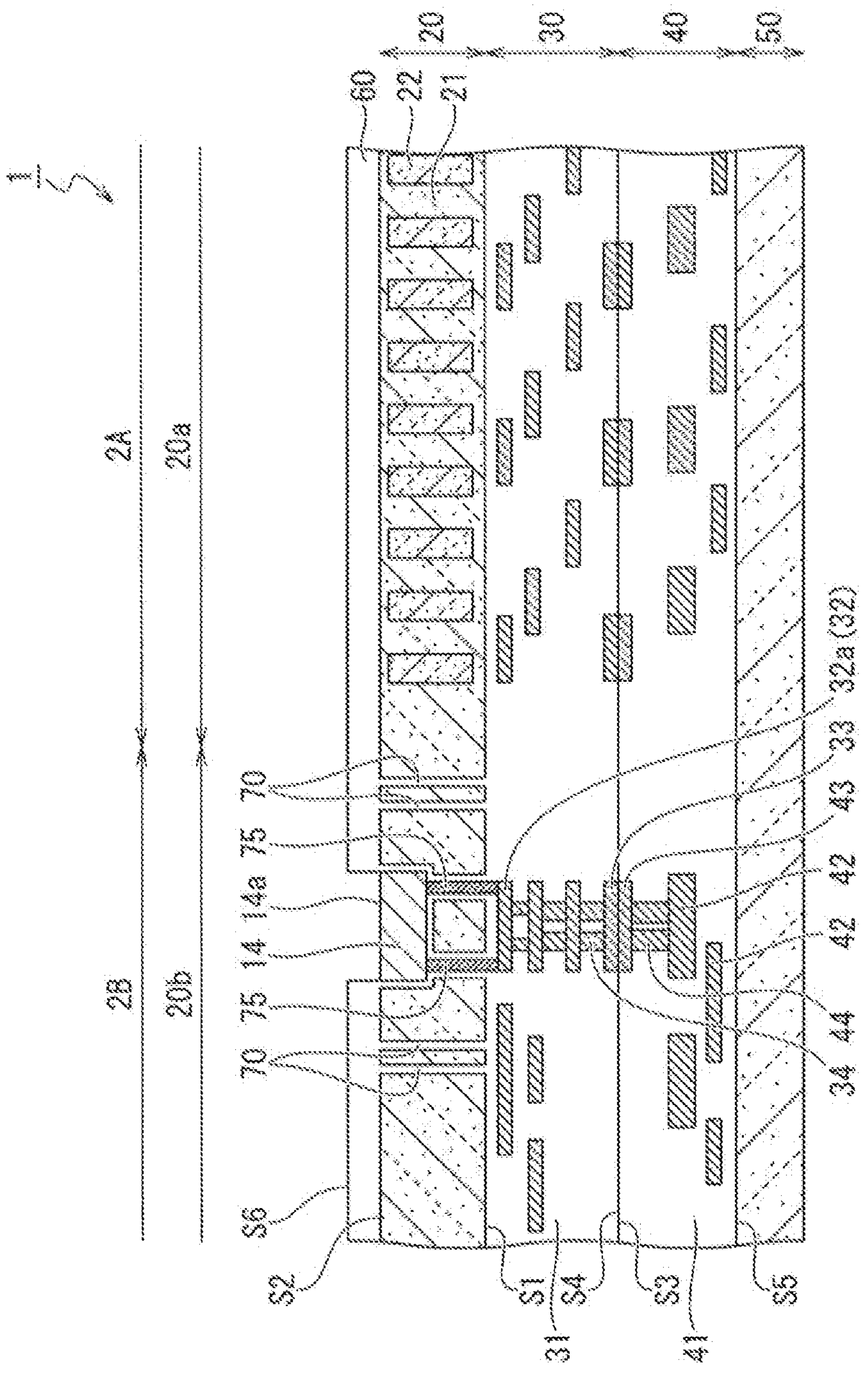
FIG. 17 is a longitudinal cross-sectional view illustrating a relative relationship between an electrode pad and a pixel region of a photodetection device according to Modification 5 of the first embodiment of the present technology when viewed in a cross section taken along line A-A of FIG. 1.

Modification 5 of the first embodiment of the present technology illustrated in FIG. 17 will be described below. The photodetection device 1 according to Modification 5 of the first embodiment is different from that of the first embodiment described above in that the electrode pad 14 is provided at a position recessed from the surface S6, and the other configurations of the photodetection device 1 are basically similar to those of the first embodiment described above. Note that the components already described will be denoted by the same reference signs, and the description thereof will be omitted.

The electrode pad 14 is buried in the first semiconductor layer 20. Then, the upper surface 14*a* of the electrode pad 14 is located on the same plane with the second surface S2. Therefore, a portion of the insulating layer 60 overlapping the electrode pad 14 in a plan view is removed.

For example, in a photodetection device that does not require the color filter 81 and the on-chip lens 82, such as a black-and-white sensor, the coating performance of resin is not affected even if the electrode pad 14 is provided at the position recessed from the surface S6.

Main Effects of Modification 5 of First Embodiment

Effects similar to those of the photodetection device 1 according to the first embodiment described above can be obtained with the photodetection device 1 according to Modification 5 of the first embodiment as well.

Modification 6 of First Embodiment

Figure 18:
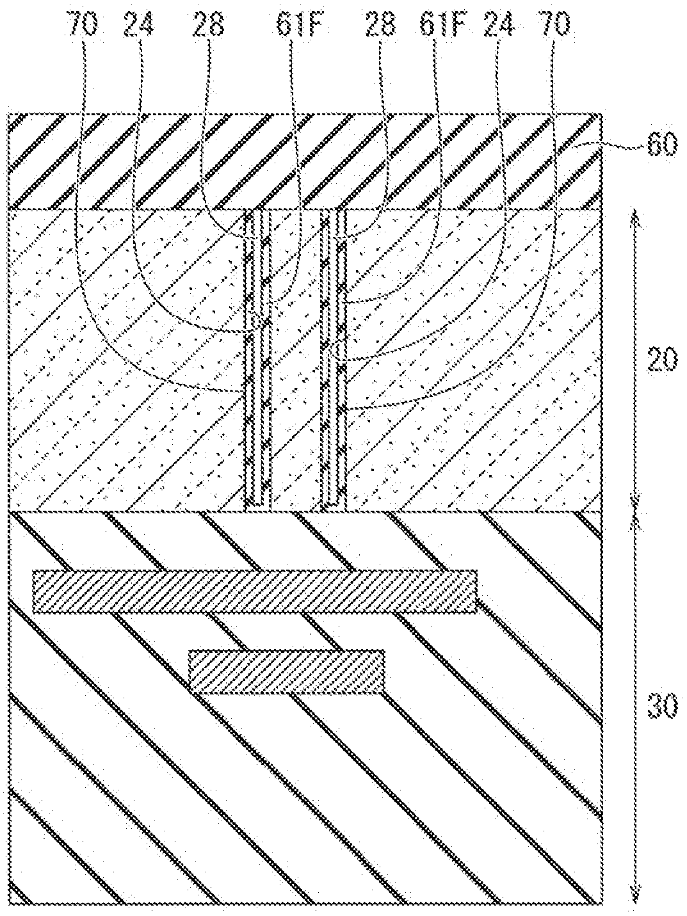
FIG. 18 is a longitudinal cross-sectional view illustrating an insulating ring of a photodetection device according to Modification 6 of the first embodiment of the present technology.

Modification 6 of the first embodiment of the present technology illustrated in FIG. 18 will be described below. The photodetection device 1 according to Modification 6 of the first embodiment is different from the photodetection device 1 according to the first embodiment described above in that the insulating ring 70 includes an insulating layer 61F and a gap 28, and the other configurations of the photodetection device 1 are basically similar to those of the first embodiment described above. Note that the components already described will be denoted by the same reference signs, and the description thereof will be omitted.

As illustrated, the groove 24 is not completely filled with the insulating layer 60, and includes the gap 28. That is, the insulating ring 70 includes both the insulating layer 61F and the gap 28. The gap 28 functions as an insulating layer, and thus, can function as a part of the insulating ring 70.

Main Effects of Modification 6 of First Embodiment

Effects similar to those of the photodetection device 1 according to the first embodiment described above can be obtained with the photodetection device 1 according to Modification 6 of the first embodiment as well.

Modification 7 of First Embodiment

Figure 19:
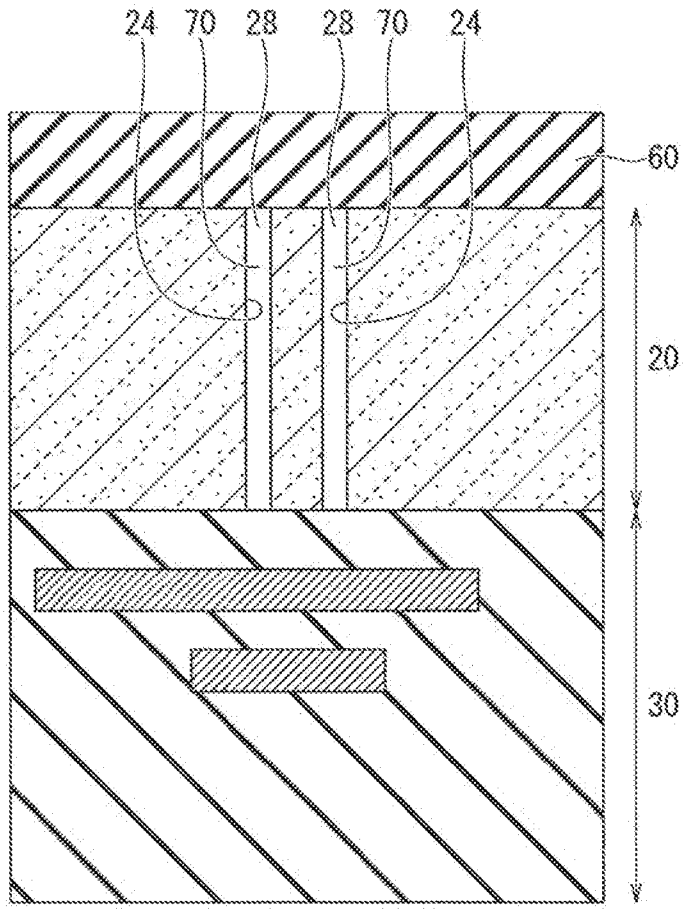
FIG. 19 is a longitudinal cross-sectional view illustrating an insulating ring of a photodetection device according to Modification 7 of the first embodiment of the present technology.

Modification 7 of the first embodiment of the present technology illustrated in FIG. 19 will be described below. The photodetection device 1 according to Modification 7 of the first embodiment is different from the photodetection device 1 according to the first embodiment described above in that the insulating ring 70 includes the gap 28, and the other configurations of the photodetection device 1 are basically similar to those of the first embodiment described above. Note that the components already described will be denoted by the same reference signs, and the description thereof will be omitted.

As illustrated, the inside of the groove 24 is not filled with the insulating layer 60 and forms the gap 28. That is, the insulating ring 70 includes the gap 28. The gap 28 functions as an insulating layer, and thus, can function as the insulating ring 70.

Main Effects of Modification 7 of First Embodiment

Effects similar to those of the photodetection device 1 according to the first embodiment described above can be obtained with the photodetection device 1 according to Modification 7 of the first embodiment as well.

Second Embodiment

A second embodiment of the present technology illustrated in FIGS. 20, 21A, and 21B will be described below. The photodetection device 1 according to the second embodiment is different from the photodetection device 1 according to the first embodiment described above in that a plug ring 76 having a ring shape is provided instead of the plug 75 having a columnar shape, and a groove 27 having a ring shape is provided in the first semiconductor layer 20, instead of the hole 25, and the other configurations of the photodetection device 1 are basically similar to those of the photodetection device 1 according to the first embodiment described above. Note that the components already described will be denoted by the same reference signs, and the description thereof will be omitted.

<Plug Ring>

Figure 20:
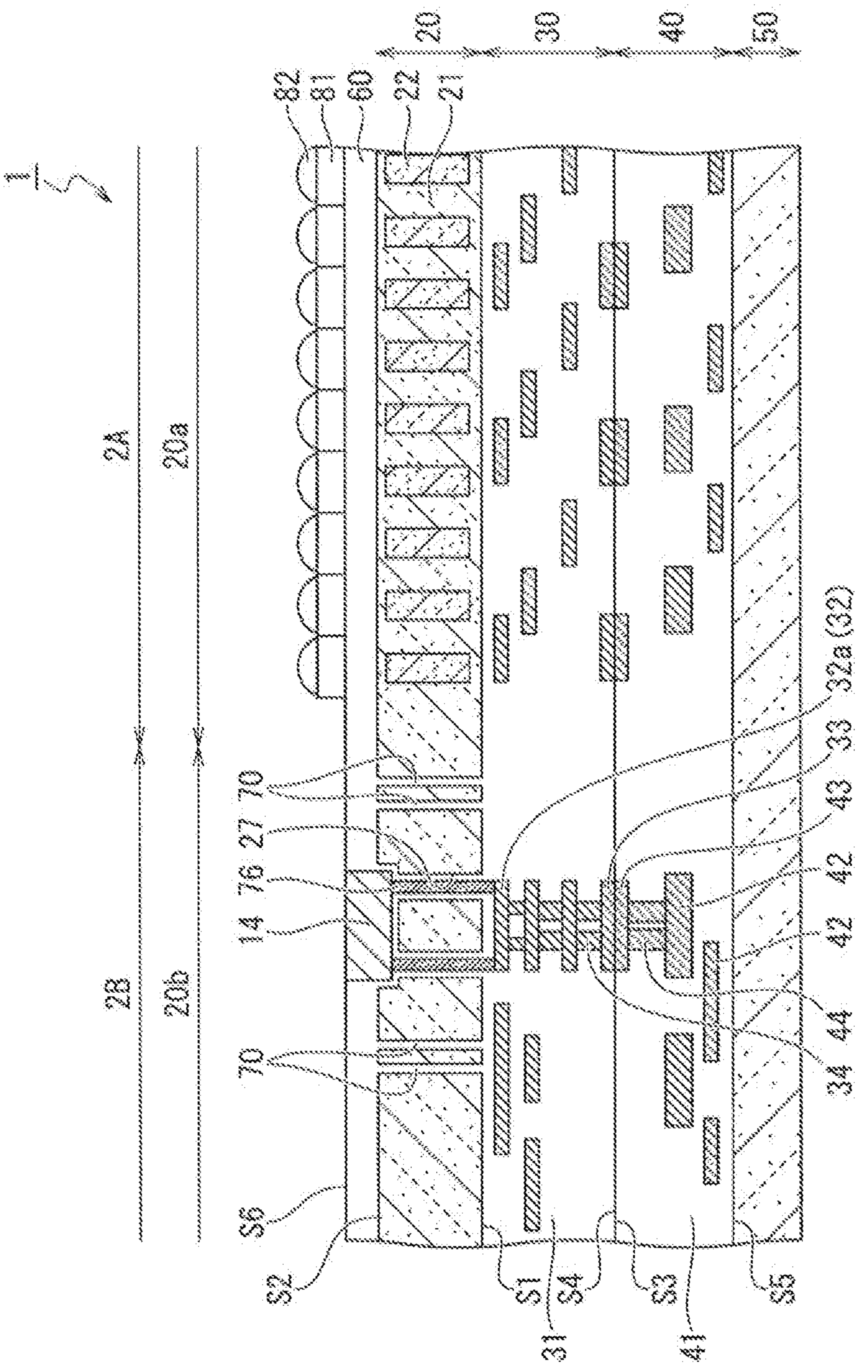
FIG. 20 is a longitudinal cross-sectional view illustrating a relative relationship between an electrode pad and a pixel region of a photodetection device according to a second embodiment of the present technology when viewed in a cross section taken along line A-A of FIG. 1.
Figure 21A:
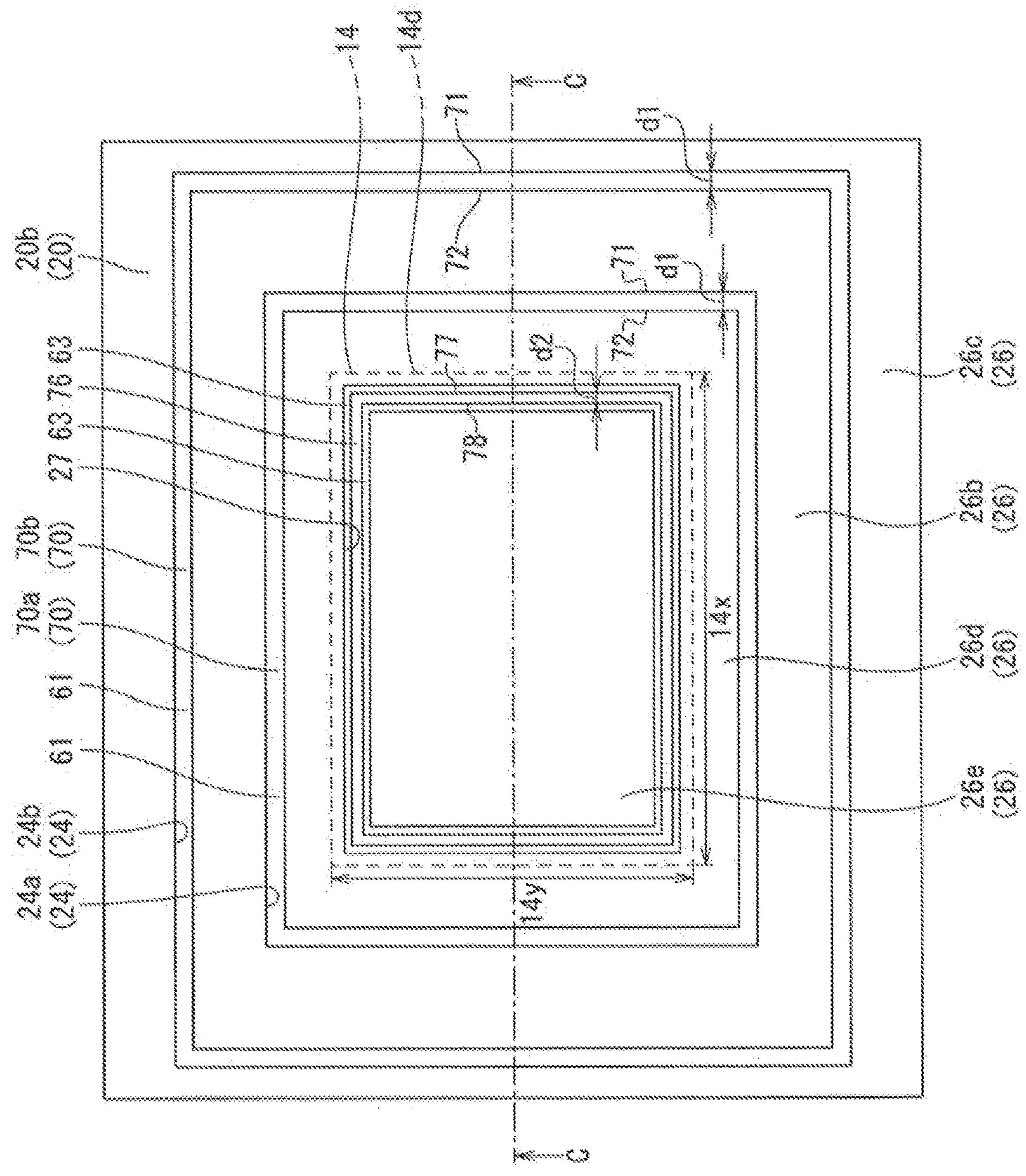
FIG. 21A is a plan view illustrating a positional relationship among an insulating ring, a plug ring, and the electrode pad according to the second embodiment of the present technology.
Figure 21B:
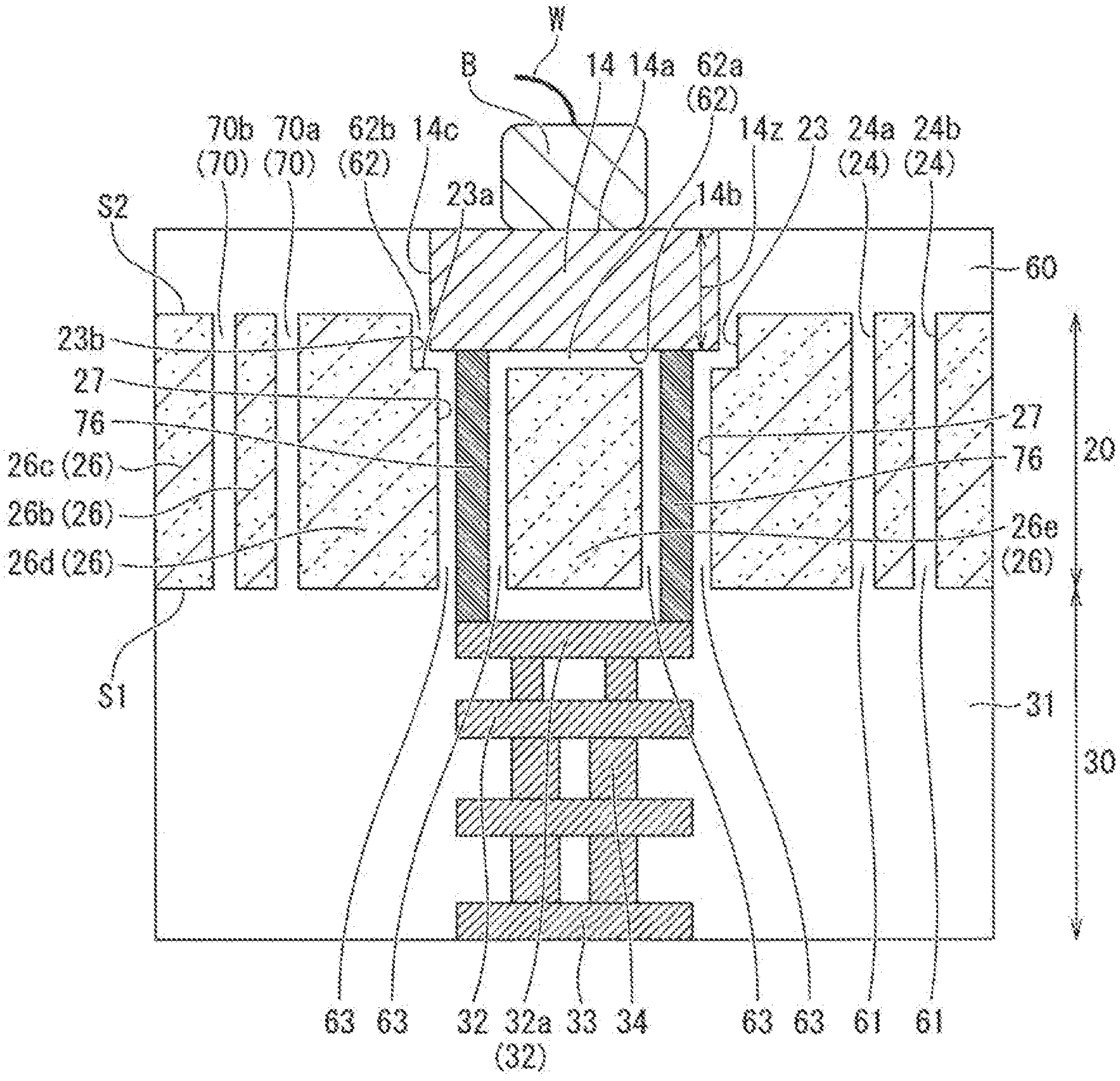
FIG. 21B is a longitudinal cross-sectional view illustrating the positional relationship among the insulating ring, the plug ring, and the electrode pad according to the second embodiment of the present technology when viewed in a cross section taken along line C-C of FIG. 21A.

FIGS. 20, 21A, and 21B illustrate an example in which one ring-shaped plug ring 76 is provided. Furthermore, as illustrated in FIG. 21B, the plug ring 76 has one end connected to the electrode pad 14 and the other end connected to the metal layer 32*a*, and electrically connects the electrode pad 14 and the metal layer 32*a*. Furthermore, the plug ring 76 is embedded in the groove 27 with the insulating layer 63 interposed therebetween. The plug ring 76 and the groove 27 penetrate the first semiconductor layer 20 in the thickness direction of the first semiconductor layer 20. Furthermore, as illustrated in FIG. 21A, the plug ring 76 has an annular shape in a plan view and is arranged on the inner side of a contour 14*d* of the electrode pad 14. The groove 27 has an annular shape in the plan view. The insulating layer 63 is interposed between the first semiconductor layer 20 and the plug ring 76. Here, it is desirable to leave several tens of nm or more of the insulating layer 63 between the first semiconductor layer 20 and the plug ring 76.

Since the plug ring 76 penetrates the first semiconductor layer 20 in the thickness direction of the first semiconductor layer 20, the first semiconductor layer 20 is divided into a plurality of regions. More specifically, the plug ring 76 divides the region 26*a* of the first semiconductor layer 20 in the first embodiment into a region 26*d* and a region 26*e*. The divided regions 26*d* and 26*e* are in an electrically floating state. Furthermore, the plug ring 76 is preferably provided on the outer peripheral side of the electrode pad 14 as much as possible. Therefore, the plug ring 76 is less likely to be damaged during wire bonding.

Figure 22A:
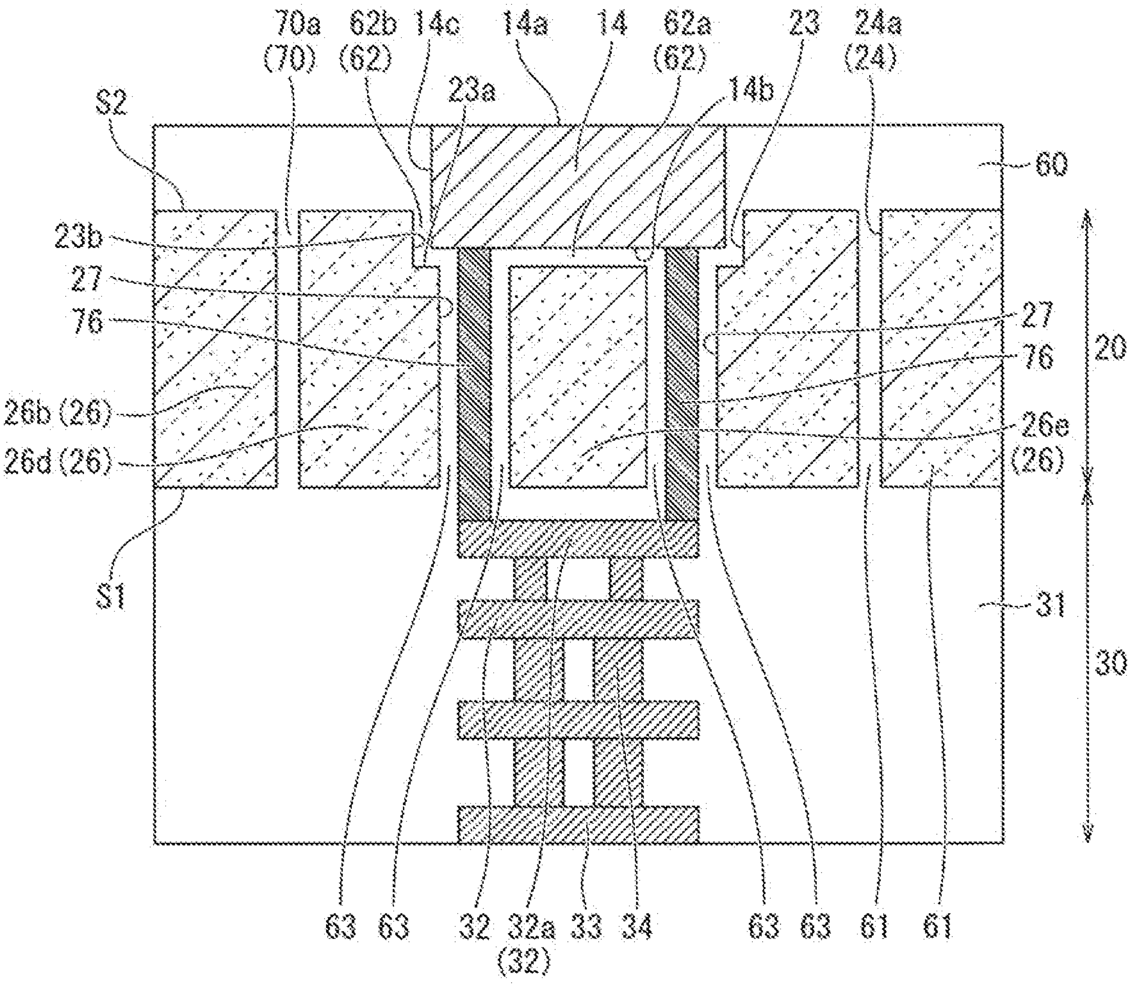
FIG. 22A is a longitudinal cross-sectional view illustrating a positional relationship among one insulating ring, one plug ring, and the electrode pad according to the second embodiment of the present technology.

Here, two insulating rings 70 are provided in FIGS. 20, 21A, and 21B, but a capacitor configuration will be considered regarding a case where one insulating ring 70 is provided as illustrated in FIG. 22A for the sake of simplicity.

Figure 22B:
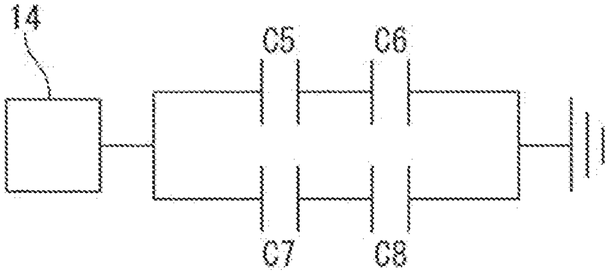
FIG. 22B is a schematic diagram illustrating a configuration of a capacitor in a case where one insulating ring is provided in the photodetection device according to the second embodiment of the present technology.

More specifically, the electrode pad 14, the insulating layer 62 (mainly the insulating layer 62*b*), and the region 26*d* form a parasitic capacitance C5 illustrated in FIG. 22B, and the region 26*d*, the first insulating ring 70*a*, and the region 26*b* form a capacitor C6. The capacitors C5 and C6 connected in series are capacitances of side components accumulated mainly on the side surface 14*c* of the electrode pad 14.

Then, the electrode pad 14, the insulating layer 62 (mainly the insulating layer 62*a*), and the region 26*e* form a parasitic capacitance C7 in FIG. 22B. Moreover, the region 26*e* and the region 26*b* form a capacitor C8 through the interlayer insulating film 31 of the first wiring layer 30. The capacitors C7 and C8 connected in series are capacitances of lower surface components mainly accumulated on the lower surface 14*b* of the electrode pad 14. In this manner, the plug ring 76 separates a parasitic capacitance to the electrode pad 14 into the pad side surface components and the lower surface components.

Here, dimensions 14*x* and 14*y* of the electrode pad 14 illustrated in FIG. 21A in a plan view have a size, for example, on the order of 100 μm whereas a dimension 14*z* of the electrode pad 14 illustrated in FIG. 21B in a longitudinal cross-sectional view has a size, for example, on the order of several μm. That is, an area of the lower surface 14*b* of the electrode pad 14 is overwhelmingly larger than an area of the side surface 14*c*.

<<Method for Manufacturing Photodetection Device>>

Figure 23:
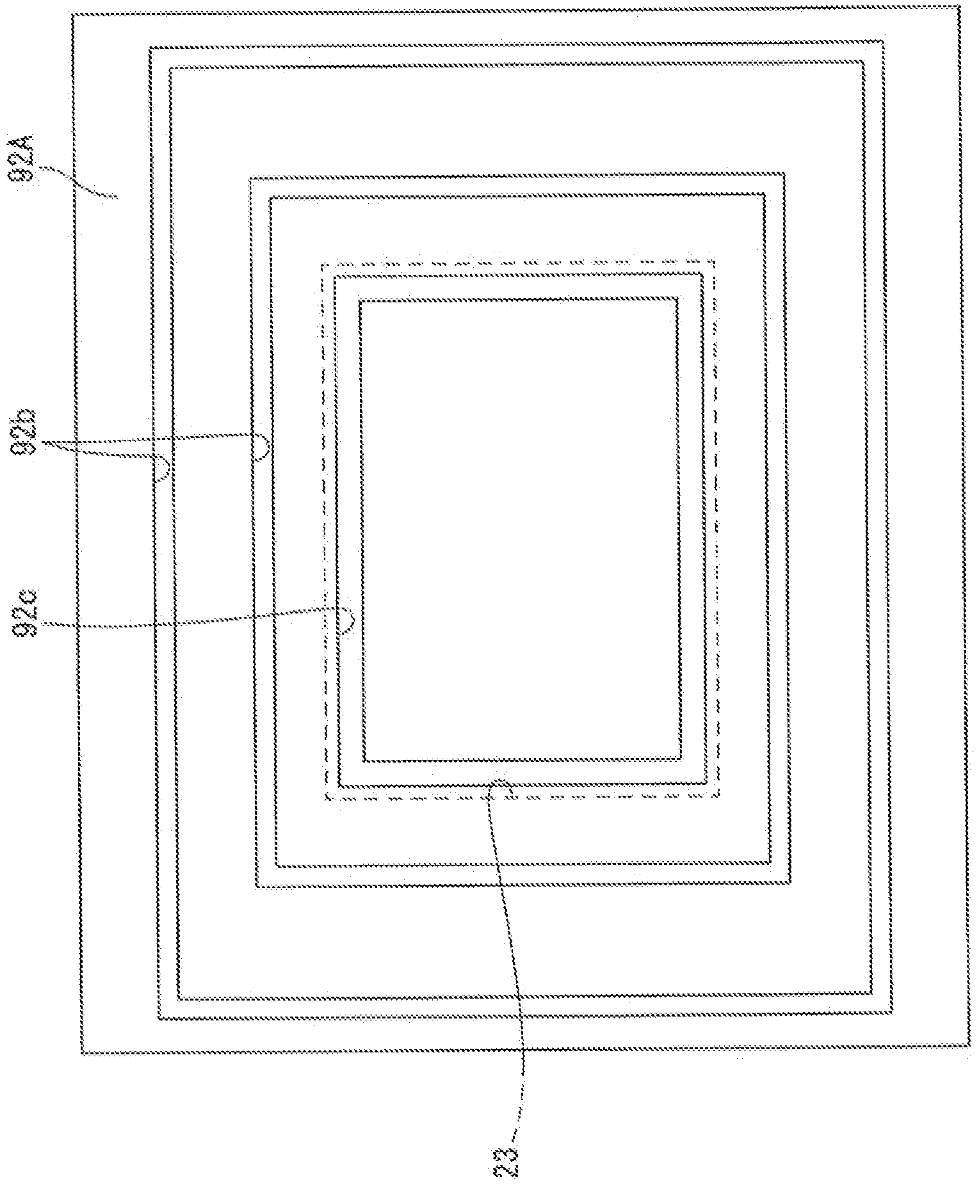
FIG. 23 is a plan view illustrating a resist pattern formed in a process of a method for manufacturing the photodetection device according to the second embodiment of the present technology.

Hereinafter, a method for manufacturing the photodetection device 1 will be described. Here, differences from the method for manufacturing the photodetection device 1 according to the first embodiment will be mainly described. First, processes illustrated in FIGS. 7A to 7D are performed. Then, in the process illustrated in FIG. 7E, a resist pattern 92A illustrated in FIG. 23 is laminated, instead of the resist pattern 92 illustrated in FIG. 7F. Then, an etching process illustrated in FIG. 7G is performed using the resist pattern 92A. More specifically, the first semiconductor layer 20 exposed from an opening 92*c* of the resist pattern 92A is etched to form the groove 27 penetrating the first semiconductor layer 20. Therefore, the ring-shaped groove 27 is formed in the first semiconductor layer 20. Moreover, the insulating layer 60A and the first semiconductor layer 20 exposed from an opening 92*b* of the resist pattern 92 are etched to form the groove 24 penetrating the first semiconductor layer 20. Thereafter, processes illustrated in FIGS. 7H to 7M are performed. Since the ring-shaped groove 27 has been formed by the etching process illustrated in FIG. 7G, the ring-shaped plug ring 76 can be formed.

Main Effects of Second Embodiment

Effects similar to those of the photodetection device 1 according to the first embodiment described above can be obtained with the photodetection device 1 according to the second embodiment as well.

Here, there may be a case where the number of the insulating rings 70 that can be provided for one electrode pad 14 is limited by an interval between the electrode pads 14. Conversely, there may be a case where it is necessary to widen the interval between the electrode pads 14 in order to increase the number of the insulating rings 70. In this manner, there may be a possibility that there is a trade-off between the number of the insulating rings 70 and the interval between the electrode pads 14, and a possibility that a case where chip shrinkage is limited.

Even in such a case, a region on the lower surface 14*b* side of the electrode pad 14 can be effectively used since the plug ring 76 is connected to the lower surface 14*b* of the electrode pad 14 in the photodetection device 1 according to the second embodiment of the present technology, and the number of capacitors for suppressing an increase in the parasitic capacitance can be increased regardless of the interval between the electrode pads 14.

Furthermore, in a case where the plug ring 76 is not provided as in the first embodiment, the parasitic capacitance C1 closer to the electrode pad 14 is dominant as a parasitic capacitance contributing to the electrode pad 14. Moreover, the area of the lower surface 14*b* is overwhelmingly larger than the area of the side surface 14*c* of the electrode pad 14. Therefore, out of the dominant parasitic capacitance C1, a parasitic capacitance contributing to the lower surface 14*b* is more dominant than a parasitic capacitance contributing to the side surface 14*c*.

In the photodetection device 1 according to the second embodiment of the present technology, the parasitic capacitance with respect to the electrode pad 14 can be separated into the side surface components and the lower surface components, and the capacitor can be provided on the lower surface 14*b* where the parasitic capacitance contributing to the electrode pad 14 is greater, so that the increase in the parasitic capacitance can be further suppressed.

Figure 24:
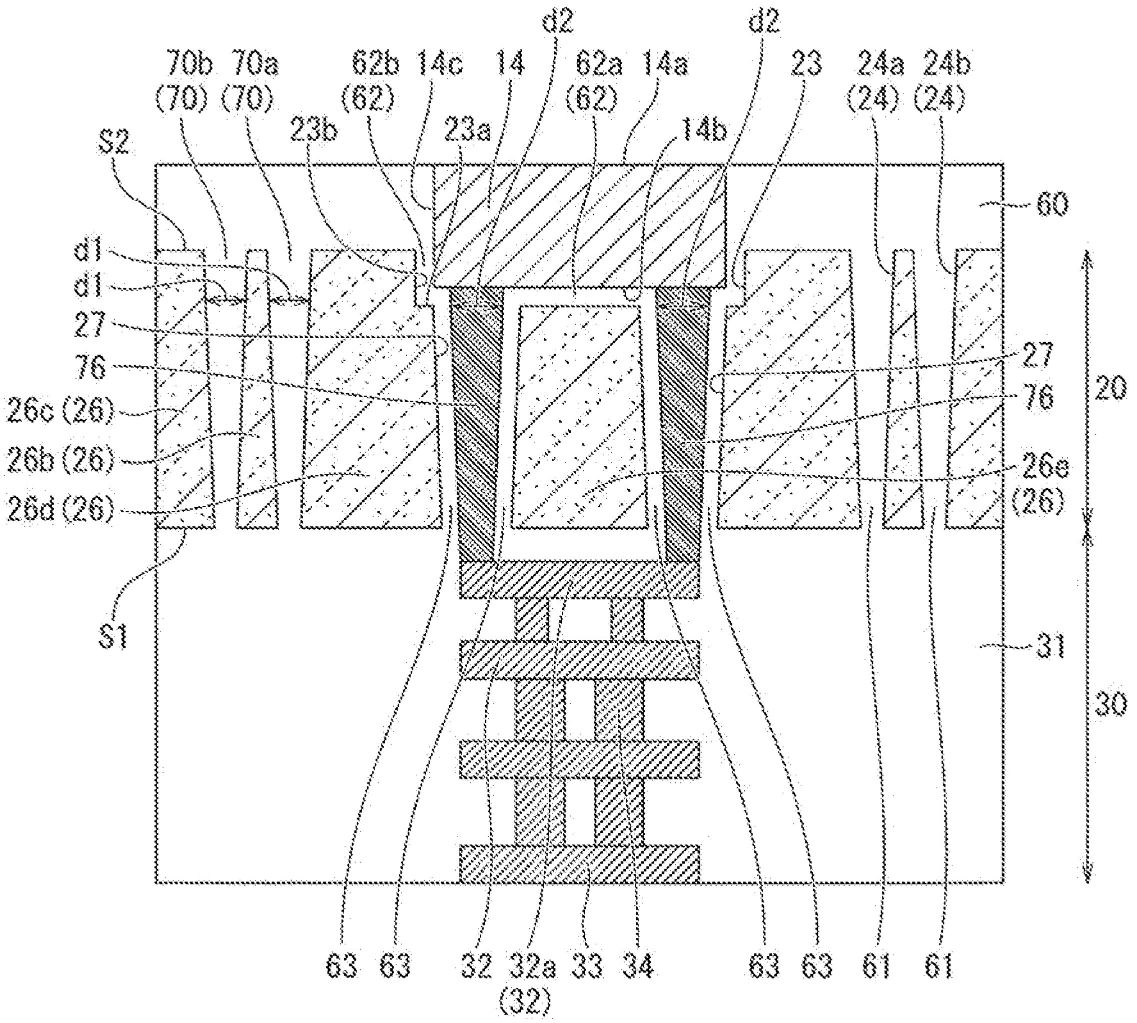
FIG. 24 is a longitudinal cross-sectional view illustrating cross-sectional shapes of an insulating ring, a plug ring, and an electrode pad according to another mode of the second embodiment of the present technology.

Note that the width d1 of the insulating ring 70 and a width d2 of the plug ring 76 illustrated in FIG. 21A are constant along the thickness direction of the first semiconductor layer 20 in the second embodiment, but may have a tapered shape in a longitudinal cross-sectional view without being limited thereto. For example, as illustrated in FIG. 24, the width d1 of the insulating ring 70 and the width d2 of the plug ring 76 may be thicker on a side close to the electrode pad 14 than on a side close to the metal layer 32*a* in the thickness direction of the first semiconductor layer 20. Here, as illustrated in FIG. 21A, the width d2 of the plug ring 76 is a width between an outer contour 77 and an inner contour 78 of the plug ring 76 in the plan view.

Modification 1 of Second Embodiment

Modification 1 of the second embodiment of the present technology illustrated in FIGS. 25A and 25B will be described below. The photodetection device 1 according to Modification 1 of the second embodiment is different from the photodetection device 1 according to the second embodiment described above in that a plurality of the plug rings 76 is provided, and the other configurations of the photodetection device 1 are basically similar to those of the photodetection device 1 according to the second embodiment described above. Note that the components already described will be denoted by the same reference signs, and the description thereof will be omitted.

<Plug Ring>

Figure 25A:
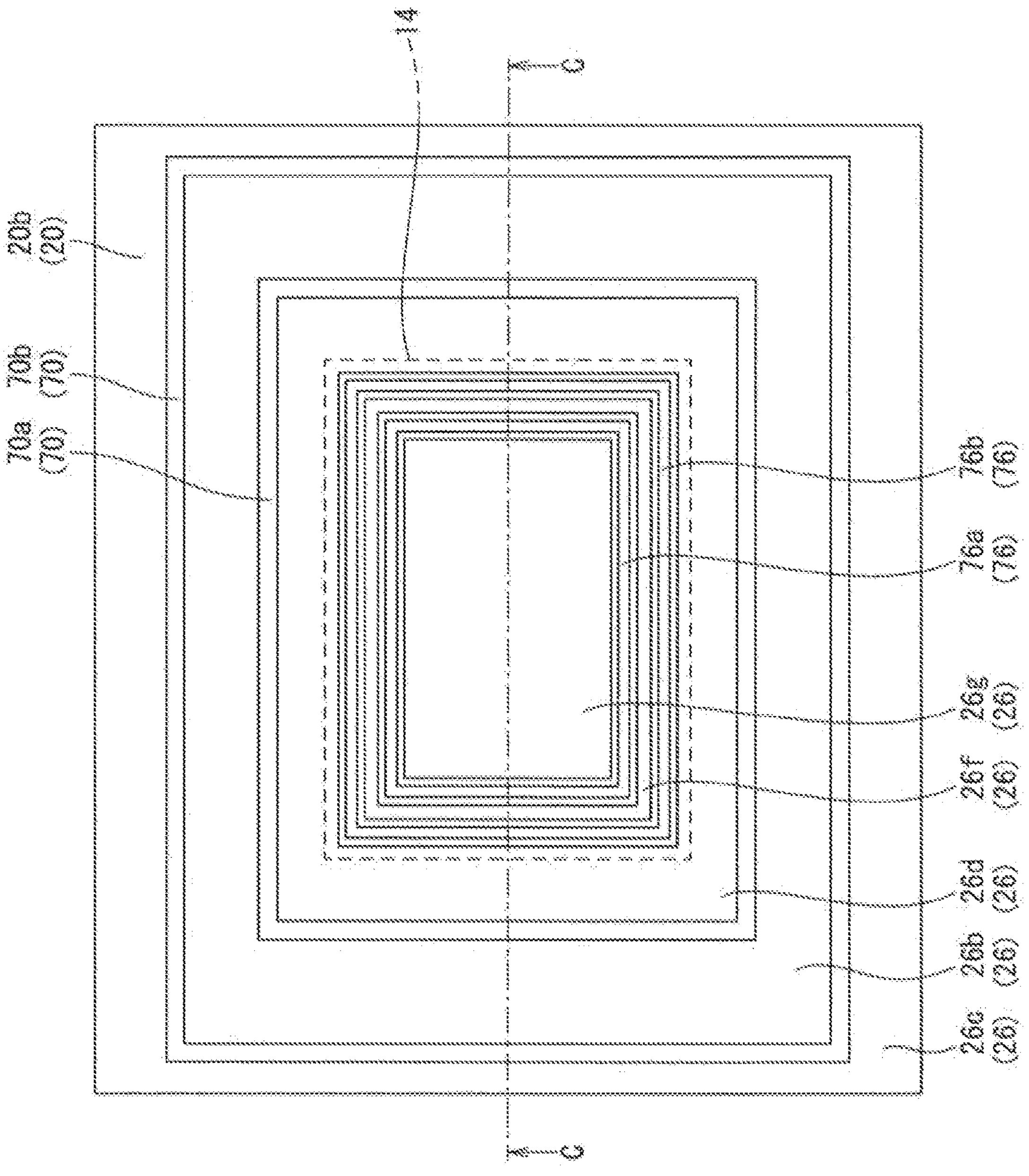
FIG. 25A is a plan view illustrating a positional relationship among an insulating ring, two plug rings, and an electrode pad according to Modification 1 of the second embodiment of the present technology.
Figure 25B:
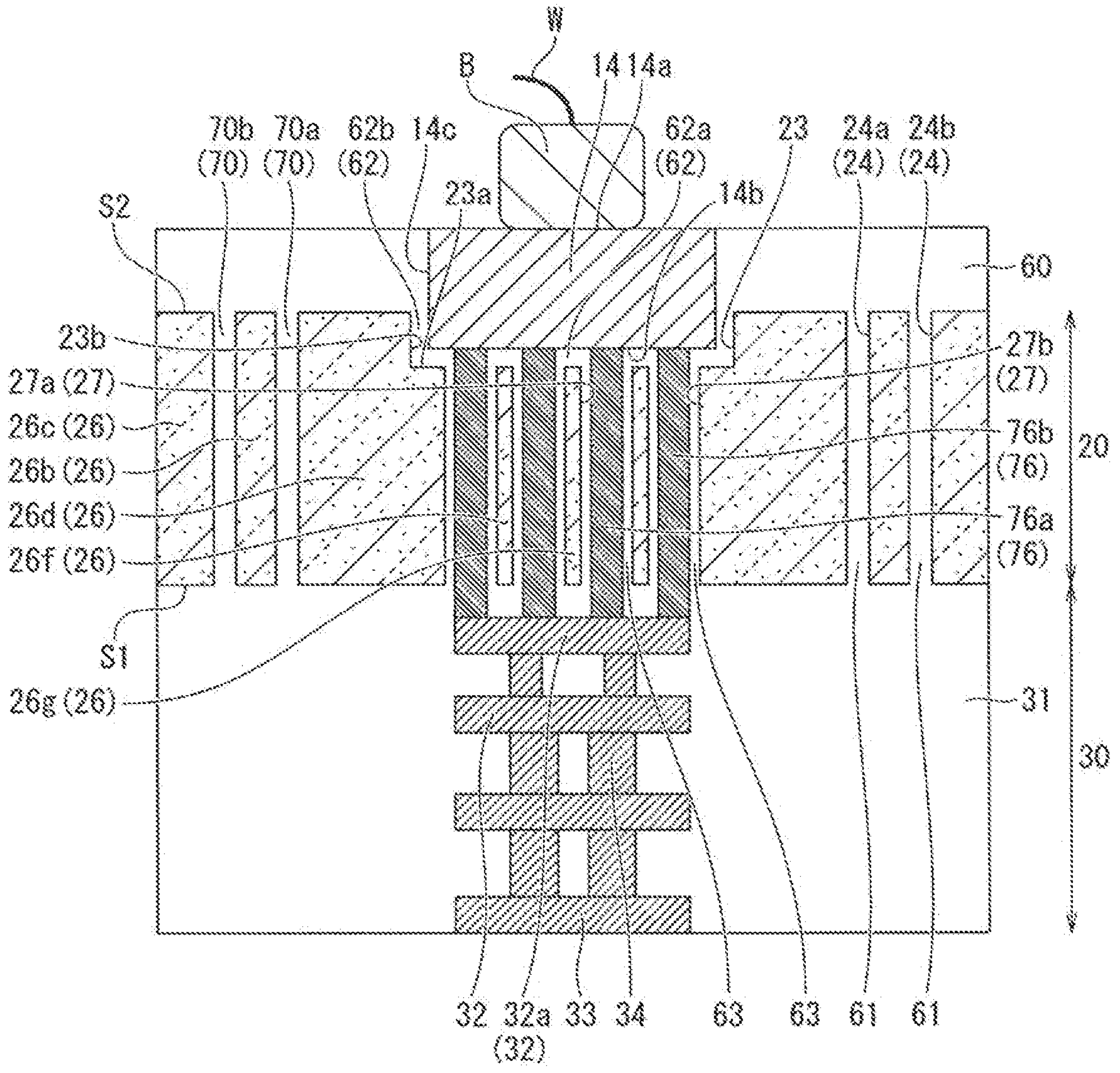
FIG. 25B is a longitudinal cross-sectional view illustrating the positional relationship among the insulating ring, the plug ring, and the electrode pad according to Modification 1 of the second embodiment of the present technology when viewed in a cross section taken along line C-C of FIG. 25A.

FIGS. 25A and 25B illustrate an example in which two ring-shaped plug rings 76 are provided. In other words, the plug ring 76 includes a first plug ring 76*a* and a second plug ring 76*b* surrounding the first plug ring 76*a* in a plan view. That is, the multiplexed plug rings 76 are provided. Note that, in a case where the first plug ring 76*a* and the second plug ring 76*b* do not need to be distinguished from each other, the first plug ring 76*a* and the second plug ring 76*b* are not distinguished and are simply referred to as the plug rings 76.

The first plug ring 76*a* and the second plug ring 76*b* are provided in a groove 27*a* (27) and a groove 27*b* (27), respectively, provided in the first semiconductor layer 20 each with the insulating layer 63 interposed therebetween.

The first plug ring 76*a* and the second plug ring 76*b* penetrate the first semiconductor layer 20 in the thickness direction of the first semiconductor layer 20, and divide the first semiconductor layer 20 into a plurality of regions. More specifically, the first plug ring 76*a* divides the first semiconductor layer 20 on the inner side of the second plug ring 76*b* (that is, the region 26*e* in the second embodiment) into a region 26*f* and a region 26*g*. The divided regions 26*f* and 26*g* are in an electrically floating state. Furthermore, the plug ring 76 is preferably provided on the outer peripheral side of the electrode pad 14 as much as possible, which is similar to the case of the second embodiment. Therefore, the plug ring 76 is less likely to be damaged during wire bonding. However, there may be a case where the plug ring 76 overlaps the ball B in the thickness direction of the first semiconductor layer 20 due to a restriction of an arrangement space. Even in such a case, however, the plug ring 76 can be made less likely to be damaged during wire bonding by, for example, changing a thickness of the electrode pad 14 and a type of barrier metal.

Figure 26A:
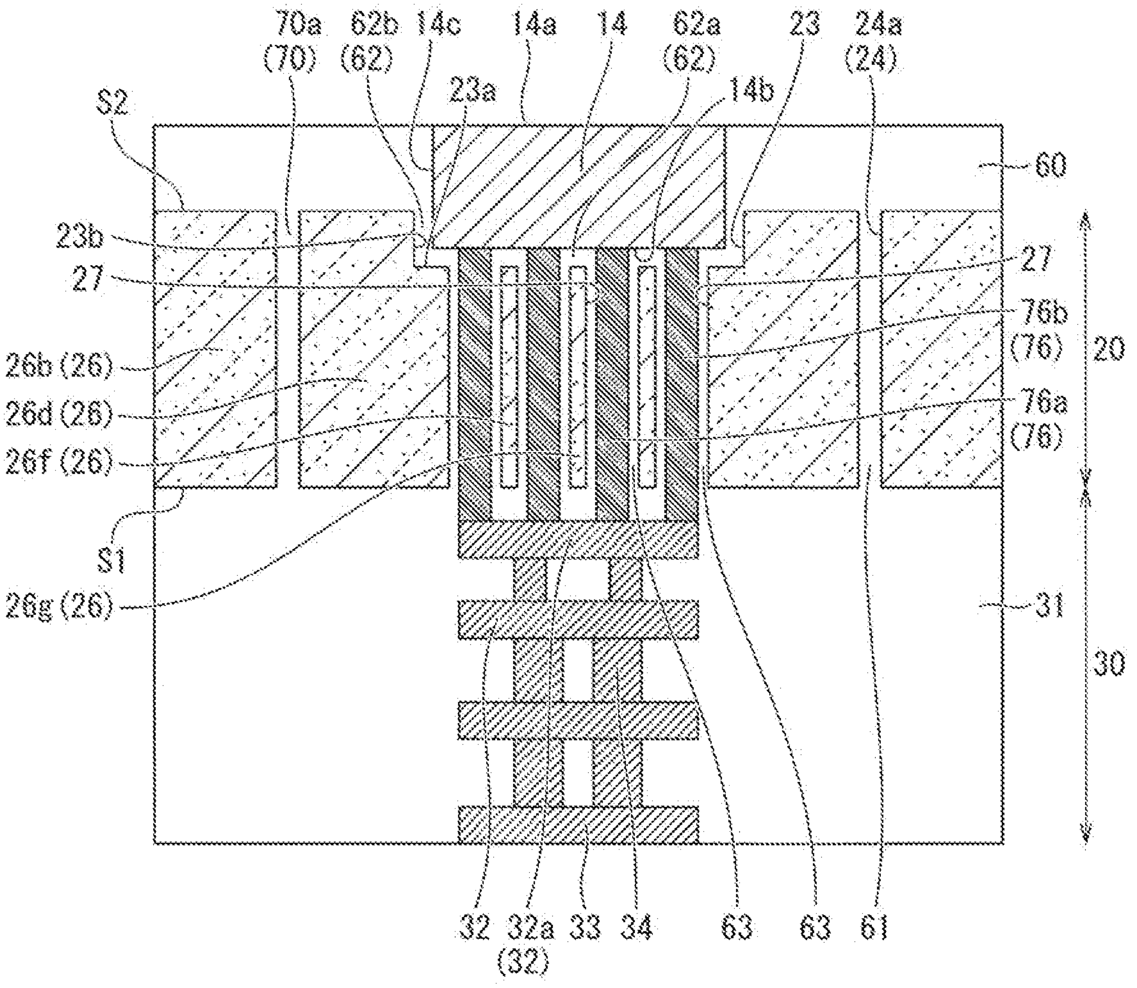
FIG. 26A is a longitudinal cross-sectional view illustrating a positional relationship among one insulating ring, two plug rings, and the electrode pad according to Modification 1 of the second embodiment of the present technology.
Figure 26B:
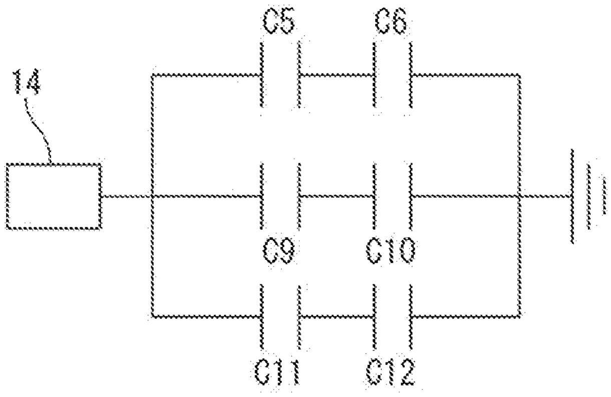
FIG. 26B is a schematic diagram illustrating a configuration of a capacitor in a case where one insulating ring and two plug rings are provided in the photodetection device according to Modification 1 of the second embodiment of the present technology.

Here, two insulating rings 70 are provided in FIGS. 25A and 25B, but a capacitor configuration will be considered regarding a case where one insulating ring 70 is provided as illustrated in FIG. 26A for the sake of simplicity. Note that only lower surface components of capacitors will be described here. The electrode pad 14, the insulating layer 62 (mainly the insulating layer 62*a*), and the region 26*f* form a parasitic capacitance C9 illustrated in FIG. 26B, and the region 26*f* and the region 26*b* form a capacitor C10 through the interlayer insulating film 31 of the first wiring layer 30. Moreover, the electrode pad 14, the insulating layer 62 (mainly the insulating layer 62*a*), and the region 26*g* form a parasitic capacitance C11 illustrated in FIG. 26B, and the region 26*g* and the region 26*b* form a capacitor C12 through the interlayer insulating film 31 of the first wiring layer 30. Furthermore, the capacitors C9 and C10 are connected in series, and the capacitors C11 and C12 are connected in series. The capacitors C9, C10, C11, and C12 are capacitances of the lower surface components mainly accumulated on the lower surface 14*b* of the electrode pad 14. In this manner, the lower surface components of parasitic capacitances with respect to the electrode pad 14 are separated into a plurality of pieces.

Main Effects of Modification 1 of Second Embodiment

Effects similar to those of the photodetection device 1 according to the second embodiment described above can be obtained with the photodetection device 1 according to Modification 1 of the second embodiment as well.

Furthermore, since the multiplexed plug ring 76 are provided, a portion of the first semiconductor layer 20 overlapping the electrode pad 14 in the plan view is divided into a plurality of regions each in a floating state. Since the capacitors can be further provided on the lower surface 14*b* where the parasitic capacitance contributing to the electrode pad 14 is greater, an increase in the parasitic capacitance can be further suppressed.

Furthermore, a contact area between the plug ring 76 and the electrode pad 14 can be increased, and thus, contact resistance can also be reduced.

Note that the plug ring 76 includes the first plug ring 76*a* and the one second plug ring 76*b* surrounding the first plug ring 76*a* in the plan view, but the number of the second plug rings 76*b* is not limited to one and may be two or more. That is, the plug ring 76 may include the first plug ring 76*a* and at least one second plug ring 76*b* surrounding the first plug ring 76*a* in the plan view.

Modification 2 of Second Embodiment

Figure 27:
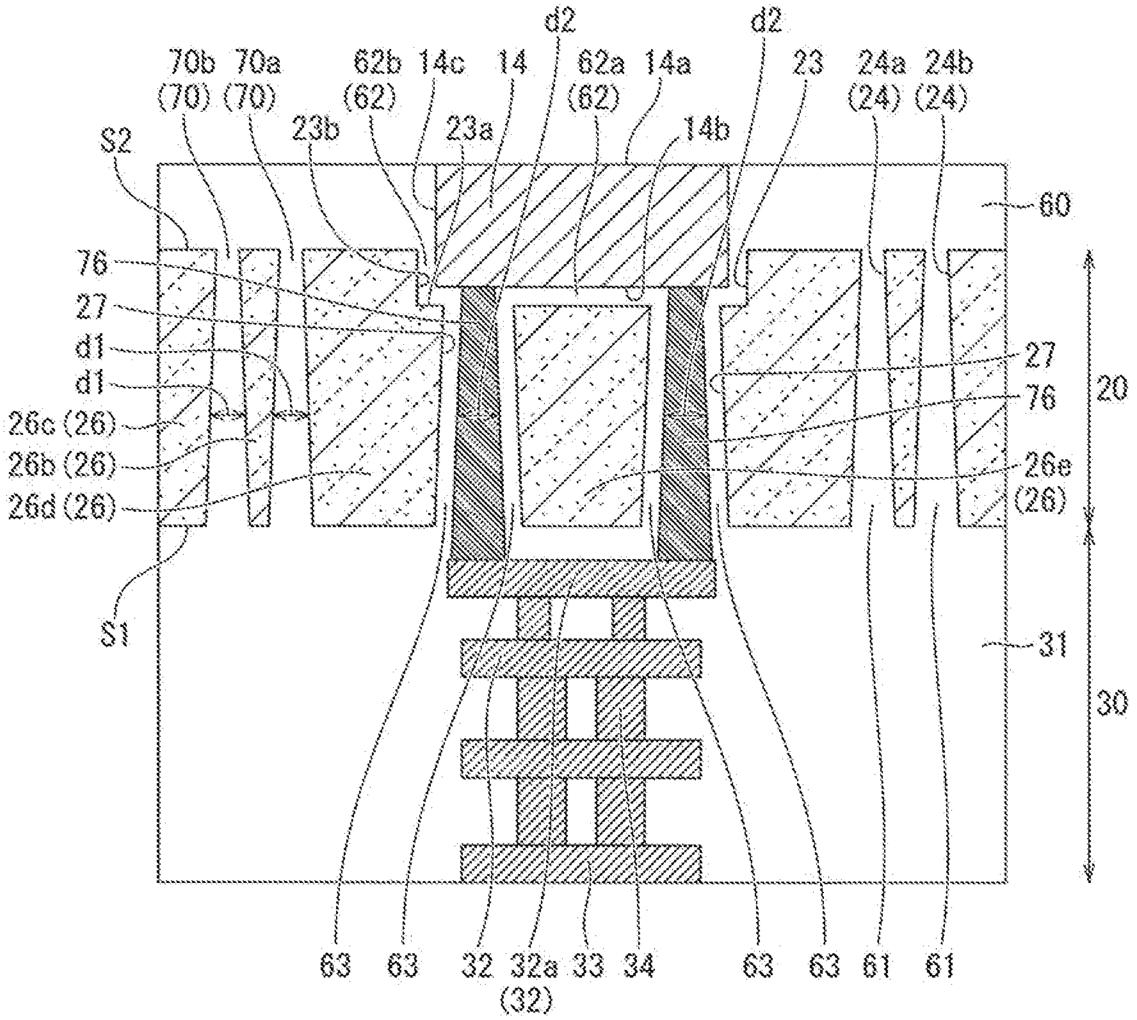
FIG. 27 is a longitudinal cross-sectional view illustrating cross-sectional shapes of an insulating ring, a plug ring, and an electrode pad according to Modification 2 of the second embodiment of the present technology.

Modification 2 of the second embodiment of the present technology illustrated in FIG. 27 will be described below. The photodetection device 1 according to Modification 2 of the second embodiment is different from the photodetection device 1 according to the second embodiment described above in that shapes of the insulating ring 70 and the plug ring 76 when viewed in a longitudinal cross-sectional view are reverse-tapered shapes, and the other configurations of the photodetection device 1 are basically similar to those of the photodetection device 1 according to the second embodiment described above. Note that the components already described will be denoted by the same reference signs, and the description thereof will be omitted.

The shapes of the insulating ring 70 and the plug ring 76 in the longitudinal cross-sectional view are reverse-tapered shapes as illustrated in the drawing. As illustrated in FIG. 27, the width d1 of the insulating ring 70 and the width d2 of the plug ring 76 are thinner on a side close to the electrode pad 14 than on a side close to the metal layer 32*a* in the thickness direction of the first semiconductor layer 20.

<<Method for Manufacturing Photodetection Device>>

Hereinafter, a method for manufacturing the photodetection device 1 of Modification 2 will be described. Here, differences from the method for manufacturing the photodetection device 1 according to the second embodiment will be mainly described. Note that the shape of each portion is not formed as the reverse-tapered shape here for the sake of simplicity.

The groove 24 and the groove 27 for providing the insulating ring 70 and the plug ring 76 are formed in the first semiconductor layer 20 after bonding the first wiring layer 30 and the second wiring layer 40 in the second embodiment, whereas 24 and the groove 27 are formed in the first semiconductor layer 20 before the bonding in Modification 2 of the second embodiment.

Figure 28A:
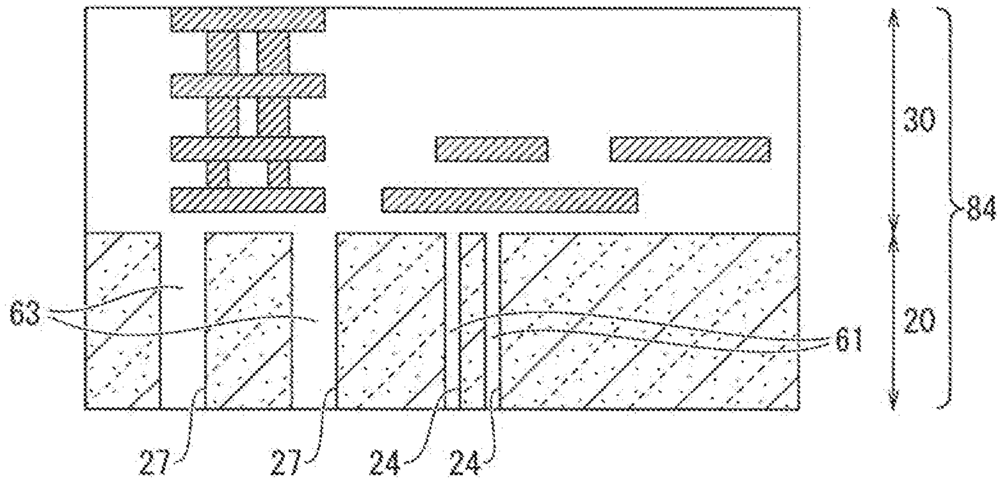
FIG. 28A is a process cross-sectional view illustrating a method for manufacturing a photodetection device according to Modification 2 of the second embodiment of the present technology.
Figure 28B:
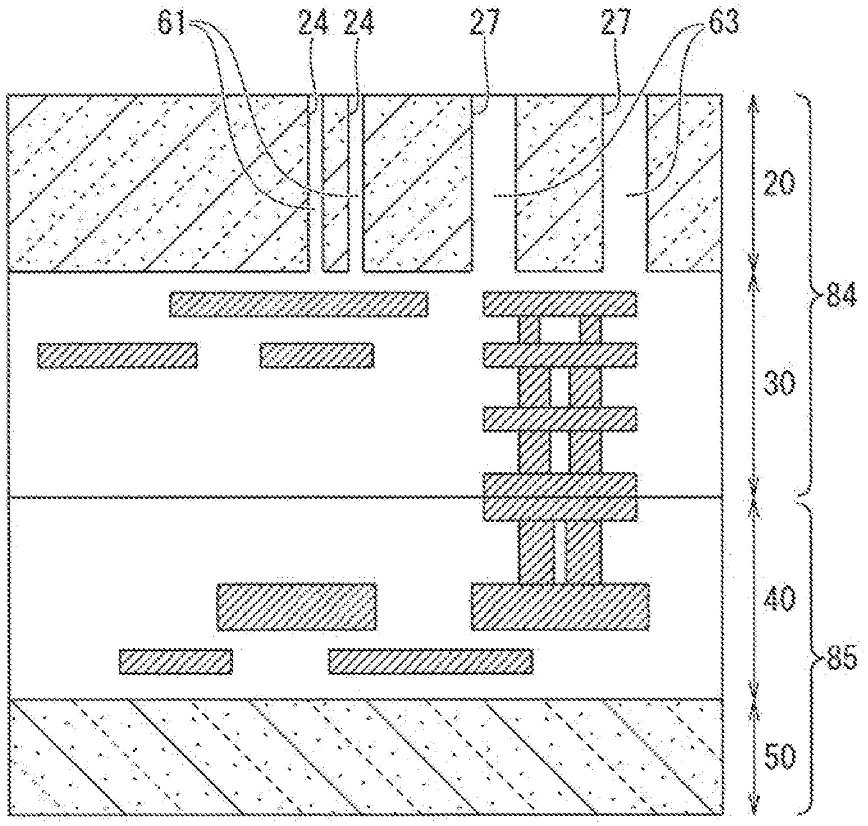
FIG. 28B is a process cross-sectional view subsequent to FIG. 28A.

First, each of the first substrate (the first semiconductor layer 20 and the first wiring layer 30) 84 and the second substrate (the second semiconductor layer 50 and the second wiring layer 40) 85 is prepared. Regarding the first substrate 84, the groove 24 and the groove 27 are formed in the first semiconductor layer 20 and an insulating film is laminated thereon after a transistor and the like are formed in the first semiconductor layer 20 and before the metal layer 32*a* is formed as illustrated in FIG. 28A. Then, an insulating layer embedded in the groove 24 is the insulating layer 61, and an insulating layer embedded in the groove 27 is the insulating layer 63. Thereafter, the first wiring layer 30 is formed. Regarding the second substrate 85, a detailed description of a manufacturing method is omitted here. Then, the first substrate 84 and the second substrate 85 are bonded as illustrated in FIG. 28B.

Figure 28C:
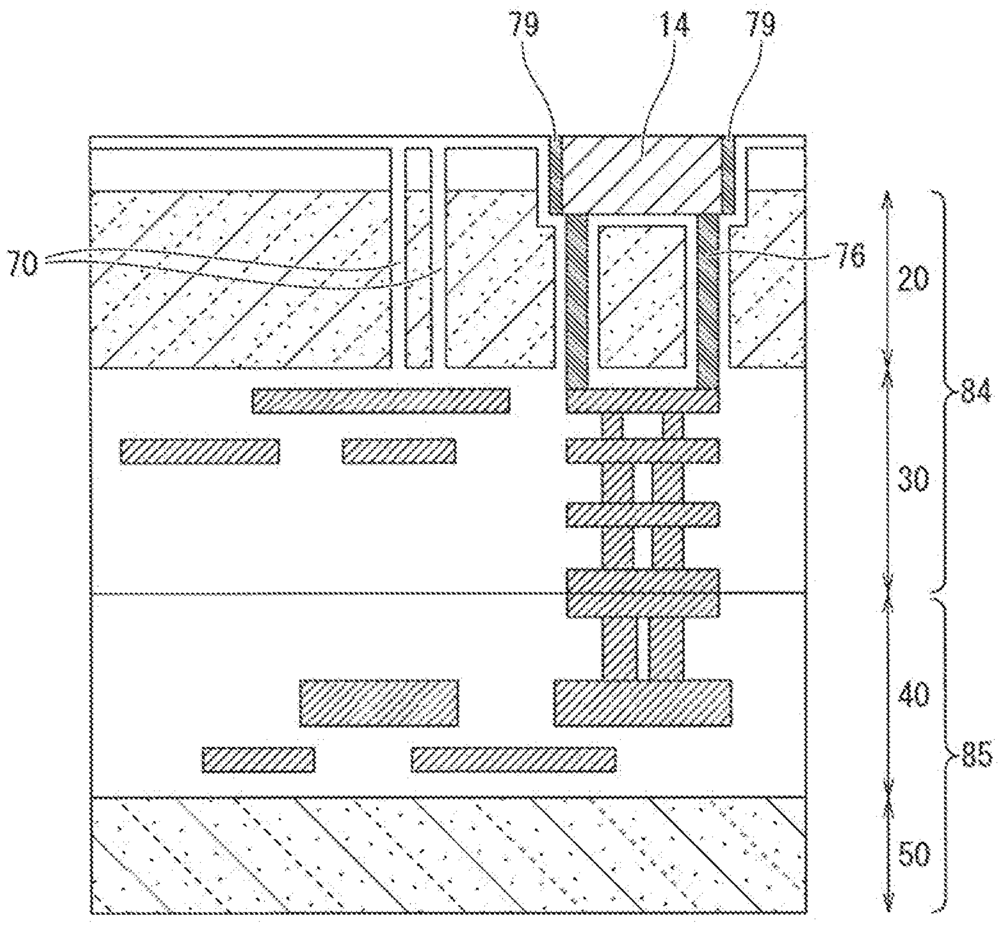
FIG. 28C is a process cross-sectional view subsequent to FIG. 28B.

Thereafter, a hole for embedding the plug ring 76, the recess 23, and the like are formed in the insulating layer 63 embedded in the groove 27 although not illustrated. Thereafter, processes similar to the processes illustrated in FIGS. 7I to 7M are performed to obtain the plug ring 76 and the insulating ring 70 illustrated in FIG. 28C.

Main Effects of Modification 2 of Second Embodiment

Effects similar to those of the photodetection device 1 according to the second embodiment described above can be obtained with the photodetection device 1 according to Modification 2 of the second embodiment as well.

Note that a process other than the above may be used in the above-described process of forming the hole for embedding the plug ring 76 in the insulating layer 63 embedded in the groove 27. For example, the insulating layer 63 in the groove 27 may be once completely removed, and thereafter, an insulating film may be formed again along an inner surface of the groove 27. The insulating film formed again does not fill the inside of the groove 27, but is deposited while leaving a gap where the plug ring 76 can be formed. That is, the insulating film is deposited with a constant thickness along the inner surface of the groove 27. Then, the plug ring 76 is embedded in the gap in the groove 27.

Modification 3 of Second Embodiment

Modification 3 of the second embodiment of the present technology will be described below. The photodetection device 1 according to Modification 3 of the second embodiment is different from the photodetection device 1 according to the second embodiment described above in that shapes of the insulating ring 70 and the plug ring 76 in a longitudinal cross-sectional view are reverse-tapered shapes as in Modification 2 of the second embodiment described above. Moreover, a manufacturing method different from that of Modification 2 of the second embodiment is adopted in Modification 3 of the second embodiment. The other configurations of the photodetection device 1 are basically similar to those of the photodetection device 1 of the second embodiment described above. Note that the components already described will be denoted by the same reference signs, and the description thereof will be omitted.

<<Method for Manufacturing Photodetection Device>

Hereinafter, a method for manufacturing the photodetection device 1 of Modification 3 will be described. Here, differences from the method for manufacturing the photodetection device 1 according to the second embodiment and Modification 2 of the second embodiment will be mainly described. Note that the shape of each portion is not formed as the reverse-tapered shape here for the sake of simplicity.

A material forming the plug ring 76 is embedded in the groove 27 after the first wiring layer 30 and the second wiring layer 40 are bonded in Modification 2 of the second embodiment, whereas a material forming the plug ring 76 is embedded in the groove 27 before the bonding in Modification 3 of the second embodiment.

Figure 29A:
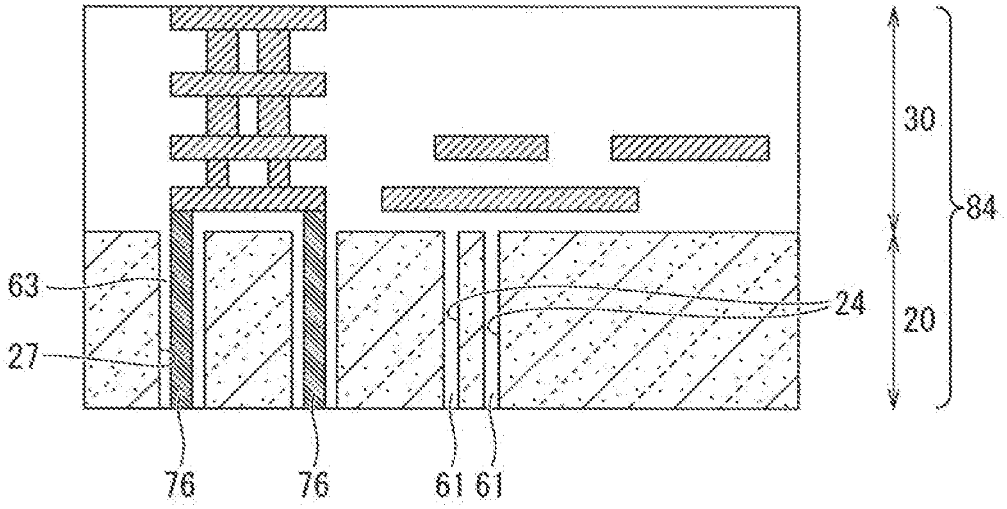
FIG. 29A is a process cross-sectional view illustrating a method for manufacturing a photodetection device according to Modification 3 of the second embodiment of the present technology.
Figure 29B:
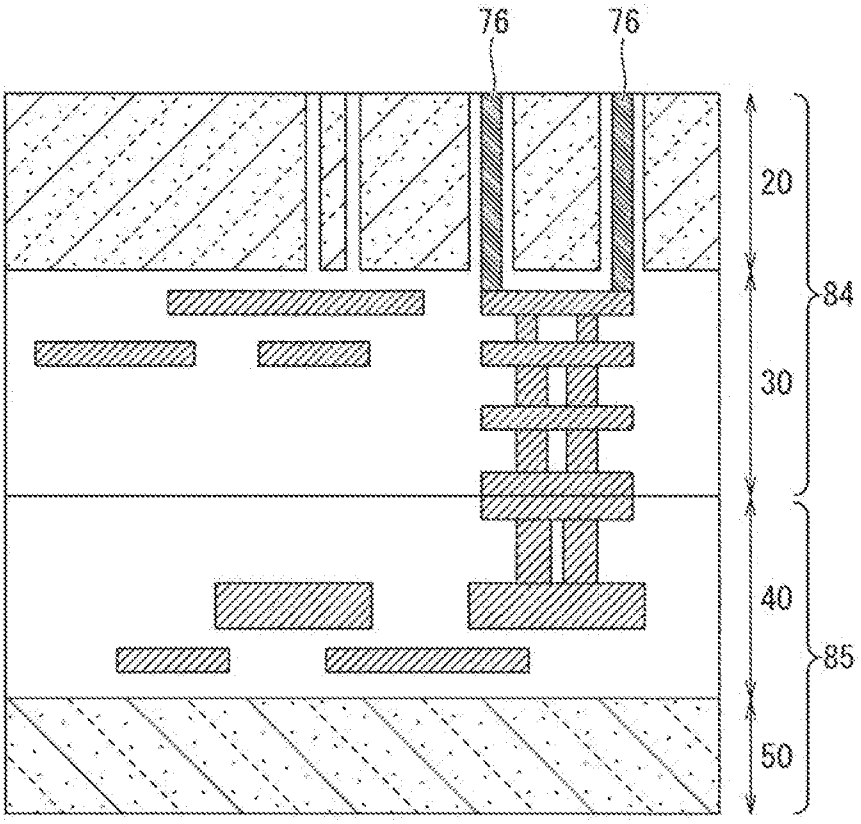
FIG. 29B is a process cross-sectional view subsequent to FIG. 29A.

First, each of the first substrate (the first semiconductor layer 20 and the first wiring layer 30) 84 and the second substrate (the second semiconductor layer 50 and the second wiring layer 40) 85 is prepared. Regarding the first substrate 84, the groove 24 and the groove 27 are formed in the first semiconductor layer 20 and an insulating film is laminated thereon after a transistor and the like are formed and before the metal layer 32*a* is formed as illustrated in FIG. 29A. Then, an insulating layer embedded in the groove 24 is the insulating layer 61, and an insulating layer embedded in the groove 27 is the insulating layer 63. Next, as illustrated in the same drawing, a hole for embedding the plug ring 76 is formed in the insulating layer 63 embedded in the groove 27, and the material forming the plug ring 76 is embedded in the hole to form the plug ring 76. Then, the first wiring layer 30 is formed. Thereafter, the first substrate 84 and the second substrate 85 are bonded as illustrated in FIG. 29B.

Figure 29C:
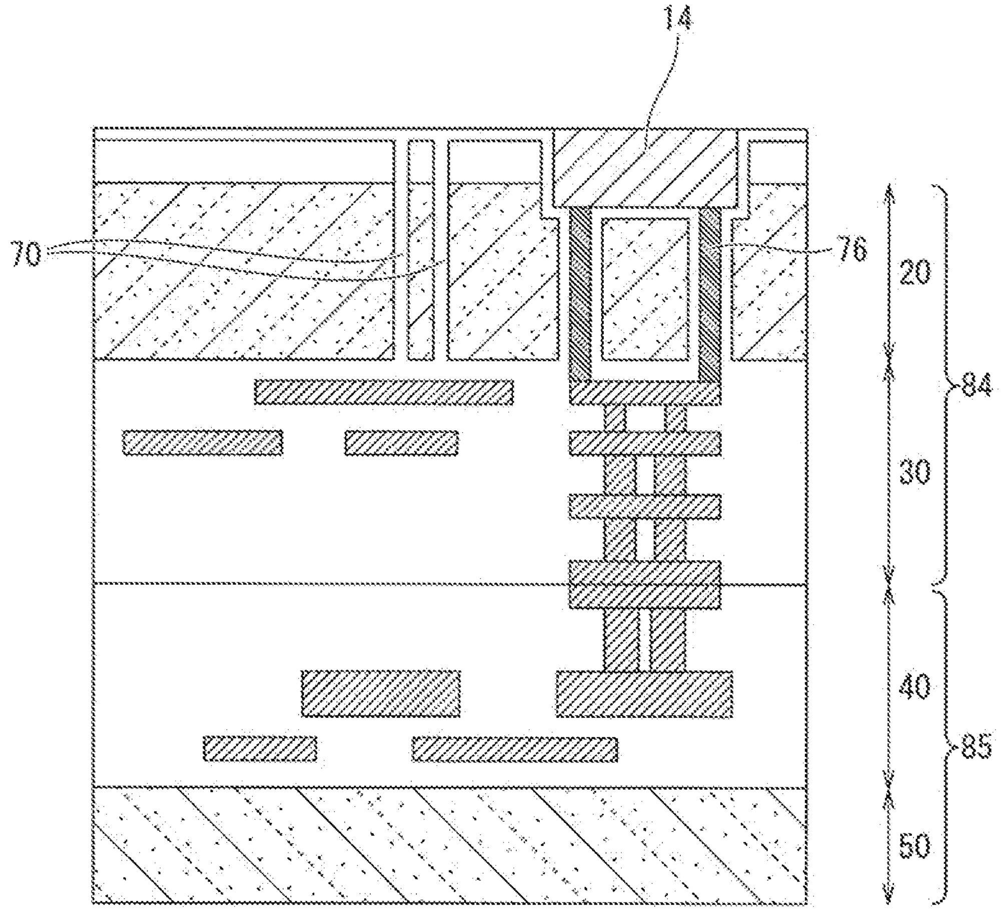
FIG. 29C is a process cross-sectional view subsequent to FIG. 29B.

Next, processes similar to the processes illustrated in FIGS. 7D and 7K to 7M are performed to obtain the plug ring 76 and the insulating ring 70 illustrated in FIG. 29C.

Main Effects of Modification 3 of Second Embodiment

Effects similar to those of the photodetection device 1 according to the second embodiment described above can be obtained with the photodetection device 1 according to Modification 3 of the second embodiment as well.

Furthermore, the embedding of material (for example, tungsten) forming the plug ring 76 is completed before the first substrate 84 and the second substrate 85 are bonded in Modification 3 of the second embodiment. Therefore, tungsten metal 79 (FIG. 28C) remaining in contact with a side wall of the electrode pad 14 in Modification 2 of the second embodiment does not remain in Modification 3 of the second embodiment. Therefore, pad resistance of the electrode pad 14 can be suppressed.

Note that the hole for embedding the plug ring 76 is formed in the insulating layer 63 embedded in the groove 27, and then, tungsten is embedded in the hole in the above-described process of forming the plug ring 76, but the present invention is not limited thereto. Without completely embedding the groove 27 in the insulating layer 63, an insulating film may be formed, and thereafter, tungsten may be embedded as illustrated in FIG. 7H, for example.

Third Embodiment

<Application Example to Electronic Device>

Next, an electronic device according to a third embodiment of the present technology illustrated in FIG. 30 will be described. An electronic device 100 according to the third embodiment includes a photodetection device (solid-state imaging device) 101, an optical lens 102, a shutter device 103, a drive circuit 104, and a signal processing circuit 105. The electronic device 100 of the third embodiment represents an embodiment in a case where the above-described photodetection device 1 is used as an electronic device (for example, camera) serving as the photodetection device 101.

The optical lens (optical system) 102 forms an image of image light (the incident light 106) from a subject on an imaging surface of the photodetection device 101. Therefore, signal charges are accumulated in the photodetection device 101 over a certain period. The shutter device 103 controls a light irradiation period and a light shielding period for the photodetection device 101. The drive circuit 104 supplies a drive signal for controlling a transfer operation of the photodetection device 101 and a shutter operation of the shutter device 103. A signal of the photodetection device 101 is transferred by a drive signal (timing signal) supplied from the drive circuit 104. The signal processing circuit 105 performs various types of signal processing on a signal (pixel signal) output from the photodetection device 101. A video signal subjected to the signal processing is stored in a storage medium such as a memory or output to a monitor.

With such a configuration, a parasitic capacitance to be accumulated in the electrode pad 14 in the photodetection device 101 can be suppressed in the electronic device 100 according to the third embodiment, so that the image quality of the video signal can be improved.

Note that the electronic device 100 to which the photodetection device 1 according to the first and second embodiments can be applied is not limited to the camera, and the photodetection device 1 can be applied to other electronic devices. For example, the photodetection device 1 may be applied to an imaging device such as a camera module for a mobile device such as a mobile phone.

Furthermore, in the third embodiment, as the photodetection device 101, the photodetection device 1 according to any one of the first embodiment and its modifications or any one of the second embodiment and its modifications, or the photodetection device 1 according to a combination of at least two embodiments or modifications of the first embodiment and its modifications and the second embodiment and its modifications can be used in the electronic device.

Other Embodiments

As described above, the present technology has been described by way of the first to third embodiments, but it should not be understood that the description and drawings constituting a part of this disclosure limit the present technology. Various alternative embodiments, examples, and operation techniques will be apparent to those skilled in the art from this disclosure.

For example, the technical ideas described in the first to third embodiments may be combined with each other. For example, the insulating ring 70 according to Modification 6 and Modification 7 of the first embodiment described above includes the gap 28, but various combinations according to the respective technical ideas can be made by applying such a technical idea to the photodetection device 1 described in the second embodiment, or the like.

Note that the insulating ring 70 may include a material different from that of the insulating layer laminated on first surface S1 and second surface S2 of first semiconductor layer 20. Moreover, the insulating ring 70 may be formed by a process different from that of the insulating layer laminated on the first surface S1 and the second surface S2 of the first semiconductor layer 20. For example, a shallow trench isolation (STI) process may be performed from the first surface S1 side, a deep trench isolation (DTI) process may be performed from the second surface S2 side, and insulating members are divided into various types, multiple layers, or a plurality of portions and laminated in the groove 24 to form the insulating ring 70.

Furthermore, the present technology is applicable to any photodetection device including not only the above-described solid-state imaging device as the image sensor but also a ranging sensor also called a time of flight (ToF) sensor that measures a distance, and the like. The ranging sensor is a sensor that emits irradiation light toward an object, detects reflected light that is the irradiation light reflected from a surface of the object, and calculates a distance to the object on the basis of a flight time from the emission of the irradiation light to reception of the reflected light. As a structure of the ranging sensor, the above-described structure including the insulating ring 70, the plug ring 76, and the electrode pad 14 can be adopted.

In this manner, it is a matter of course that the present technology includes various embodiments and the like not described herein. Therefore, the technical scope of the present technology is defined only by the matters used to define the invention described in the claims considered appropriate from the above description.

Furthermore, the effects described herein are merely illustrative and not restrictive, and may have additional effects.

Note that the present technology may have the following configuration.

(1)

A photodetection device including:

a first semiconductor layer that includes a photoelectric conversion unit and has one surface being a light incident surface and another surface being an element formation surface;

an insulating layer laminated on a side of the light incident surface of the first semiconductor layer;

an electrode pad exposed from a surface of the insulating layer on a side opposite to a surface on a side of the first semiconductor layer in a state where the insulating layer is interposed between the electrode pad and the first semiconductor layer; and an insulating ring that is a ring having an insulating property, penetrating the first semiconductor layer in a thickness direction, and surrounding the electrode pad in a plan view.

(2)

The photodetection device according to (1), in which the insulating ring includes a first insulating ring and at least one second insulating ring surrounding the first insulating ring in the plan view.

(3)

The photodetection device according to (1) or (2), in which a width between an outer contour and an inner contour of the insulating ring in the plan view is 10 nm or more and 300 nm or less.

(4)

The photodetection device according to any one of (1) to (3), in which the insulating ring includes at least one of an insulating material or a gap.

(5)

The photodetection device according to any one of (1) to (4), further including:

a first wiring layer superimposed on the element formation surface of the first semiconductor layer;

a second wiring layer superimposed on a surface of the first wiring layer on a side opposite to a surface on a side of the first semiconductor layer; and a second semiconductor layer superimposed on a surface of the second wiring layer on a side opposite to a surface on a side of the first wiring layer, in which the first wiring layer includes a first connection pad that faces the surface of the first wiring layer on the side opposite to the surface on the side of the first semiconductor layer and is electrically connected to the electrode pad, the second wiring layer includes a second connection pad that faces a surface of the second wiring layer on a side opposite to a surface on a side of the second semiconductor layer and is bonded to the first connection pad, and the electrode pad, the first connection pad, and the second connection pad overlap each other in the thickness direction.

(6)

The photodetection device according to (1), further including:

a first wiring layer that is superimposed on the element formation surface of the first semiconductor layer and includes a metal layer;

a plug ring that penetrates the first semiconductor layer in the thickness direction of the first semiconductor layer, has an annular shape in the plan view, and is arranged on an inner side of a contour of the electrode pad; and an insulating layer interposed between the first semiconductor layer and the plug ring, in which the plug ring has one end connected to the electrode pad and another end connected to the metal layer, and electrically connects the electrode pad and the metal layer.

(7)

The photodetection device according to (6), in which the plug ring includes a first plug ring and at least one second plug ring surrounding the first plug ring in the plan view.

(8)

The photodetection device according to (6) or (7), in which a width between an outer contour and an inner contour of the plug ring in the plan view is wider on a side close to the electrode pad than on a side close to the metal layer in the thickness direction.

(9)

The photodetection device according to (6) or (7), in which a width between an outer contour and an inner contour of the plug ring in the plan view is narrower on a side close to the electrode pad than on a side close to the metal layer in the thickness direction.

(10)

The photodetection device according to any one of (1) to (9), in which an exposed surface of the electrode pad is located on the same plane with the surface of the insulating layer laminated on the side of the light incident surface on the side opposite to the surface on the side of the first semiconductor layer.

(11)

An electronic device including: a photodetection device; and an optical system that causes the photodetection device to form an image of image light from a subject, in which the photodetection device includes:

a first semiconductor layer that includes a photoelectric conversion unit and has one surface being a light incident surface and another surface being an element formation surface;

an insulating layer laminated on a side of the light incident surface of the first semiconductor layer;

an electrode pad exposed from a surface of the insulating layer on a side opposite to a surface on a side of the first semiconductor layer in a state where the insulating layer is interposed between the electrode pad and the first semiconductor layer; and an insulating ring that is a ring having an insulating property, penetrating the first semiconductor layer in a thickness direction, and surrounding the electrode pad in a plan view.

REFERENCE SIGNS LIST

1 Photodetection device
2 Semiconductor chip
2A Pixel region
2B Peripheral region
3 Pixel
4 Vertical drive circuit
5 Column signal processing circuit
6 Horizontal drive circuit
7 Output circuit
8 Control circuit
10 Pixel drive line
11 Vertical signal line
12 Horizontal signal line
13 Logic circuit
15 Readout circuit
20 First semiconductor layer
23 Recess
24 Groove
25 Hole
26, **26*a*, 26*b*, 26*c*, 26*d*, 26*e*, 26*f*, 26*g*** Region
27 Groove
28 Gap
30 First wiring layer
33 First connection pad
40 Second wiring layer
43 Second connection pad
50 Second semiconductor layer
60 Insulating layer
70 Insulating ring
75 plug
76 Plug ring
100 Electronic device

What is claimed is:

1. A photodetection device, comprising:

a first semiconductor layer that includes a photoelectric conversion unit and has one surface being a light incident surface and another surface being an element formation surface;

an insulating layer laminated on a side of the light incident surface of the first semiconductor layer;

an electrode pad exposed from a surface of the insulating layer on a side opposite to a surface on a side of the first semiconductor layer in a state where the insulating layer is interposed between the electrode pad and the first semiconductor layer; and an insulating ring that is a ring having an insulating property, penetrating the first semiconductor layer in a thickness direction, and surrounding the electrode pad in a plan view, wherein the insulating ring includes a first insulating ring and at least one second insulating ring surrounding the first insulating ring in the plan view, wherein a first region of the first semiconductor layer is disposed between the first insulating ring and the electrode pad, and wherein a second region of the first semiconductor layer is disposed between the first insulating ring and the second insulating ring.

2. The photodetection device according to claim 1, further comprising:

a first wiring layer that is superimposed on the element formation surface of the first semiconductor layer and includes a metal layer;

a plug ring that penetrates the first semiconductor layer in the thickness direction of the first semiconductor layer, has an annular shape in the plan view, and is arranged on an inner side of a contour of the electrode pad; and an insulating layer interposed between the first semiconductor layer and the plug ring, wherein the plug ring has one end connected to the electrode pad and another end connected to the metal layer, and electrically connects the electrode pad and the metal layer.

3. The photodetection device according to claim 2, wherein the plug ring includes a first plug ring and at least one second plug ring surrounding the first plug ring in the plan view.

4. The photodetection device according to claim 2, wherein a width between an outer contour and an inner contour of the plug ring in the plan view is wider on a side close to the electrode pad than on a side close to the metal layer in the thickness direction.

5. The photodetection device according to claim 2, wherein a width between an outer contour and an inner contour of the plug ring in the plan view is narrower on a side close to the electrode pad than on a side close to the metal layer in the thickness direction.

6. The photodetection device according to claim 1, wherein a width between an outer contour and an inner contour of the insulating ring in the plan view is 10 nm or more and 300 nm or less.

7. The photodetection device according to claim 1, wherein the insulating ring includes at least one of an insulating material or a gap.

8. The photodetection device according to claim 1, further comprising:

a first wiring layer superimposed on the element formation surface of the first semiconductor layer;

a second wiring layer superimposed on a surface of the first wiring layer on a side opposite to a surface on a side of the first semiconductor layer; and a second semiconductor layer superimposed on a surface of the second wiring layer on a side opposite to a surface on a side of the first wiring layer, wherein the first wiring layer includes a first connection pad that faces the surface of the first wiring layer on the side opposite to the surface on the side of the first semiconductor layer and is electrically connected to the electrode pad, the second wiring layer includes a second connection pad that faces a surface of the second wiring layer on a side opposite to a surface on a side of the second semiconductor layer and is bonded to the first connection pad, and the electrode pad, the first connection pad, and the second connection pad overlap each other in the thickness direction.

9. The photodetection device according to claim 1, wherein an exposed surface of the electrode pad is located on a same plane with the surface of the insulating layer laminated on the side of the light incident surface on the side opposite to the surface on the side of the first semiconductor layer.

10. The photodetection device according to claim 1, wherein the first insulating ring is disposed in a first groove formed in the first semiconductor layer, and wherein the second insulating ring is disposed in a second groove formed in the first semiconductor layer.

11. An electronic device, comprising: a photodetection device; and an optical system that causes the photodetection device to form an image of image light from a subject, wherein the photodetection device includes:

a first semiconductor layer that includes a photoelectric conversion unit and has one surface being a light incident surface and another surface being an element formation surface;

an insulating layer laminated on a side of the light incident surface of the first semiconductor layer;

an electrode pad exposed from a surface of the insulating layer on a side opposite to a surface on a side of the first semiconductor layer in a state where the insulating layer is interposed between the electrode pad and the first semiconductor layer; and an insulating ring that is a ring having an insulating property, penetrating the first semiconductor layer in a thickness direction, and surrounding the electrode pad in a plan view, wherein the insulating ring includes a first insulating ring and at least one second insulating ring surrounding the first insulating ring in the plan view, wherein a first region of the first semiconductor layer is disposed between the first insulating ring and the electrode pad, and wherein a second region of the first semiconductor layer is disposed between the first insulating ring and the second insulating ring.

* * * * *